US007526152B2

(12) United States Patent
Asai et al.

(10) Patent No.: US 7,526,152 B2
(45) Date of Patent: Apr. 28, 2009

(54) SUBSTRATE FOR MOUNTING IC CHIP, SUBSTRATE FOR MOTHERBOARD, DEVICE FOR OPTICAL COMMUNICATION, MANUFACTURING METHOD OF SUBSTRATE FOR MOUNTING IC CHIP, AND MANUFACTURING METHOD OF SUBSTRATE FOR MOTHERBOARD

(75) Inventors: Motoo Asai, Ibi-gun (JP); Hiroaki Kodama, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/964,761

(22) Filed: Dec. 27, 2007

(65) Prior Publication Data

US 2008/0118199 A1    May 22, 2008

Related U.S. Application Data

(60) Division of application No. 11/402,084, filed on Apr. 12, 2006, now Pat. No. 7,437,030, which is a continuation of application No. PCT/JP2004/013971, filed on Sep. 24, 2004.

(30) Foreign Application Priority Data

Nov. 27, 2003   (JP)   ............................ 2003-397701

(51) Int. Cl.
G02B 6/14    (2006.01)
(52) U.S. Cl. ....................................................... 385/14
(58) Field of Classification Search .................... 385/14
See application file for complete search history.

(56) References Cited

U.S. PATENT DOCUMENTS 5,105,237 A    4/1992    Hasegawa et al.

(Continued)

FOREIGN PATENT DOCUMENTS

EP    1126517    8/2001

(Continued)

OTHER PUBLICATIONS

U.S. Appl. No. 11/623,923, filed Jan. 17, 2007, Kodama et al.

(Continued)

*Primary Examiner*—Uyen Chau N Le
*Assistant Examiner*—Hoang Tran
(74) *Attorney, Agent, or Firm*—Oblon, Spivak, McClelland, Maier & Neustadt, P.C.

(57) ABSTRACT

The present invention aims to provide a substrate for mounting an IC chip, on which an optical signal passing region is formed and which can suppress a transmission loss in an optical signal and transmit an optical signal more positively with high reliability. The substrate for mounting an IC chip according to the present invention is a substrate for mounting an IC chip, in which a conductor circuit and an insulating layer are laminated in alternate fashion and in repetition on both faces of a substrate and an optical element is mounted on the substrate. Herein, the substrate for mounting an IC chip includes an optical signal passing region, and a microlens arranged on an end portion of the optical signal passing region on the opposite side from the optical element.

17 Claims, 25 Drawing Sheets

U.S. PATENT DOCUMENTS

| | | | |
|---|---|---|---|
| 6,330,377 | B1 | 12/2001 | Kosemura |
| 6,334,014 | B1 | 12/2001 | Nitta et al. |
| 6,623,178 | B1 | 9/2003 | Sakurai et al. |
| 6,661,939 | B2 | 12/2003 | Kaneko et al. |
| 6,788,874 | B1 | 9/2004 | Ishikawa et al. |
| 7,070,207 | B2 * | 7/2006 | Asai ............................ 285/14 |
| 7,149,376 | B2 * | 12/2006 | Uchida et al. .................. 385/15 |
| 2001/0023970 | A1 | 9/2001 | Iida et al. |
| 2003/0142409 | A1 * | 7/2003 | Ohtsu et al. .................. 359/619 |
| 2005/0185880 | A1 | 8/2005 | Asai |
| 2006/0012967 | A1 * | 1/2006 | Asai et al. .................... 361/764 |
| 2006/0263003 | A1 | 11/2006 | Asai et al. |
| 2007/0223935 | A1 | 9/2007 | Asai et al. |
| 2007/0297729 | A1 | 12/2007 | Kodama et al. |

FOREIGN PATENT DOCUMENTS

| | | |
|---|---|---|
| JP | 62-274679 | 11/1987 |
| JP | 3-290606 | 12/1991 |
| JP | 4-074483 | 3/1992 |
| JP | 5-55633 | 3/1993 |
| JP | 5-211202 | 8/1993 |
| JP | 6-230203 | 8/1994 |
| JP | 6-281831 | 10/1994 |
| JP | 6-326285 | 11/1994 |
| JP | 8-110436 | 4/1996 |
| JP | 9-281352 | 10/1997 |
| JP | 11-12465 | 1/1999 |
| JP | 11-287926 | 10/1999 |
| JP | 2000-66051 | 3/2000 |
| JP | 2000-081524 | 3/2000 |
| JP | 2000-147275 | 5/2000 |
| JP | 2000-199827 | 7/2000 |
| JP | 2000-214351 | 8/2000 |
| JP | 2000-298352 | 10/2000 |
| JP | 2000-321442 | 11/2000 |
| JP | 2000-332301 | 11/2000 |
| JP | 2001-33665 | 2/2001 |
| JP | 2001-042145 | 2/2001 |
| JP | 2001-059923 | 3/2001 |
| JP | 2001-185752 | 7/2001 |
| JP | 2001-278941 | 10/2001 |
| JP | 2001-298052 | 10/2001 |
| JP | 2001-320172 | 11/2001 |
| JP | 2001-339077 | 12/2001 |
| JP | 2002-76376 | 3/2002 |
| JP | 2002-98863 | 4/2002 |
| JP | 2002-107560 | 4/2002 |
| JP | 2002-120230 | 4/2002 |
| JP | 2002-189137 | 7/2002 |
| JP | 2002-329891 | * 11/2002 |
| JP | 2002-329891 A | 11/2002 |
| JP | 2002-331532 | 11/2002 |

OTHER PUBLICATIONS

U.S. Appl. No. 11/696,436, filed Apr. 4, 2007, Kodama et al.
U.S. Appl. No. 11/693,188, filed Mar. 29, 2007, Kodama et al.
U.S. Appl. No. 11/696,434, filed Apr. 4, 2007, Kodama et al.
U.S. Appl. No. 11/733,361, filed Apr. 10, 2007, Asai et al.
U.S. Appl. No. 11/750,625, filed May 18, 2007, Yamada et al.
U.S. Appl. No. 11/964,761, filed Dec. 27, 2007, Asai et al.
Yuzo Ishii, et al., "Large-Tolerant, OptoBump, Interface for Interchip OPtical Interconnections", IEICE Transactions C, vol. J84-C, No. 9, Sep. 2001, pp. 739-799 (with partial Engish translation).
Ray T. Chen, et al., "Fully Embedded Board-Level Guided-Wave Optoelectronic Interconnects", Proceedings of the IEEE, vol. 88, No. 6, Jun. 2000, pp. 780-793.

* cited by examiner

SUBSTRATE FOR MOUNTING IC CHIP, SUBSTRATE FOR MOTHERBOARD, DEVICE FOR OPTICAL COMMUNICATION, MANUFACTURING METHOD OF SUBSTRATE FOR MOUNTING IC CHIP, AND MANUFACTURING METHOD OF SUBSTRATE FOR MOTHERBOARD

CROSS REFERENCE TO RELATED APPLICATIONS

The present application is a divisional application of U.S. application Ser. No. 11/402,084, filed Apr. 12, 2006, which is a continuation application of PCT/JP2004/013971, filed Sep. 24, 2004, claims the benefit of priority under 35 USC §119 to Japanese Patent Application No. 2003-397701 filed Nov. 27, 2003.

TECHNICAL FIELD

The present invention relates to a substrate for mounting an IC chip, a substrate for a motherboard, a device for optical communication, a manufacturing method of the substrate for mounting an IC chip, and a manufacturing method of the substrate for a motherboard.

BACKGROUND ART

Recently, attention has been paid to optical fibers, mainly in communication fields. Particularly in the IT (Information Technology) field, a communication technique that employs the optical fibers is necessary for constructing a high rate Internet network.

The optical fiber has features of (1) low loss, (2) high band, (3) small diameter and light weight, (4) non-induction, (5) resource saving, and the like. A communication system which employs the optical fibers having these features can considerably decrease the number of relays as compared with a communication system which employs conventional metallic cables, can be easily constructed and maintained, and can improve its economical efficiency and reliability.

Further, since the optical fiber can transmit not only light having a single wavelength but also light having a number of different wavelengths simultaneously, a large capacity of a transmission line which can deal with diversified purposes and deal with picture service and the like can be achieved.

Therefore, for the network communication such as the Internet and the like, the employment of optical transmission using optical fibers not only for the communication of a basic network but also for the communication between the basic network and terminal device (a personal computer, a mobile, a game machine and the like) and for the communication between the terminal devices is proposed.

When the optical communication is thus used for the communication between the basic network and the terminal device, an IC which processes information (signals) in the terminal device is operated by an electric signal, and therefore, the terminal device is required to be provided with a unit that converts an optical signal into an electric signal or vice versa such as an optical-to-electric converter or an electric-to-optical converter (herein after, also referred to as "optical/electric converter") and the like.

For this reason, on the conventional terminal device, a package substrate mounted with an IC chip, and optical elements, such as a light receiving element and a light emitting element and the like which process an optical signal, and parts of the like have been separately mounted, and signals were transmitted and processed by connecting electric wirings and the optical waveguide to these constituent elements.

When the package substrate mounted with an IC chip, the optical elements such as a light receiving element and a light emitting element and the like which processes an optical signal, and parts of the like are mounted separately on such a conventional terminal device, the size of the device itself becomes large, making it difficult to minimize the terminal device.

For this reason, the present inventors have already proposed a substrate for mounting an IC chip in which a conductor circuit and an insulating layer are laminated on both faces a substrate a solder resist layer is formed on an outermost layer, and an optical element is mounted on the substrate, the substrate for mounting an IC chip comprising an optical path for transmitting optical signal, that penetrates therethrough (for example, see Patent Document 1).

On the other hand, a microlens may be used in order to improve photocoupling efficiency between optical parts. As a forming method of the microlens, a method such as techniques of silicon anisotropic etching and photolithography are, utilized has been disclosed (for example, see Patent Documents 2 and 3).

A microlens and a microlens array formed by such a method can be secured onto a package substrate or a printed circuit board by using an adhesive.

Moreover, a method for forming a microlens by using a microjet (inkjet) has been disclosed (for example, see Non-Patent Documents 1 and 2) as a method for forming a microlens in which curing of a resin is performed after directly applying a resin to the substrates.

Patent Document 1: JP-A 2002-329891.

Patent Document 2: JP-A 06-230203

Patent Document 3: JP-A 06-326285

Non-Patent Document 1: D. L. MacFarlane and two others, "Microjet Fabrication of Microlens Arrays", (IEEE Photonic Technol Lett), United States, 1994, Vol. 6, No. 9, pp. 1112-1114

Non-Patent Document 2: Ishii and three others, "Ink-Jet Fabrication of Polymer Microlens for Optical-I/O Chip Packaging", (Jpn J Appl Phys Part 1), 2000, Vol. 39, No. 3B, pp. 1490-1493

DISCLOSURE OF THE INVENTION

Problems to be Solved by the Invention

As described above, although the technique of forming a microlens has already been proposed, nothing has been disclosed about an attaching position of a microlens when the microlens is attached to a substrate for mounting an IC chip with an optical element mounted thereon, or a substrate for a motherboard with an optical waveguide formed thereon and substrates of the like, used for mounting this substrate for mounting an IC chip and substrates of the like.

Moreover, when the microlens is attached to the substrate for mounting an IC chip, depending on the position, number and the like, and the shape and the like of the microlens, a transmission failure of an optical signal between the optical element and the optical waveguide as well as between the optical elements occurred, and also a great transmission loss occurred due to the facts that an optical signal from the light emitting element tends to be emitted with a spreading angle, while the light receiving area of the light receiving element was too small, and of the like facts.

Means for Solving the Problems

In order to achieve optical communication that is excellent in connecting reliability, the present inventors have made tremendous research efforts on a substrate for mounting an IC chip with an optical element mounted thereon and an optical signal passing region provided thereon, a substrate for a motherboard having an optical waveguide formed thereon and an optical signal passing region provided thereon, and a device for optical communication in which these substrates are used, and have completed the present invention so as to provide optical communication that is excellent in connecting reliability.

Namely, a first aspect of the present invention is a substrate for mounting an IC chip comprising: a substrate having a conductor circuit and an insulating layer laminated on both faces thereof in alternate fashion and in repetition, and an optical element mounted on the substrate for mounting an IC chip, wherein an optical signal passing region is provided thereon, and a microlens is arranged on an end portion of the optical signal passing region on a opposite side from a side on which the optical element is mounted.

In the substrate for mounting an IC chip according to the first aspect of the present invention, it is desirable that the optical signal passing region is provided so as to penetrate through the substrate and the insulating layer.

In the substrate for mounting an IC chip according to the first aspect of the present invention, it is desirable that the optical element is a multichannel optical element, and the optical signal passing region is constituted by plural independent optical paths.

In the substrate for mounting an IC chip according to the first aspect of the present invention, it is also desirable that the optical element is a multichannel optical element, and the optical signal passing region is constituted by a single optical path, which can transmit an optical signal from or to the multichannel optical element.

In this case, it is desirable that the single optical path which can transmit an optical signal from or to a multichannel optical element has a shape in which portions of wall faces of plural columns are connected to one another, and at least one of the plural columns is a dummy column that does not transmit any optical signal.

In the substrate for mounting an IC chip according to the first aspect of the present invention, it is desirable that the wall face of the optical signal passing region is made of resin or metal, and the wall face of the optical signal passing region has a surface roughness Ra of 0.1 to 5 μm.

In the substrate for mounting an IC chip according to the first aspect of the present invention, it is desirable that the optical element is a light receiving element and/or a light emitting element.

In the substrate for mounting an IC chip according to the first aspect of the present invention, it is desirable that the optical element is a light emitting element, and light emitted from the light emitting element is formed into collimated light via the microlens, and it is also desirable that the optical element is a light receiving element, and that a spot region made on a light receiving portion of the light receiving element by light that enters the light receiving element via the microlens overlaps with the light receiving portion by 22% or more.

In the substrate for mounting an IC chip according to the first aspect of the present invention, it is desirable that the microlens is directly arranged on an end portion of the optical signal passing region that has been subjected to water-repellent treatment or hydrophilic treatment, or that the microlens is arranged with a lens marker on the end portion of the optical signal passing region, the surface of which the microlens is arranged being subjected to water-repellent treatment or hydrophilic treatment, and moreover, it is desirable that the microlens is mixed with particles.

A second aspect of the present invention is a substrate for a motherboard comprising a substrate with a conductor circuit and an insulating layer laminated in alternate fashion and in repetition, together with an optical waveguide formed on at least one side thereof, and in which an optical element or a substrate for mounting an IC chip mounted with an optical element can be mounted on at least one face thereof; wherein an optical signal passing region is provided on the substrate for a motherboard, and a microlens is arranged on an end portion of the optical signal passing region on a side on which the optical element or the substrate for mounting an IC chip is mounted.

In the substrate for a motherboard according to the second aspect of the present invention, it is desirable that the optical signal passing region is provided so as to penetrate through the substrate and the insulating layer.

In the substrate for a motherboard according to the second aspect of the present invention, it is desirable that the optical element is a multichannel optical element, and the optical signal passing region is constituted by plural independent optical paths.

In the substrate for a motherboard according to the second aspect of the present invention, it is desirable that the optical element is a multichannel optical element, and the optical signal passing region is constituted by a single optical path which can transmit an optical signal from or to the multichannel optical element.

In this case, it is desirable that the single optical path which can transmit an optical signal from or to the multichannel optical element has a shape in which portions of wall faces of plural columns are connected to one another, and at least one of the plural columns is a dummy column that does not transmit any optical signal.

In the substrate for a motherboard according to the second aspect of the present invention, it is desirable that the wall face of the optical signal passing region is made of resin or metal, and the wall face of the optical signal passing region has a surface roughness Ra of 0.1 to 5 μm.

In the substrate for a motherboard according to the second aspect of the present invention, it is desirable that light emitted from the optical waveguide is formed into collimated light via the microlens, and that a spot region made on a core of the optical waveguide by light that enters the optical waveguide via the microlens overlaps with the core by 35% or more.

In the substrate for a motherboard according to the second aspect of the present invention, it is desirable that the microlens is directly arranged on an end portion of the optical signal passing region that has been subjected to water-repellent treatment or hydrophilic treatment, or the microlens is arranged with a lens marker on the end portion of the optical signal passing region, the surface of which the microlens is arranged being subjected to water-repellent treatment or hydrophilic treatment, and moreover, it is desirable that the microlens is mixed with particles.

A third aspect of the present invention is a device for optical communication comprising: the substrate for mounting an IC chip according to the first aspect of the present invention mounted on the substrate for a motherboard according to the second aspect of the present invention.

A fourth aspect of the present invention is a device for optical communication comprising: a substrate for a motherboard having a conductor circuit and an insulating layer laminated in alternate fashion and in repetition together with an optical waveguide formed on at least one face thereof, the substrate for a motherboard mounted with an optical element or a substrate for mounting an IC chip with an optical element mounted thereon, wherein at least one microlens is arranged on an optical path connecting the optical waveguide and the optical element, and light that enters the optical waveguide or the optical element is converged via the microlens.

It is desirable that the device for optical communication according to the fourth aspect of the present invention has at least two of the microlenses arranged thereon, and thereby light emitted from the optical waveguide or the optical element is converged or formed into collimated light.

A fifth aspect of the present invention is a device for optical communication comprising: a substrate for a motherboard having a conductor circuit and an insulating layer laminated in alternate fashion and in repetition together with an optical waveguide formed on at least one face thereof, with both a substrate for mounting an IC chip mounted with a light emitting element and a substrate for mounting an IC chip mounted with a light receiving element mounted on the substrate for a motherboard, wherein an optical signal passing region optically connected to both ends of the optical waveguide is formed in the substrate for a motherboard, and a microlens is arranged on an end portion of the optical signal passing region on the opposite side from the side that is optically connected to the optical waveguide, an optical signal passing region optically connected to the light emitting element is formed in the substrate for mounting an IC chip with the light emitting element mounted thereon, and a microlens is arranged on an end portion of the optical signal passing region on the opposite side from the side that is optically connected to the light emitting element, an optical signal passing region optically connected to the light receiving element is formed in the substrate for mounting an IC chip with the light receiving element mounted thereon, and a microlens is arranged on an end portion of the optical signal passing region on the opposite side from the side that is optically connected to the light receiving element, and light emitted from the light emitting element is formed into collimated light via the microlens arranged on the substrate for mounting an IC chip with the light emitting element mounted thereon, the collimated light is converged via one of the microlenses arranged on the substrate for a motherboard to enter one end of the optical waveguide, and then is transmitted through the optical waveguide, and light emitted from the other end of the optical waveguide is formed into collimated light via the other microlens arranged on the substrate for a motherboard, and the collimated light is converged by the microlens arranged on the substrate for mounting an IC chip with the light receiving element mounted thereon to enter the light receiving element.

A sixth aspect of the present invention includes a manufacturing method of a substrate for mounting an IC chip, comprising:

(a) a multilayer wiring board manufacturing step of sequentially laminating a conductor circuit and an insulating layer in alternate fashion and in repetition, on at least one face of a substrate to form a multilayer wiring board;

(b) an optical signal passing region forming step of forming an optical signal passing region that penetrates through the multilayer wiring board or forming an optical signal passing region having a concave shape on a portion of the multilayer wiring board; and (c) a microlens arranging step of arranging a microlens on an end portion of the optical signal passing region.

In the manufacturing method of a substrate for mounting an IC chip according to the sixth aspect of the present invention, in the step (b), it is desirable that an optical signal passing region including a through hole constituted by plural independent optical paths is formed as the optical signal passing region that penetrates through the multilayer wiring board.

Moreover, in the manufacturing method of a substrate for mounting an IC chip according to the sixth aspect of the present invention, in the step (b), it is desirable that an optical signal passing region constituted by a single optical path which can transmit an optical signal from or to a multichannel optical element is formed as the optical signal passing region that penetrates through the multilayer wiring board.

Furthermore, in the manufacturing method of a substrate for mounting an IC chip according to the sixth aspect of the present invention, in the step (b), it is desirable that a metal layer forming step is carried out so that the wall face of the optical signal passing region is constituted by a metal layer, and in this case, it is desirable that the metal layer formed in the metal layer forming step has a roughened surface.

Moreover, in the above-mentioned manufacturing method of a substrate for mounting an IC chip, in the step (b), it is desirable that a resin layer forming step is carried out so that the wall face of the optical signal passing region is constituted by a resin layer, and in this case, it is desirable that the resin layer formed in the resin layer forming step has a roughened surface.

Furthermore, in the manufacturing method of a substrate for mounting an IC chip according to the sixth aspect of the present invention, in the step (c), it is desirable that a portion on which the microlens is to be arranged is subjected to water-repellent treatment or hydrophilic treatment before the arrangement of the microlens.

A seventh aspect of the present invention includes a manufacturing method of a substrate for a motherboard comprising:

(a) an optical wiring board manufacturing step of forming an optical wiring board by sequentially laminating a conductor circuit and an insulating layer in alternate fashion and in repetition, on at least one face of a substrate and by also forming an optical waveguide on the substrate and/or the insulating layer;

(b) an optical signal passing region forming step of forming an optical signal passing region on the optical wiring board; and (c) a microlens arranging step of arranging a microlens on one end of the optical signal passing region.

In the manufacturing method of a substrate for a motherboard according to the seventh aspect of the present invention, it is desirable that, in the step (b), an optical signal passing region constituted by plural independent optical paths is formed as the optical signal passing region.

In the manufacturing method of a substrate for a motherboard according to the seventh aspect of the present invention, it is desirable that, in the step (b), an optical signal passing region constituted by a single optical path which can transmit an optical signal from or to a multichannel optical element is formed as the optical signal passing region.

In the manufacturing method of a substrate for a motherboard according to the seventh aspect of the present invention, it is desirable that, in the step (b), a metal layer forming step is carried out so that the wall face of the optical signal passing region is constituted by a metal layer. In this case, it is desirable that the metal layer formed in the metal layer forming step has a roughened surface.

In the above-mentioned manufacturing method of a substrate for a motherboard, it is desirable that, in the step (b), a resin layer forming step is carried out so that the wall face of the optical signal passing region is constituted by a resin layer. In this case, it is desirable that the resin layer formed in the resin layer forming step has a roughened surface.

In the manufacturing method of a substrate for a motherboard according to the seventh aspect of the present invention, it is desirable that, in the step (c), a portion on which the microlens is to be arranged is subjected to water-repellent treatment or hydrophilic treatment before the arrangement of the microlens.

Effects of the Invention

As described above, since the microlens is arranged on the end portion on the optical signal passing region in the substrate for mounting an IC chip according to the first aspect of the present invention, an optical signal that enters the light receiving element and an optical signal that is emitted from the light emitting element pass through the microlens, and thus diffusion in the optical signal can be suppressed, and input/output signals of the optical element can be transmitted more effectively. Accordingly, the loss hardly occurs in an optical signal, and a substrate for mounting an IC chip reduced of the transmission loss can be achieved.

Moreover, optical signals can be transmitted more positively between the optical element arranged on the substrate for mounting an IC chip and an optical part and the like mounted on an external substrate and the like, such as the substrate for a motherboard according to the second aspect of the present invention described later, and consequently an optical communication system with high reliability in transmission of optical signals can be achieved.

In the substrate for mounting an IC chip according to the first aspect of the present invention, input/output signals of the optical element can be transmitted via the optical signal passing region. Moreover, since the distance between the IC chip and the optical element becomes short when an IC chip is mounted on the substrate for mounting an IC chip, excellent reliability in electric signal transmission can be provided.

Moreover, since an electronic part and an optical element required for optical communication can be integrally formed in the substrate for mounting an IC chip according to the present invention, a thin and small terminal device for optical communication can be provided.

As described above, since the microlens is arranged on the end portion of the optical signal passing region in the substrate for a motherboard according to the second aspect of the present invention, an optical signal that enters an optical waveguide formed on the substrate for a motherboard and an optical signal that is emitted from the optical waveguide pass through the microlens, and thus diffusion in the optical signal can be suppressed, and input/output signals of the optical element can be transmitted more effectively. Accordingly, the loss hardly occurs in an optical signal, and a substrate for a motherboard that can reduce the transmission loss can be achieved.

Moreover, optical signals can be transmitted more positively between the optical waveguide formed on the substrate for a motherboard and an optical element and the like mounted on the substrate for mounting an IC chip and the like according to the first aspect of the present invention, and consequently an optical communication system with high reliability in transmission of optical signals can be achieved.

Furthermore, since the microlens is arranged on the end portion of the optical signal passing region in the substrate for a motherboard according to the second aspect of the present invention, an optical signal can be positively transmitted via the optical signal passing region and the optical waveguide.

Since an electronic part and an optical waveguide required for optical communication can be integrally formed in the substrate for a motherboard according to the present invention, a thin and small terminal device for optical communication can be provided.

Since the device for optical communication according to the third aspect of the present invention has a structure in which the substrate for mounting an IC chip according to the present invention is mounted on the substrate for a motherboard according to the present invention, an excellent transmission performance for optical signals can be provided.

Since the microlens is arranged on the optical path connecting between the optical waveguide and the optical element in the device for optical communication according to the fourth aspect of the present invention, an excellent transmission performance for optical signals can be provided.

Since the substrate for mounting an IC chip with the light receiving element mounted thereon and the optical signal passing region formed thereon and the substrate for mounting an IC chip with the light emitting element mounted thereon and the optical signal passing region formed thereon are mounted on the substrate for a motherboard in which the optical waveguide and the optical signal passing region are formed, and microlenses having predetermined functions are arranged at predetermined positions in the device for optical communication according to the fifth aspect of the present invention, when light emitted from the light emitting element is transmitted to the light receiving element via the optical signal passing region and the optical waveguide, this light can be transmitted without being reflected on the wall face of the optical signal passing region. Accordingly, without attenuation due to reflection, an excellent transmission performance for optical signals between the light emitting element and the light receiving element can be provided.

The manufacturing method of a substrate for mounting an IC chip according to the sixth aspect of the present invention has the above-mentioned configuration. Therefore, it is possible to suitably manufacture the substrate for mounting an IC chip according to the first aspect of the present invention, namely, a substrate for mounting IC chip, which transmits input/output signals in the optical element via the optical signal passing regions provided on the substrate and the insulating layer. Accordingly, by using the manufacturing method according to the sixth aspect of the present invention, a substrate for mounting an IC chip that is excellent in transmission performance for optical signals can be manufactured.

The manufacturing method of a substrate for a motherboard according to the seventh aspect of the present invention has the above-mentioned configuration. Therefore, it is possible to suitably manufacture the substrate for a motherboard according to the second aspect of the present invention, namely, a substrate for a motherboard, which transmits an optical signal via the optical signal passing region and the optical waveguide provided on the substrate and the insulating layer. Accordingly, by using the manufacturing method according to the seventh aspect of the present invention, a substrate for a motherboard that is excellent in transmission performance for optical signals can be manufactured.

BEST MODE FOR CARRYING OUT THE INVENTION

First, explanation for a substrate for mounting an IC chip according to a first aspect of the present invention will be given below.

The substrate for mounting an IC chip according to the first aspect of the present invention comprising: a conductor circuit and an insulating layer laminated on both faces of a substrate, together with an optical element mounted thereon, wherein an optical signal passing region is formed, and a microlens is arranged on an end portion of the optical signal passing region on the opposite side from the optical element.

Since the substrate for mounting an IC chip according to the first aspect of the present invention has the optical element mounted thereon together with the optical signal passing region provided thereon (substrate, insulating layer), input/output signals in the optical element can be transmitted via the optical signal passing region. Moreover, since the distance between the IC chip and the optical element becomes short when an IC chip is mounted on the substrate for mounting an IC chip, excellent reliability in electric signal transmission can be provided.

In the substrate for mounting an IC chip according to the first aspect of the present invention with the IC chip mounted thereon, an electronic part and an optical element required for optical communication can be integrally formed, and thus a thin and small terminal device for optical communication can be provided.

Furthermore, in the substrate for mounting an IC chip according to the first aspect of the present invention, the microlens is arranged on the end portion of the optical signal passing region on the opposite side from the optical element side, and thus an optical signal that enter a light receiving element and an optical signal that is emitted from a light emitting element pass through the microlens, making it possible to suppress diffusion in the optical signal, and to transmit input/output signals in the optical element more effectively. Accordingly, a substrate for mounting an IC chip of which the loss in an optical signal hardly occurs, and which can reduce the transmission loss can be achieved.

Moreover, optical signals between the optical element arranged on the substrate for mounting an IC chip and an optical part and the like mounted on an external substrate and the like can be transmitted more positively, and consequently an optical communication system with high reliability with respect to transmission of optical signals can be achieved.

In the substrate for mounting an IC chip according to the first aspect of the present invention, the optical signal passing region is formed with the microlens arranged on at least one end thereof.

Moreover, in the substrate for mounting an IC chip according to the first aspect of the present invention, a solder resist layer may also be formed on an outermost layer of a substrate having both faces laminated with a conductor circuit and an insulating layer.

Herein, brief explanation will be given for both a case when the solder resist layer is formed and a case when the solder resist layer is not formed in a mode of the substrate for mounting an IC chip according to the first aspect of the present invention in which the microlens is arranged on the end portion of the optical signal passing region.

In the substrate for mounting an IC chip according to the first aspect of the present invention, when insulating layers are laminated on both faces of the substrate without the solder resist layers being formed on the outermost layers, the microlens is arranged on the end portion of the optical signal passing region.

In contrast, when insulating layers are laminated on both faces of the substrate, and further, the solder resist layers are formed on the outermost layers, normally, the optical signal passing region is formed so as to penetrate through the solder resist layers. In this case, the microlens arranged on the end portion of the optical signal passing region is arranged inside the portion that penetrates through the solder resist layers of the optical signal passing region.

Furthermore, in the substrate for mounting an IC chip according to the first aspect of the present invention, when a solder resist layer is formed on the outermost layer and the optical signal passing region is formed so as to penetrate through the solder resist layer, the mode in which the microlens is arranged on the end portion that penetrates through the solder resist layer of the optical signal passing region is defined to be included in the mode of the substrate for mounting an IC chip according to the first aspect of the present invention in which the microlens is arranged on the end portion of the optical signal passing region.

In the present description, a region provided on the substrate for mounting an IC chip or a substrate for a motherboard described later, formed to transmit an input signal to an optical element and an output signal from the optical element, is referred to as the optical signal passing region.

The microlens is not particularly limited, and lenses which are normally used as an optical lens is used. Specific examples of the material thereof include optical glass, resin for an optical lens, and the like. The resin for an optical lens is not particularly limited as long as it has little absorption within a communication wavelength band, and examples thereof include thermosetting resin, thermoplastic resin, photosensitive resin, resin of which a part of thermosetting resin is allowed to have a photosensitive property, and the like.

Specific examples thereof include: acrylic resins such as PMMA (polymethyl methacrylate), heavy-hydrogenated PMMA, heavy-hydrogen fluoridated PMMA and the like; polyimide resins such as fluoridated polyimide and the like; epoxy resin; UV-setting epoxy resin; silicone resins such as heavy-hydrogenated silicon resin and the like; polymers produced from benzo-cyclobutene; and the like.

A refractive index of the microlens is not particularly limited, and may be set to the same as or greater than a refractive index of the optical signal passing region.

When the refractive index of the microlens is the same as that of the optical signal passing region, reflection of optical signals on the interface of the two members does not occur; therefore, optical signals can be transmitted more positively, and when the refractive index of the microlens is greater that of the optical signal passing region, optical signals can be converged in a desired direction; therefore, optical signals can be transmitted more positively.

A shape of the microlens include, for example, a convex lens with a convex face only on one side, and the like, and in such lens, the radius of curvature of the convex face of the lens may be selected appropriately by taking into consideration design and the like of the optical signal passing region. More specifically, for example, when it is necessary for a focal length to be made longer, it is desirable that the radius of curvature is made smaller, and when it is necessary for the focal length to be made shorter, it is desirable that the radius of curvature is made greater.

Here, the shape of the microlens is not particularly limited to the convex lens, and any shape may be used as long as the optical signal can be converged in a desired direction.

In the substrate for mounting an IC chip according to the first aspect of the present invention, it is desirable that the microlens arranged on the end portion of the optical signal passing region on the opposite side from the optical element has a transmittance of 70% or more in communication wavelength light.

If the transmittance of the communication wavelength light is less than 70%, a loss of optical signal is made greater, leading to degradation in transmission performance of the optical signal. It is more desirable that the transmittance is 90% or more.

In the present description, the transmittance of communication wavelength light refers to a transmittance of communication wavelength light per 1 mm in length. More specifically, for example, when a light beam having an intensity of $I_1$ enters the microlens and thereafter emitted by passing through the microlens by 1 mm as the emitted light having an intensity $I_2$, the value of transmittance is calculated from the following expression (1).

$$\text{Transmittance (\%)} = (I_2/I_1) \times 100 \qquad (1)$$

Here, the above-mentioned transmittance is measured at a temperature in the range of 25 to 30° C.

Moreover, it is desirable that the microlens is mixed with particles. More specifically, for example, it is desirable that particles such as resin particles, inorganic particles, metal particles and the like are mixed therein. When the particles are contained therein, the strength of the microlens is improved and the shape thereof is maintained more positively while coefficients of thermal expansion among the constituent members of the substrate for mounting an IC chip are well adjusted with one another, making it difficult for cracks and the like due to a difference between coefficients of thermal expansion to occur.

When particles are contained in the microlens, it is desirable that the refractive index of the resin component of the microlens and the refractive index of the particles are almost the same level. Therefore, it is desirable that the particles contained in the microlens are a mixture of two or more kinds of particles having different refractive indexes, so that the refractive index of the particles is almost the same level as the refractive index of the resin component.

More specifically, for example, when the resin component is an epoxy resin having a refractive index of 1.53, it is desirable that particles obtained by mixing silica particles having a refractive index of 1.46 and titania particles having a refractive index of 2.65 and dissolving them to form particles, and particles of the like are prepared as particles to be contained in the microlens.

Here, a method for mixing the particles include a kneading method, a method of fusing and mixing two kinds or more of particles and then forming them into particles, and methods of the like.

The material for the resin particles include, for example, thermosetting resin, thermoplastic resin, photosensitive resins, resin of which a part of thermosetting resin is allowed to have a photosensitive property, a resin composite between thermosetting resin and thermoplastic resin, and a composite between photosensitive resin and thermoplastic resin, and materials of the like.

More specifically, for example, thermosetting resins such as epoxy resin, silicone resin, phenol resin, polyimide resin, bismaleimide resin, polyphenylene resin, polyolefin resin, fluororesin and the like; resin prepared by allowing methacrylic acid, acrylic acid and the like to react with a thermosetting group in these thermosetting resins (for example, an epoxy group in an epoxy resin) to add an acrylic group thereto; thermoplastic resins such as phenoxy resin, polyether sulfone (PES), polysulfone (PSF), polyphenylene sulfone (PPS), polyphenylene sulfide (PPES), polyphenyl ether (PPE), polyether imide (PI) and the like; and photosensitive resins such as acrylic resin, and resins of the like.

Moreover, a resin composite between the above-mentioned thermosetting resin and thermoplastic resin, resin to which the above-mentioned acrylic group is added, and a resin composite between the above-mentioned photosensitive resin and thermoplastic resin may also be used.

Moreover, resin particles made of rubber may also be used as the resin particles.

The material for the inorganic particles include, for example, aluminum compounds such as alumina, aluminum hydroxide and the like; calcium compounds such as calcium carbonate, calcium hydroxide and the like; potassium compounds such as potassium carbonate and the like; magnesium compounds such as magnesia, dolomite, basic magnesium carbonate and the like; silicon compounds such as silica, zeolite and the like; titan compounds such as titania and the like; and materials of the like. Moreover, a material prepared by mixing silica and titania at predetermined rates to be fused and uniformly combined may also be used.

Phosphor and phosphor compounds may also be used as materials for the inorganic particles.

The material for the metal particles include, for example, gold, silver, copper, palladium, nickel, platinum, iron, zinc, lead, aluminum, magnesium, calcium and the like.

These resin particles, inorganic particles and metal particles may be used independently, or two kinds or more thereof may be used in combination.

The shape of the particles is not particularly limited, and desirable shapes thereof include, for example, a spherical shape, an elliptic spherical shape, a crushed shape, a polygonal shape and the like. The desirable shape among these shapes is a spherical shape or an elliptic spherical shape. This is because cracks and the like hardly occur on the microlens since there are no corners in the spherical shape and the elliptic spherical shape.

Furthermore, when the shape of the particles is a spherical shape or an elliptic spherical shape, light is hardly reflected on the particles leading to reduction of the loss of an optical signal.

Although the particle size of the particles (largest length of the particle) is not particularly limited, it is desirable that the upper limit thereof is 0.8 μm and the lower limit thereof is 0.01 μm.

The inner diameter of a coating nozzle of an inkjet apparatus and the dimension of the inner diameter of a dispenser nozzle are 20 μm in the minimum dimension at present. When the particle size is set within the above-mentioned range, the coating operation can be carried out without causing clogging in the nozzle.

Here, it is more desirable that the particle size is 0.1 μm in lower limit.

The particle size that is set in this range is desirable from the viewpoints of viscosity stability and deviations in the amount of coating in the coating operation by an inkjet apparatus, a dispenser and the like.

It is desirable that the amount of mixed particles contained in the microlens is 5% by weight in lower limit, and it is more desirable therefor to be 10% by weight in lower limit. In contrast, it is desirable that the amount of mixed particles is 60% by weight in upper limit, and it is more desirable therefor to be 50% by weight in upper limit. If the amount of mixed particles is less than 5% by weight, the effect obtained by the mixing of the particles may not be exhibited, and if the amount of mixed particles exceeds 60% by weight, transmission of an optical signal may be inhibited.

Moreover, the microlens is not necessarily required to have an individual shape, and a microlens array constituted by plural lenses integrally combined may be used.

Here, when a microlens array is used, this microlens array may be arranged on a predetermined end portion of the optical signal passing region by using an optical adhesive.

Here, the shape of the microlens array is not particularly limited and may be properly selected by taking into consideration designing of a substrate for mounting an IC chip, the shape of the optical signal passing region, and the like. More specifically, for example, when the optical signal passing region is constituted by a single optical path which can transmit an optical signal from or to a multichannel optical element, a microlens array in which microlenses having a lens diameter of 220 μm and a lens sag height of 5 to 50 μm (5 to 20 μm is desirable) are arranged in parallel with each other with a pitch of 250 μm, may be used.

As the method of fabricating the above-mentioned microlens array, for example, anisotropic etching and photolithography, and methods of the like may be used when the microlens is made of glass or quartz, and when the microlens is made of resin, a method in which the material resin is poured into a mold, and heat and a load are applied thereon, such that the lens array is fabricated, and methods of the like may be used.

By referring to the drawings, brief explanation for a specific shape of the microlens array will be given. Here, the microlens array to be used in the first aspect of the present invention is not intended to be limited by those having the following shapes.

Each of the FIGS. 1A to 1C are cross-sectional views that schematically show examples of the microlens array, respectively.

In other words, the microlens array to be used in the first aspect of the present invention may be prepared as, as shown in FIG. 1A, a microlens array 11 in which plural lenses, each having a convex shape with a convex face, are provided on an upper face of a plate-shaped member or, as shown in FIG. 1B, a microlens array 12 in which plural lenses, each having a square pillar shape with a spherical part being placed on the upper face, are provided on an upper face of a plate-shaped member or, as shown in FIG. 1C, a microlens array 13 in which plural lenses, each having a concave shape with a concave face, are provided on an upper face of a plate-shaped member.

The optical adhesive is not particularly limited, and optical adhesives such as epoxy resin, acrylic resin, silicone resin and the like may be used.

It is desirable that the optical adhesive has the following characteristics: viscosity: 0.2 to 1.0 Pa·s, refractive index: 1.4 to 1.6, light transmittance: 80%/mm or more, coefficient of thermal expansion (CTE): $4.0 \times 10^{-5}$ to $9.0 \times 10^{-5}$ (/° C.).

Here, it is desirable that the optical adhesive the thickness of 50 μm or less.

Moreover, it is desirable that the above-mentioned microlens is directly arranged on the end portion of the optical signal passing region that has been subjected to hydrophilic treatment or water-repellent treatment.

This is because, depending on wettability of the end portion of the optical signal passing region, deviation tends to occur in the shape of a microlens, in particular, in the sag height thereof; however, deviation in the sag height can be prevented by the hydrophilic treatment or water-repellent treatment.

Moreover, it is also desirable that the microlens is arranged with a lens marker on the end portion of the optical signal passing region, and that the surface of the lens marker is subjected to water-repellent treatment or hydrophilic treatment. Also in this case, the same effects can be obtained.

The water-repellent treatment includes, for example, treatment using a water-repellent coat material such as a fluorine-based polymer coating agent (surface tension: 10 to 12 mN/m) and the like, water-repellent treatment using $CF_4$ plasma, and treatments of the like, and the hydrophilic treatment includes hydrophilic treatment using $O_2$ plasma, and treatments of the like.

Hereinafter, brief explanation for specific methods of the water-repellent treatment and hydrophilic treatment will be given.

At the time of carrying out the treatment using the water-repellent coat material, first, a mask having an opening corresponding to a portion of which a microlens is to be formed (namely, the end portion of the optical signal passing region) on a substrate for mounting an IC chip is prepared, and the substrate is then coated with a water-repellent coat material by using a spray coating method or a spin coater. Thereafter, the mask is separated after the water-repellent coat material is dried naturally, and thus the treatment using the water-repellent coat material is completed. Here, the water-repellent coat material layer normally has the thickness of around 1 μm. Moreover, a mask of a mesh plate or a mask with resist formed thereon may be used as the mask.

Moreover, at the time of carrying out the water-repellent treatment using $CF_4$ plasma, first, a mask having an opening corresponding to a portion of which a microlens is to be formed (namely, the end portion of the optical signal passing region) on a substrate for mounting an IC chip is prepared, and then the substrate is subjected to $CF_4$ plasma treatment. Thereafter, the mask is separated, and thus the water-repellent treatment is completed.

Herein, a mask with resist formed thereon may be used as the mask.

At the time of carrying out the hydrophilic treatment using $O_2$ plasma, first, a mask having an opening corresponding to a portion of which a microlens is to be formed (namely, the end portion of the optical signal passing region) on a substrate for mounting an IC chip is prepared, and then the substrate is subjected to $O_2$ plasma treatment. Thereafter, the mask is separated, and thus the hydrophilic treatment is completed.

Herein, a mask of a mesh plate or a mask with resist formed thereon may be used as the mask.

The effects of the above-mentioned water-repellent treatment and hydrophilic treatment will be described by, as an example, taking a case in which a microlens is directly arranged on an end portion of an optical signal passing region. In other words, a case in which a microlens having a diameter of 220 μm and a sag-height of 10 μm was formed by the coating of a substrate through inkjet using a resin for an optical lens with 380 pl, and the shape (diameter and sag-height of the microlens) thereof was examined to obtain the following results.

When neither of the surface treatments was carried out, the portion on which a microlens was to be arranged (the end portion of the optical signal passing region) had the wet angle in the range of 30 to 60 degrees, and even when the amount of coat of the resin was increased, the sag height in the same diameter would not changed.

In contrast, when the treatment using the fluorine-based polymer coating agent was carried out, the treated portion had the wet angle in the range of 100 to 105 degrees, and microlenses with an average sag height of 10.01 μm (standard deviation σ: 0.14) and an average diameter of 220.87 μm (σ: 2.70) were formed.

Moreover, when the water-repellent treatment using $CF_4$ plasma was carried out for 150 to 300 seconds, the treated portion had the wet angle in the range of 80 to 95 degrees, and microlenses with an average sag height of 10.01 μm (σ: 0.34) and an average diameter of 221.80 μm (σ: 4.72) were formed.

Furthermore, when the hydrophilic treatment using $O_2$ plasma was carried out for 30 to 120 seconds, the treated portion had the wet angle in the range of 3 to 10 degrees, and microlenses with an average sag height of 10.04 μm (σ: 0.25) and an average diameter of 221.47 μm (σ: 3.36) were formed.

Accordingly, it became apparent that microlenses having a more uniform shape were formed by carrying out the water-repellent treatment or the hydrophilic treatment, and that, when arranged in the order of effects, the treatment using the water-repellent coat material was the greatest, followed by the hydrophilic treatment using $O_2$ plasma and the water-repellent treatment using $CF_4$ plasma.

When a microlens is arranged on an end portion of an optical signal passing region in the substrate for mounting an IC chip according to the present invention, the microlens may be arranged with a lens marker.

The lens marker is a column-shaped base used for forming microlenses, and specific examples thereof include one disclosed in JP-A 2002-331532, and the like.

A method for forming a lens marker include, for example, a method of forming on an end portion of an optical signal passing region a photosensitive material film having the same refractive index as the microlenses, and carrying out exposing and developing treatment on this photosensitive material film using a photomask, thereby forming a film for forming a lens marker on which a microlens pattern is transferred with an alignment mark located in the center thereof, and methods of the like.

With respect to a method for arranging the microlenses on this lens marker, a method in which microlenses are formed by forming liquid-state microlenses by injecting a liquid-state resin for forming a lens onto the lens marker having the microlenses pattern, and then curing the liquid-state microlenses by applying ultraviolet rays and the like thereto, and methods of the like can be used.

Moreover, at the time when the microlenses are to be arranged on the lens marker, it is desirable that the lens marker has been subjected to water-repellent treatment or hydrophilic treatment.

If the surface of the lens marker is stained, a resin composition to be used for forming a microlens (resin composition for forming a lens) is not spread uniformly, causing failure in the forming of a microlens having a desired shape.

Therefore, the water-repellent treatment or the hydrophilic treatment should be carried out to remove stains from the lens marker surface, and uniformly spread the resin composition for forming a lens over the lens marker.

It is more desirable that the lens marker is subjected to the hydrophilic treatment rather than the water-repellent treatment.

This is because, when the lens marker has been subjected to the hydrophilic treatment, a microlens having a predetermined shape can be suitably formed since, at the time of arranging a microlens, the resin composition for forming a lens dropped on the lens marker can easily spread over the entire lens marker, and since surface tension occurs because the spread of the resin is positively stopped on the periphery of the lens marker.

An optical signal passing region is provided on the substrate for mounting an IC chip according to the first aspect of the present invention.

The substrate for mounting an IC chip provided with such an optical signal passing region can transmit/receive information among optical parts mounted on the surface or inside of the substrate for mounting an IC chip via the optical signal passing region by using optical signals.

Moreover, by connecting the substrate for mounting an IC chip according to the first aspect of the present invention with the optical element mounted thereon, via solder and the like to a substrate for a motherboard according to the second aspect of the present invention arranged with another optical part (for example, an optical waveguide and the like) on the surface of the other side thereof, and substrates of the like, information between the optical element mounted on the substrate for mounting an IC chip according to the first aspect of the present invention and the optical part mounted on the above-mentioned external substrate can be transmitted/received via the optical signal passing region by using optical signals.

A resin composition may be filled into apart of or the entire optical signal passing region. Reduction in strength of the substrate for mounting an IC chip can be prevented thereby.

Furthermore, when the resin composition is filled into the optical signal passing region, the entering of dust and foreign matters into the optical signal passing region can be prevented, and the inhibiting of transmission of an optical signal due to existence of the dust, foreign matters and the like can be prevented.

When a solder resist layer is formed on the outermost layer of the substrate for mounting an IC chip and the optical signal passing region is provided so as to penetrate through the solder resist layer, the resin composition may or may not be filled into the portion which penetrates through the solder resist layer.

The resin component of the resin composition is not particularly limited as long as it has little absorption in a communication wavelength band, and specific examples thereof include, for example, the same resins as those used in the microlens, and resins of the like.

In addition to the above-mentioned resin component, the resin composition may contain, for example, particles such as resin particles, inorganic particles, metal particles and the like. By allowing such particles to be contained, coefficients of thermal expansion between the optical signal passing region and the substrate, the insulating layer, the solder resist layer and the like can be well adjusted, and, depending on the type of particles, fire resistance can be imparted.

Specific examples of the above-mentioned particles include the same particles as those contained in the microlens, and particulates of the like.

The shape and the like of the optical signal passing region will be later described in detail.

Moreover, an optical element is mounted on the substrate for mounting an IC chip according to the first aspect of the present invention, and it is desirable that the optical element is prepared as a light receiving element and/or a light emitting element, and the like.

The light receiving element includes, for example, a PD (photodiode), an APD (avalanche photodiode) and the like.

These elements may be appropriately used on demand by taking into consideration the configuration, the required characteristics and the like of the substrate for mounting an IC chip.

The material for the light receiving element includes, for example, Si, Ge, InGaAs and the like.

Among these, it is desirable that InGaAs is used because of its excellent light-receiving sensitivity.

The light emitting element includes, for example, an LD (semiconductor laser), a DFB-LD (distribution feedback-type semiconductor laser), an LED (light emitting diode), an infra-type or oxidization constriction-type VCSEL (plane emission semiconductor laser) and the like.

These elements may be appropriately used on demand by taking into consideration the configuration, the required characteristics and the like of the substrate for mounting an IC chip.

The material for the light emitting element include a compound of gallium, arsenic and phosphor (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphor (InGaAsP), and materials of the like.

These materials are appropriately used on demand by taking a communication wavelength into consideration. For example, GaAlAs may be used for a communication wavelength band of 0.85 µm, InGaAs and InGaAsP may be used for communication wavelength bands of 1.3 µm and 1.55 µm.

Here, both the light emitting element and the light receiving element may be a multichannel array element.

Moreover, when a multichannel array element is used, the array element may be used with all the channels being made effective, or may be used with only part of the channels being made effective.

It is desirable that the mounting position of the optical element is set on the surface of the substrate for mounting an IC chip. When, as described above, the optical element is mounted on the surface of the substrate for mounting an IC chip, even when defects are caused on one of the optical elements, only the optical element in question will be required to be exchanged.

It is also desirable that electronic parts such as a capacitor and the like are mounted on the surface of the substrate for mounting an IC chip. This is because only the defective part can be exchanged, as in the case of the optical elements.

When an optical element of a wire bonding type is mounted as the optical element, this optical element may be resin-sealed. In this case, only the optical element may be resin-sealed, or the entire part including the other mounting parts such as an IC chip and the like may be resin-sealed.

Moreover, when an optical element of a flip-chip type is mounted as the optical element, the optical element may be sealed with under fill, or only the periphery of the optical element may be sealed, or the entire part may be covered with a cover case. Thus, the entering of dust and foreign matters into an optical path can be prevented. Selection of whether or not the under fill is sealed, and the value of the refractive index and the like of the under fill when sealed, may be made appropriately depending on design.

Moreover, when a light emitting element is arranged as the optical element in the substrate for mounting an IC chip according to the first aspect of the present invention, it is desirable that light emitted from the optical element is formed into collimated light via the microlens, so that the light is positively transmitted to the external substrate such as the substrate for a motherboard according to the second aspect of the present invention described later, and substrates of the like.

The collimated light refers to light that has ±10% in difference within radius of a region having a light intensity distribution which is $1/e^2$ or more of the light intensity peak (spot radius), on arbitrary planes perpendicular to the light transmission direction, each of which are apart from the microlens by 1 mm or more in the light transmission direction In the substrate for mounting an IC chip according to the first aspect of the present invention, it is desirable that the spot region made on the light receiving portion of the light receiving element by light that enters the light receiving element via the microlens overlaps the light receiving portion by 22% or more, so that an optical signal is more positively transmitted to the light receiving element.

Here, the spot region refers to a region on a plane including the light receiving face, which has a light intensity of $1/e^2$ or more of the light intensity peak.

Moreover, it is particularly desirable that the spot region is entirely made on the light receiving portion of the light receiving element.

In the substrate for mounting an IC chip according to the first aspect of the present invention, it is desirable that conductor circuits with the substrate interposed there between are connected to each other via a plated through hole, and conductor circuits with the insulating layer interposed there between are connected to each other via a via hole. This is because high-density wiring of the substrate for mounting an IC chip can be achieved and the substrate can also be miniaturized.

Referring to the drawings, the following is an explanation for an embodiment of the substrate for mounting an IC chip according to the first aspect of the present invention. FIGS. 2 to 4 are cross-sectional views that schematically show one example of the substrate for mounting an IC chip according to the first aspect of the present invention.

The embodiment of the substrate for mounting an IC chip according to the first aspect of the present invention is mainly classified into three modes depending on the modes of the optical signal passing region.

In other words, the three modes of the optical signal passing region may include: a batch through hole structure (herein after, also referred to as a substrate for mounting an IC chip according to the first embodiment), an individual through hole structure (herein after, also referred to as a substrate for mounting an IC chip according to the second embodiment) and a concave structure (herein after, also referred to as a substrate for mounting an IC chip according to the third embodiment).

Here, the substrate for mounting an IC chip according to the first embodiment desirably has a mode that: the optical element is a multichannel optical element, and the optical signal passing region is constituted by a single optical path which can transmit an optical signal from or to a multichannel optical element.

In this case, it is desirable that a shape of the single optical path which can transmit an optical signal from or to a multichannel optical element is a connection of portions of wall faces of plural columns, and at least one of the columns is desirably a dummy column that does not transmit any optical signal.

Moreover, the substrate for mounting an IC chip according to the second embodiment desirably has a mode that: the optical element is a multichannel optical element, and the optical signal passing region is constituted by plural independent optical paths.

FIG. 2 shows one example of the substrate for mounting an IC chip according to the first embodiment. FIG. 2 shows a substrate for mounting an IC chip in which: a solder resist layer is formed on the outermost layer, an optical signal passing region that penetrates through the solder resist layer is formed, and a microlens is arranged on an end portion of this optical signal passing region penetrating through the solder resist layer, that is, on an end the opposite side from which the optical element is mounted.

As shown in FIG. 2, a substrate 120 for mounting an IC chip has a structure in which both a conductor circuit 124 and an insulating layer 122 are laminated on both faces of a substrate 121, and the conductor circuits with the substrate 121 interposed there between and the conductor circuits with the insulating layer 122 interposed there between are electrically connected by a plated through hole 129 and a via hole 127, respectively. Moreover, a solder resist layer 134 is formed on the outermost layer.

This substrate 120 for mounting an IC chip is provided with an optical signal passing region 142 formed so as to penetrate through the substrate 121, the insulating layer 122 and the solder resist layer 134.

Portions of the optical signal passing regions 142 that penetrate through the substrate 121, the insulating layer 122 and the solder resist layer 134 are filled with a resin composition 147.

Moreover, the diameter of the portion that penetrates through the solder resist layer 134 is the same as that of the portions that penetrate through the substrate 121 and the insulating layer 122, and the shape of the longitudinal section of the portion penetrating through the solder resist layer 134 is a rectangular shape.

On one face of the substrate 120 for mounting an IC chip, a four-channel light receiving element 139 is surface-mounted with a solder connecting portion 144 such that each light receiving portion 139a to 139d face the optical signal passing region 142, and an IC chip 140 is also surface-mounted with a solder connecting portion 143. Moreover, solder bumps 137 are formed on a solder resist layer 134 located on the other face of the substrate 120 for mounting an IC chip.

Therefore, an input signal to the four-channel light receiving element 139 can be transmitted through the optical signal passing region 142. Here, the optical signal passing region 142, which has a size that sufficiently transmits optical signals to the four channels, is formed through a batch process so as to penetrate through the substrate 121, the insulating layer 122 and the solder resist layer 134.

Here, as shown in FIG. 2, the portion of the optical signal passing region 142 that penetrates through the solder resist layer 134 may be filled with a resin composition or may be formed by a vacancy. Moreover, a metal layer (conductor layer) may be formed on the periphery of the portion of the optical signal passing region 142 that penetrates through the substrate 121 and the insulating layer 122.

On an end portion of the optical signal passing region 142, a microlens array 146 in which four lenses 146a to 146d are placed in parallel with one another is arranged with an adhesive (not shown in the figure) on an opposite side from a side of the light receiving element 139. Here, each of the lenses 146a to 146d are placed to correspond to each of the channels 139a to 139d of the light receiving element 139, respectively.

Accordingly, an optical signal to the light receiving element 139 passes through each of the lenses 146a to 146d that constitute the microlens array 146, and by arranging the microlens array 146 on one end of the optical signal passing region 142, a transmission loss in the optical signal can be suppressed.

As an alternative of the microlens array 146, four microlenses may be arranged individually at predetermined positions directly or with an adhesive. Here, the number of the microlenses is four because the number of the channels of the light receiving element is four. With respect to the above-mentioned substrate for mounting an IC chip, it is desirable that the number of the microlenses is the same as the number of the channels of the optical element.

Moreover, when the microlenses are directly arranged on the optical signal passing region 142, it is desirable that portions to which the microlenses are arranged are subjected to hydrophilic treatment or water-repellent treatment. A detailed explanation for these surface treatments will follow.

In the substrate 120 for mounting an IC chip having the above-mentioned configuration, an optical signal transmitted via an external optical part (an optical fiber, an optical waveguide or the like) is further transmitted to the light receiving element 139 (light receiving portion 139a) via the microlenses 146a to 146d and the optical signal passing region 142, and after being converted to an electric signal by the light receiving element 139, the resulting signal is sent to the IC chip 140 via the solder connecting portion 144, the conductor circuit 124, the via hole 127 and the like, and processed therein.

In the substrate for mounting an IC chip according to the first aspect of the present invention, the transmission distance of the electric signal becomes short since the light receiving element that conducts the optical/electric signal conversion is mounted at a position close to the IC chip, and thus excellent reliability in the signal transmission can be provided and high-speed communication can also be achieved.

Moreover, in the substrate 120 for mounting an IC chip, since the solder bumps 137 are formed on the solder resist layer 134 with a metal plating layer, the transmission of the electric signal between the IC chip 140 and the external substrate and the like can also be carried out via the solder bumps 137.

When the solder bumps are formed in this manner, the substrate for mounting an IC chip can be connected to an external substrate, such as a substrate for a motherboard, with the solder bumps, and in this case, the substrate for mounting an IC chip can be placed at a predetermined position by utilizing a self-alignment function exerted by the solder.

The above-mentioned self-alignment function refers to a function in which, because of its fluidity, at the time of a reflow process, the solder tries to maintain a more stable shape near the center of the opening for forming a solder bump. This function is considered to take place because the solder resist layer repels the solder, and because at the time when the solder is adhered to metal, strong surface tension is exerted so as to form a spherical shape.

When this self-alignment function is utilized at the time of connecting the substrate for mounting an IC chip to an external substrate via the solder bumps, even if positional deviation has occurred between the two members prior to the reflow process, the substrate for mounting an IC chip can shift at the time of the reflow process, and the substrate for mounting an IC chip can be attached to an appropriate position of the external substrate. Accordingly, in the case of transmitting an optical signal between the optical element mounted on the substrate for mounting an IC chip and the external optical part via the optical signal passing region, if the mounting position of the optical element mounted on the substrate for mounting an IC chip is accurately determined, the transmission of the optical signal between the substrate for mounting an IC chip and the external substrate can be carried out accurately.

In the substrate for mounting an IC chip with such a multichannel array element mounted thereon, the diameter of each of the microlenses arranged on the end portion of the optical signal passing region is appropriately determined depending on the pitch between each of the respective channels in the array element, and for example, when an array element having a pitch of 250 μm is used, it is desirable that the diameter is in the range of 100 μm to 240 μm, and more desirably in the range of 180 μm to 230 μm. If the diameter is less than 100 μm, there may be some cases in which a desired focal length cannot be obtained, and if the diameter exceeds 240 μm, there may be some cases in which microlenses adjacent to each other make contact and the microlenses cannot be placed at predetermined positions.

Furthermore, for example, when an array element having a pitch of 500 μm is used, it is desirable that the diameter is in the range of 100 μm to 490 μm, and more desirably in the range of 180 μm to 480 μm. If the diameter is less than 100 μm, there may be some cases in which a desired focal length cannot be obtained, and if the diameter exceeds 490 μm, there may be some cases in which microlenses adjacent to each other make contact and the microlenses cannot be placed at predetermined positions.

The shape of the optical signal passing region having the above-mentioned batch through hole structure include, for example, a column shape, a rectangular pillar shape, an elliptical column shape, a pillar shape with a bottom face consisting of straight lines and arcs, and the like.

In this case, it is desirable that the size of the optical signal passing region having the batch through hole structure is in the range of 100 μm to 5 mm in the longitudinal and lateral sides, respectively. More specifically, when the optical signal passing region has a column shape, it is desirable that the diameter of the bottom face is in the above-mentioned range, and when the region has any one of the above-mentioned pillar shapes, it is desirable that both the length of the longest portion of the bottom face and the length of a portion orthogonal to the longest portion are in the above-mentioned range.

If the length is less than 100 μm, there may be some cases in which the transmission of an optical signal is inhibited, and on the other hand, if the length exceeds 5 mm, the transmission loss of an optical signal is not improved, and there may be difficulty in miniaturizing the substrate for mounting an IC chip.

Moreover, the shape of the optical signal passing region of the batch through hole structure include, for example, a shape in which plural columns are placed in parallel with each other, and portions of side surfaces of the adjacent columns are connected to each other.

In this case, it is desirable that a dummy column, which actually does not function as an optical signal passing region, is formed at a part thereof. In particular, when an optical signal passing region is formed for an even numbered channel optical element thereon, it is desirable that the dummy column is formed. This is because the above-mentioned configuration is suitable for forming an optical signal passing region having a desired shape, as will later be described in detail.

Specific examples of the shape in which the portions of the side surfaces of the columns are connected to each other include, for example, a shape in which portions of the side surfaces of columns, which have a diameter of 300 μm at the bottom face and are placed in parallel with one another having a center-to-center distance of 250 μm between each of the bottom faces, are connected to one another, a shape in which portions of the side surfaces of columns, which have a diameter of 500 μm at the bottom face and are placed in parallel with one another having a center-to-center distance of 550 μm between each of the bottom faces, are connected to one another, and the like.

A detailed explanation for the method for forming these optical signal passing regions will follow.

When forming an optical signal passing region in the substrate for mounting an IC chip, it is desirable that a size of the optical signal passing region is such that light emitted from the light emitting element and light that enters the light receiving element are not reflected on the wall faces and that interference is not caused between the adjacent optical signals. Thus, transmission loss due to reflection from the wall faces in the optical signal passing region and interference between signal light rays is not caused.

Therefore, a desirable cross-sectional shape for the optical signal passing region of the batch through hole structure was examined.

The substrate for mounting an IC chip that was examined was provided with light emitting elements in which: the optical element was a four channel VCSEL element having a spreading angle of 24 degrees; the optical signal passing region was filled with a resin composition having a refractive index of 1.5; and inserted into a lower portion of the optical element, underfill having a refractive index of 1.5.

Here, the spreading angle of the VCSEL element refers to an angle at which light having a light output power of $1/e^2$ of the greatest light output power is emitted.

The results of the examination indicate that in the substrate for mounting an IC chip having the above-mentioned mode, when the substrate for mounting an IC chip has the thickness of 0.8 mm and the VCSEL element has a channel-to-channel distance of 250 μm for example, the optical signal passing region of a batch through hole structure should have a diameter of 300 μm or more to be able to transmit an optical signal without causing reflection to the wall faces of the optical signal passing region and interference between signal light rays, and when the substrate for mounting an IC chip has the thickness of 1.7 mm and the VCSEL element has a channel-to-channel distance of 500 μm for example, the optical signal passing region of a batch through hole structure should have a diameter of 550 μm or more to be able to transmit an optical signal without causing reflection from the wall faces of the optical signal passing region and interference between signal light rays.

Moreover, as shown in FIG. 2, when a solder resist layer is formed on the substrate for mounting an IC chip, the shape of a portion of the optical signal passing region that penetrates through the solder resist layer is not particularly limited, and may be formed into the same shape as the portion that penetrates through the above-mentioned substrate and the insulating layer.

Here, the shape of its longitudinal section may be formed into a trapezoidal shape the short side of which corresponds the substrate and insulating layer side.

The wall faces of the optical signal passing region may be made of resin or metal.

Here, the wall faces of the optical signal passing region normally have the substrate and the insulating layer exposed thereto, meaning that they are constituted by the same materials as those of the substrate and the insulating layer. Therefore, when the substrate and the insulating layer are made of resin, it means that the wall faces of the optical signal passing region are also made of resin, even if a process for forming a resin layer and the like is not carried out.

However, a resin layer may separately be formed on each of the wall faces of the optical signal passing region, and in this case, it is desirable that the resin layer functions as a clad and a resin composition filled into the optical signal passing region functions as a core.

Furthermore, when the wall faces of the optical signal passing region are made of metal, the material thereof include, for example, copper, nickel, chromium, titanium, noble metals and the like.

Moreover, when the wall faces of the optical signal passing region are made of metal, that is, when metal layers are formed on the wall faces of the optical signal passing region, the metal layer may be formed by one layer, or may be constituted by two or more layers.

Here, the metal layer may have a function as a plated through hole, that is, a function for electrically connecting conductor circuits with the substrate interposed there between or conductor circuits with the substrate and the insulating layer interposed there between.

Furthermore, the metal layer may be made of glossy metal. When the material of the metal layer is glossy metal, there are some cases in which the signal intensity becomes less susceptible to attenuation and the like, even when an optical signal is reflected by the wall face of the optical signal passing region.

The glossy metal include, for example, gold, silver, nickel, platinum, aluminum, rhodium and the like. Further, with respect to the glossy metal, for example, copper, palladium and the like may also be used. However, since these materials are easily oxidized and form oxide layers that decrease the glossiness on the surface of the metal layer thus formed, it is necessary to increase the glossiness on the surface of the metal layer by removing the oxide layers. Here, the glossy metal is not particularly limited to those mentioned above, and another metal may be used as long as it exerts mirror gloss or clear gloss.

In the substrate for mounting an IC chip according to the first aspect of the present invention, it is desirable that the optical signal passing region is designed such that an optical signal does not reflect on the wall faces of the optical signal passing region, so that attenuation of the signal intensity due to reflection on the wall faces can be avoided.

Moreover, it is desirable that the wall faces of the optical signal passing region have roughened surfaces, and in this case, it is desirable that the wall faces have the surface roughness Ra of a lower limit value of 0.1 μm and an upper limit value of 5 μm, and more desirably a lower limit value of 0.5 μm and an upper limit value of 3 μm. Within this range of value, the adhesion of the resin composition can be improved.

Here, the surface roughness Ra is indicated by a value obtained in compliance with the arithmetic mean roughness described in JIS B 0601.

The above-mentioned roughened surface may be formed, for example, by directly applying an etching process and the like to resin or metal that constitutes the wall faces of the optical signal passing region, or, for example, by providing a roughened layer made of tin, titanium, zinc and the like on the metal layer formed on the wall faces of the optical signal passing region.

By providing the above-mentioned coat layer or roughened layer, the adhesion of the resin composition filled into the optical signal passing region can be improved.

The present inventors have carried out tests to examine influences the size of the surface roughness Ra give to the substrate for mounting an IC chip when the wall faces of the optical signal passing region have roughened surfaces, and the resulting data are shown below.

Firstly, explanation for a case where the wall faces of the optical signal passing region are made of metal will be given below.

First, an epoxy substrate with a sufficient size, having a thickness of 0.8 mm was prepared, and in this epoxy resin, a through hole, having the shape and surface roughness of which a explanation will follow, was formed, and moreover, a resin composition was filled into the through hole. Then, with respect to the through hole (optical signal passing region) filled with the resin composition, the filling property, the reliability at the time of temperature cycle tests and the light transmitting property of the resin composition were evaluated.

Here, with respect to the evaluation of the filling property of the resin composition, after an epoxy substrate had been cross-cut, the cross section was observed by using a microscope, and evaluation was made upon whether or not there was any unfilled portion of the resin composition as well as upon whether or not there were any voids in the resin composition filled into the through hole.

Moreover, with respect to the reliability at the time of temperature cycle tests, in a liquid vessel, after 500 cycles and 1000 cycles of temperature cycle tests having a cycle of 3 minutes at −55 degrees and 3 minutes at 125 degrees respectively were carried out, the resulting epoxy substrate was cross-cut, and, by using a microscope, the cross section was observed whether or not there was any separations or cracks in the resin composition filled into the through hole.

Furthermore, with respect to the light transmitting property, at a position 50 μm from the surface of the epoxy substrate, a VCSEL element having a spreading angle of 24 degrees was placed, and from this VCSEL element via the optical signal passing region, light having a speed of 2.5 Gbps was transmitted, and when the transmission loss measured by a power meter was 1 dB or less, the through hole was considered to be able to transmit an optical signal.

With respect to the evaluation sample, firstly, 40 of each of the following sample substrates were prepared; a substrate having five sets of through holes, one set consisting of four through holes, each hole formed in an epoxy substrate by using a drill having a diameter of 150 μm such that between each of the holes there is a center-to-center distance of 250 μm (sample substrate A), a substrate having 20 groups of through holes, each group consisting of a connection of a portion of the side faces of five through holes formed in an epoxy substrate by using a drill having a diameter of 300 μm such that between each of the holes there is a center-to-center distance of 250 μm (sample substrate B), and a substrate having 20 through holes formed in an epoxy substrate by using a router having a diameter of 500 μm, each hole having a cross-sectional shape with a combination of straight lines and arcs (sample substrate C).

Secondly, in each of the sample substrates A to C having different through holes formed therein, a metal layer was formed on the wall faces by carrying out an electroless copper plating process and an electrolytic copper plating process.

Thereafter, substrates having surfaces of the metal layer being subjected to an etching process to be adjusted to have any one of the surface roughness Ra of 0.05 μm, 0.08 μm, 0.4 μm, 1.1 μm, 2.5 μm, 2.8 μm, 3.2 μm, 4.7 μm, 5.3 μm and 6.2 μm were fabricated for each of the sample substrates A to C. Here, four substrates each for each type of substrate having the above-mentioned surface roughness were fabricated for each sample.

The surface roughness Ra was adjusted by changing the roughening time and the roughening temperature, and moreover, the surface roughness Ra was measured in compliance with JIS B 0601.

Finally, by the filling of the through holes with a resin composition and the curing thereof, the evaluation samples were completed.

With respect to the resin composition, the same resin composition was used as that used when forming an optical signal passing region in Example 1 of which an explanation will follow.

With respect to the resin composition filled into the through holes of each of the sample substrates fabricated, the filling property, the reliability at the time of temperature cycle tests, and the light transmitting property were evaluated. The results of the evaluation are shown below.

With respect to the filling property of the resin composition, in all the samples A to C in which the surface roughness Ra was set to 6.2 μm, unfilled portions and occurrence of voids were observed; however, in those substrates having the other surface roughness Ra, neither unfilled portions nor voids were observed.

Moreover, with respect to the reliability at the time of temperature cycle tests, in all the samples A to C in which the surface roughness Ra was set to 0.05 µm or 6.2 µm, separations or cracks in the resin composition were observed.

With respect to the sample substrates A to C in which the surface roughness Ra was set to 0.08 µm, and the sample substrate C in which the surface roughness Ra was set to 0.4 µm, 1.1 µm or 5.3 µm, separations or cracks in the resin composition were observed only at the time of the 1000 cycles test.

With respect to the other samples, neither separations nor cracks were observed in the resin composition.

Furthermore, with respect to the light transmitting property, all the sample substrates were capable of transmitting an optical signal having a speed of 2.5 Gbps.

Next, explanation for a case where the wall faces of the optical signal passing region are made of resin will be given below.

In this case also, an epoxy substrate with a sufficient size, having a thickness of 0.8 mm was prepared, and in this epoxy resin, a through hole, having the shape and surface roughness of which a explanation will follow, was formed, and moreover, a resin composition was filled into the through hole. Then, with respect to the through hole (optical signal passing region) filled with the resin composition, the filling property, the reliability at the time of temperature cycle tests and the light transmitting property of the resin composition were evaluated.

With respect to the evaluation sample, firstly, 24 of each of the following sample substrates were prepared; a substrate having five sets of through holes, one set consisting of four through holes, each hole formed in an epoxy substrate by using a drill having a diameter of 150 µm such that between each of the holes there is a center-to-center distance of 250 µm (sample substrate D), a substrate having 20 groups of through holes, each group consisting of a connection of a portion of the side faces of five through holes formed in an epoxy substrate by using a drill having a diameter of 300 µm such that between each of the holes there is a center-to-center distance of 250 µm (sample substrate E), and a substrate having 20 through holes formed in an epoxy substrate by using a router having a diameter of 500 µm, each hole having a cross-sectional shape with a combination of straight lines and arcs (sample substrate F).

Secondly, with respect to the sample substrates D to F respectively having different through holes formed therein, a resin composition having a refractive index of 1.51 after being cured was filled into each of the through holes, and cured therein. Thirdly, the through holes were formed again by a method such that the resin composition remained on the wall faces of each of the through holes, which is the same method as that described above.

Thereafter, four substrates, their surfaces of the resin layer being subjected to a polishing process of which is carried out by inserting a rod-shaped polishing grindstone having a predetermined size into each of the through holes so that the surfaces are adjusted to have any one of the surface roughness Ra of 0.09 µm, 0.15 µm, 0.3 µm, 2.4 µm, 4.0 µm and 6.5 µm, were fabricated with each of the sample substrates D to F.

Finally, by the filling the resin composition having a refractive index of 1.53 after being cured into the through holes and the curing thereof, the evaluation samples were completed. Here, the resin composition preliminarily filled into the through holes was able to function as a clad, while the through holes afterwards filled in with the resin composition was allowed to function as a core.

With respect to the method for adjusting the surface roughness Ra of the surface of the resin layer, other than the method of the application of the above-mentioned rod-shaped grindstone, methods such as a blasting process and a roughened surface forming method in which a roughened surface is formed by using particles dissolved by an organic solvent, the particles having been preliminarily mixed in a resin layer, and the like may be performed.

In the above-mentioned blasting process, for example, a mask is put on portions other than the openings of the through holes for an optical path, and by discharging particles or an aqueous solution containing particles onto the resin layer, a roughened surface can be formed.

Here, since the resin layer does not form an optical path, its sufficient diameter is in the range of about 0.1 µm to 20 µm when particles are mixed therein, and furthermore, the resin layer does not need to be transparent.

With respect to the resin composition filled into the through holes of each of the sample substrates fabricated, the filling property, the reliability at the time of temperature cycle tests, and the light transmitting property were evaluated. The results of the evaluation are shown below.

With respect to the filling property of the resin composition, in all the samples D to F in which the surface roughness Ra was set to 6.5 µm, unfilled portions and occurrence of voids were observed; however, in those substrates having the other surface roughness Ra, neither unfilled portions nor voids were observed.

Moreover, with respect to the reliability at the time of temperature cycle tests, in all the samples D to F in which the surface roughness Ra was set to 0.09 µm or 6.5 µm, separations or cracks were observed in the resin composition.

With respect to the sample substrates D to F in which the surface roughness Ra was set to 0.15 µm, separations or cracks in the resin composition were observed only at the time of the 1000 cycles test.

With respect to the other samples, neither separations nor cracks were observed in the resin composition.

Furthermore, with respect to the light transmitting property, all the sample substrates were capable of transmitting an optical signal having a speed of 2.5 Gbps.

As described above, in the substrate for mounting an IC chip according to the first aspect of the present invention, with respect to the wall faces of the optical signal passing region, it is desirable to set the surface roughness Ra in the above-mentioned range.

Moreover, the metal layer may be constituted by one layer, or may be constituted by two or more layers.

Next, explanation for a substrate for mounting an IC chip according to a second embodiment will be given below.

FIG. 3 shows a substrate for mounting an IC chip according to the second embodiment. FIG. 3 shows a substrate for mounting an IC chip in which: a solder resist layer is formed on the outermost layer; an optical signal passing region that penetrates through the solder resist layer is formed; and a microlens is arranged on an end portion of this optical signal passing region penetrating through the solder resist layer.

Except for the difference between the shape of the optical signal passing region, the structure of the substrate for mounting an IC chip according to the second embodiment, namely, the structure of a substrate for mounting an IC chip of the embodiment having the optical signal passing region of the individual through hole structure, is the same as that of the substrate for mounting an IC chip of the embodiment shown in FIG. 2. Therefore, detailed explanation for only the shape of the optical signal passing region will be given hereunder.

As shown in FIG. 3, in the substrate 220 for mounting an IC chip, four independent optical signal passing regions 242a to 242d are provided so as to penetrate through a substrate 221, an insulating layer 222 and a solder resist layer 234.

Portions of the optical signal passing regions 242a to 242d that penetrate through the substrate 221, the insulating layer 222 and the solder resist layer 234 are filled with a resin composition 247.

Moreover, the diameter of the portion that penetrates through the solder resist layer 234 is the same as that of the portions that penetrate through the substrate 221 and the insulating layer 222, and the shape of the longitudinal section of the portion penetrating through the solder resist layer 234 is a rectangular shape.

On one face of the substrate 220 for mounting an IC chip, a four-channel light receiving element 239 is surface-mounted with a solder connecting portion 244 such that each of the light receiving portions 239a to 239d confront each of the optical signal passing regions 242a to 242d, respectively.

Therefore, an input signal to the four-channel light receiving element 239 can be transmitted via any of the optical signal passing regions 242a to 242d. Here, the respective optical signal passing regions are individually formed in an independent manner so as to be able to transmit optical signals from the light receiving portions 239a to 239d of the four-channel light receiving element.

The portions of the optical signal passing regions 242a to 242d penetrating through the solder resist layer 234 may be filled with a resin composition as shown in FIG. 3, or may be formed by a vacancy. Moreover, a metal layer may be formed on the periphery of the portions of the optical signal passing regions 242a to 242d that penetrate through the substrate 221 and the insulating layer 222.

As a material and the like in the case where the metal layer is formed, the same material and the like described in the first embodiment may be used.

Moreover, microlenses 246a to 246d are arranged on end portions of the optical signal passing regions 242a to 242d on an opposite side from a side on which the light receiving element 239 is mounted.

Therefore, an optical signal to the light receiving element 239 can pass through the microlenses 246a to 246d. By thus arranging the microlenses 246a to 246d on each of the end portions of the optical signal passing regions 242a to 242d respectively, the transmission loss of the optical signal can be suppressed.

The microlenses 246a to 246d are directly arranged on a resin composition 247 formed on portions of the optical signal passing regions 242a to 242d that penetrate through the substrate 221, the insulating layer 222 and the solder resist layer 234.

As an alternative of the microlenses 246a to 246d, a microlens array having four lenses placed in parallel with one another may be arranged with an adhesive.

Moreover, when the microlenses are directly arranged, it is desirable that the microlenses are arranged directly on the end portions of the optical signal passing regions that have been subjected to water-repellent treatment or hydrophilic treatment.

Furthermore, with respect to the size of each of the optical signal passing regions, it is desirable that a cross section of the optical signal passing region has a lower diameter limit of 100 µm, and also an upper diameter limit of 500 µm. If the diameter is less than 100 µm, an optical path may be blocked, and the filling of the optical signal passing regions with an uncured resin composition may also become difficult. On the other hand, even if the diameter is greater than 500 µm, the transmitting property of an optical signal is not sufficiently improved, and the design freedom of conductor circuits and the like that constitute the substrate for mounting an IC chip tends to be inhibited.

It is more desirable that the lower diameter limit is 250 µm, and also that the upper diameter limit is 350 µm. This is because both the transmitting property of an optical signal and the design freedom are sufficiently improved thereby, and no problems are caused at the time of the filling of the uncured resin composition.

Here, the diameter of the cross section of a portion of the optical signal passing region that penetrates through the substrate and the insulating layer refers to: the diameter of the cross section of a column shaped optical signal passing region, the major diameter of the cross section of a elliptical column shaped region, and the length of the longest portion of the cross section of a square pillar shaped or a polygonal pillar shaped region, and moreover, the diameter of the cross section on the light-entering end side of a optical signal passing region of which the diameter of the cross section is not constant from the light-entering end side towards the light-emission end side.

Moreover, in the present invention, the cross section of the optical signal passing region refers to a cross section in a direction in parallel with the main face of the substrate for mounting an IC chip, and the longitudinal section of the optical signal passing region refers to a cross section in a direction perpendicular to the main face.

In also the substrate 220 for mounting an IC chip having the above-mentioned configuration, an optical signal transmitted via an external optical part (an optical fiber, an optical waveguide and the like) is further transmitted to the light receiving element 239 (light receiving portion 239a) via the microlenses 246a to 246d and the optical signal passing region 242, and after being converted to an electric signal by the light receiving element 239, the resulting signal is sent to the IC chip 240 via the solder connecting portion 244, the conductor circuit 224, the via hole 227 and the like, and processed therein.

Moreover, also at the time of forming an optical signal passing region with the above-mentioned individual through hole structure, it is desirable that a size of the optical signal passing region is such that light emitted from the light emitting element, and light that enters the light receiving element are not reflected.

Therefore, a desirable cross-sectional shape for the optical signal passing region of the individual through hole structure was examined.

The substrate for mounting an IC chip that was examined was provided with light emitting elements in which: the optical element was a four channel VCSEL element having a spreading angle of 24 degrees; the optical signal passing region was filled with a resin composition having a refractive index of 1.5; and inserted into a lower portion of the optical element, underfill having a refractive index of 1.5.

The results of the examination indicate that in the substrate for mounting an IC chip having the above-mentioned mode, when the substrate for mounting an IC chip has the thickness of 0.4 mm and the VCSEL element has a channel-to-channel distance of 250 µm for example, the optical signal passing region of an individual through hole structure should have a diameter of 150 µm or more to be able to transmit an optical signal without causing reflection on the wall faces of the optical signal passing region, and when the substrate for mounting an IC chip has the thickness of 1.2 mm and the VCSEL element has a channel-to-channel distance of 500 μm for example, the optical signal passing region of an individual through hole structure should have a diameter of 400 μm or more to be able to transmit an optical signal without causing reflection to the wall faces of the optical signal passing region.

In the substrate for mounting an IC chip according to the first aspect of the present invention, the transmission distance of the electric signal becomes short since the light receiving element that conducts the optical/electric signal conversion is mounted at a position close to the IC chip, and thus excellent reliability in the signal transmission can be provided and high-speed communication can also be achieved.

In also the substrate for mounting an IC chip according to this embodiment, the diameter of each of the microlenses arranged on the end portion of each of the optical signal passing regions is appropriately determined depending on the pitch between each of the respective channels in the array element, and for example, when an array element having a pitch of 250 μm is used, it is desirable that the diameter is in the range of 100 to 190 μm. In this case, it is desirable that the diameter of each of the optical signal passing regions is in the range of 150 to 200 μm. Furthermore, for example, when an array element having a pitch of 500 μm is used, it is desirable that the diameter is desirably in the range of 100 to 490 μm, and more desirably in the range of 180 to 480 μm. In this case, it is desirable that the diameter of each of the optical signal passing regions is in the range of 150 to 450 μm.

Moreover, the reason why it is desirable for each of the individually formed optical signal passing regions to have the diameter of 150 μm or more is explained below.

Namely, the optical signal passing regions of the above-mentioned embodiment are formed through processes in which, after forming through holes that penetrate through the substrate, the insulating layer and the solder resist layer, the through holes are filled with a resin composition according to need, and a process for forming the through holes normally uses a drill, and when the through holes are formed by using a drilling process, it is difficult to form through holes having the diameter less than 150 μm.

Moreover, the shape of each of the optical signal passing regions having the individual through hole structure include, for example, a column shape, a rectangular pillar shape, an elliptical column shape, a pillar shape with a bottom face consisting of straight lines and arcs, and the like.

Next, explanation for a substrate for mounting an IC chip according to a third embodiment will be given below.

FIG. 4 shows a substrate for mounting an IC chip according to the third embodiment. FIG. 4 shows a substrate for mounting an IC chip in which: a solder resist layer is formed on the outermost layer; an optical signal passing region that penetrates through the solder resist layer is formed; and a microlens is arranged on an end portion of this optical signal passing region penetrating through the solder resist layer.

As shown in FIG. 4, a substrate 320 for mounting an IC chip has a structure in which both a conductor circuit 324 and an insulating layer 322 are laminated on both faces of a substrate 321, and the conductor circuits with the substrate 321 interposed there between and the conductor circuits with the insulating layer 322 interposed there between are electrically connected by plated through holes 329 and via holes 327, respectively. Moreover, a solder resist layer 334 is formed on the outermost layer.

Furthermore, in the substrate for mounting an IC chip 320, an optical signal passing region 342 having a concave shape is formed. In this optical signal passing region 342, a four-channel light receiving element 339 and an IC chip 340 are respectively mounted with wire bonding 349, and a part of the optical signal passing region 342 is filled with a resin composition 347.

Moreover, solder bumps 337 are formed on the solder resist layer 334 on the side on which the optical signal passing region is formed.

Here, the IC chip may be mounted on the surface opposite from the side on which the optical signal passing region is formed.

Accordingly, an input signal to the four-channel light receiving element 339 can be transmitted via the optical signal passing region 342. Here, the optical signal passing region 342 having a size that can sufficiently transmit four-channel optical signals, is formed, with a concave shape, in a part of the insulating layer 322 and the solder resist layer 334.

Here, as shown in FIG. 4, the portion of the optical signal passing region 342 that penetrates through the solder resist layer 334 may be filled with a resin composition or may be formed by a vacancy.

Moreover, microlenses 246a to 246d are arranged on end

Moreover, microlenses 346a to 346d are arranged on an end portion of the optical signal passing region 342 on a opposite side from a side on which the light receiving element 339 is mounted. Here, each of the microlenses 346a to 346d are individually placed to correspond to each of the channels 339a to 339d of the light receiving element 339, respectively.

Accordingly, an optical signal to the light receiving element 339 passes through each of the microlenses 346a to 346d. By arranging the microlenses 346a to 346d on one end of the optical signal passing region 342, it becomes possible to reduce a transmission loss in the optical signal.

The microlenses 346a to 346d are directly arranged on the resin composition 347 injected to the optical signal passing region 342.

Here, as an alternative the microlenses 346a to 346d, a microlens array having four lenses placed thereon in parallel with each other may be arranged with an adhesive.

In also the substrate 320 for mounting an IC chip having the above-mentioned configuration, an optical signal transmitted via an external optical part (an optical fiber, an optical waveguide and the like) is further transmitted to the light receiving element 339 (light receiving portion 339a) via the microlenses 346a to 346d and the optical signal passing region 342, and after being converted to an electric signal by the light receiving element 339, the resulting signal is sent to the IC chip 340 via the wire bonding 349, the conductor circuit 324, the via holes 327 and the like, and processed therein.

In the substrate for mounting an IC chip according to the first aspect of the present invention, the transmission distance of the electric signal becomes short since the light receiving element that conducts the optical/electric signal conversion is mounted at a position close to the IC chip, and thus excellent reliability in the signal transmission can be provided and high-speed communication can also be achieved.

Moreover, in the substrate 320 for mounting an IC chip, since the solder bumps 337 are formed on the solder resist layer 334 with a metal plating layer, the transmission of the electric signal between the IC chip 340 and the external substrate and the like can also be carried out via the solder bumps 337.

When the solder bumps are thus formed, the substrate for mounting an IC chip can be connected to an external substrate, such as a substrate for a motherboard and the like, via the solder bumps, and in this case, the substrate for mounting an IC chip can be placed at a predetermined position by a self-alignment function of the solder.

Moreover, the shape of the optical signal passing region having the above-mentioned concave shape include, for example, a column shape, a rectangular pillar shape, an elliptical column shape, a shape in which plural columns are placed in parallel with each other with portions of side surfaces of the adjacent columns connected to each other, a pillar shape with a bottom face consisting of straight lines and arcs, and the like.

Furthermore, it is desirable that the area of the cross section of the optical signal passing region having the concave shape is 100 mm² or more, and more desirably, 200 mm² or more. In this size, an optical signal can be transmitted without being reflected on wall faces of the optical signal passing region.

Moreover, in the substrate 320 for mounting an IC chip shown in FIG. 4, the light receiving element 339 and the IC chip 340, mounted inside the optical signal passing region 342 having the concave shape, are connected to conductor circuits exposed to the bottom face of the concave portion by wire bonding 349 respectively; however, in the substrate for mounting an IC chip according to the third embodiment, a light receiving element and the like mounted inside the optical signal passing region having the concave shape may be connected by wire bonding to a conductor circuit and the like formed on the outermost layer of an inter layer resin insulating layer.

In the substrates for mounting an IC chip according to the first to third embodiments described above, an optical element mounted on the substrate for mounting an IC chip has been described as a light receiving element. However, in the substrate for mounting an IC chip according to the above-mentioned embodiment, a light emitting element may be mounted thereon as the optical element in place of the light receiving element. In this case, the structure of the substrate for mounting an IC chip may be the same as the above-mentioned structure except that the light receiving element is replaced by a light emitting element.

Moreover, on the IC chip mounting substrate according to the first aspect of the present invention, as shown in FIG. 5, both the light emitting element and the light receiving element may be mounted as optical elements.

As shown in FIG. 5, in a substrate 420 for mounting an IC chip, each of a conductor circuit 424 and an insulating layer 422 are laminated on both faces of a substrate 421, and the conductor circuits with the substrate 421 interposed there between and the conductor circuits with the insulating layer 422 interposed there between are electrically connected by plated through holes 429 and via holes 427, respectively. Moreover, a solder resist layer 434 is formed on the outermost layer.

Furthermore, in the substrate 420 for mounting an IC chip, an optical signal passing region 442 is provided so as to penetrate through the substrate 421, the insulating layer 422 and the solder resist layer 434.

In this optical signal passing region 442, a portion that penetrates through the substrate 421, the insulating layer 422 and the solder resist layer 434 is filled with a resin composition 447, and on the periphery of the portion that penetrates through the substrate 421 and the insulating layer 422 of the resin composition 447, a metal layer 445 is formed.

Moreover, the diameter of the portion that penetrates through the solder resist layer 434 is the same diameter as the portion that penetrates through the substrate 421 and the insulating layer 422, and the shape of the longitudinal section of the portion penetrating through the solder resist layer 434 is a rectangular shape.

Therefore, an input/output signal of an optical element (a light emitting element 438 and a light receiving element 439) mounted on the substrate 420 for mounting an IC chip is transmitted via the optical signal passing region 442.

Here, as shown in FIG. 5, the portion of the optical signal passing region 442 that penetrates through the solder resist layer 434 may be filled with a resin composition or may be formed by a vacancy. Moreover, it is not necessary to form a metal layer 445 on the periphery of the portion of the optical signal passing region 442 that penetrates through the substrate 421 and the insulating layer 422.

On end portions the opposite side from which the optical element (the light emitting element 438, the light receiving element 439) on the optical signal passing region 442 is mounted, microlenses 446a and 446b are arranged.

Accordingly, an optical signal that enters the optical signal passing region 442 and an optical signal emitted from the optical signal passing region 442 passes through the microlenses 446a and 446b.

By thus arranging the microlenses 446a and 446b on end portions of the optical signal passing region 442, a transmission loss in the optical signal can be reduced.

Furthermore, the microlenses 446a and 446b are directly arranged on a resin composition 447 formed on portions of the optical signal passing region 442 that penetrate through the substrate 421, the insulating layer 422 and the solder resist layer 434.

On one face of the substrate 420 for mounting an IC chip, the light emitting element 438 and the light receiving element 439 are surface-mounted with a solder connecting portion 444 such that the light emitting portion 438a and the light receiving portion 438b face the optical signal passing region 442 respectively, and an IC chip 440 is also surface-mounted with a solder connecting portion 443. Moreover, on a solder resist layer 434 located on the other face of the substrate 420 for mounting an IC chip, solder bumps 437 are formed.

Furthermore, after an electric signal emitted from the IC chip 440 is sent to the light emitting element 438 via the solder connecting portions 443 and 444, conductor circuits 424, via holes 427, plated through holes 429 and the like, it is converted to an optical signal by the light emitting element 438, and the optical signal transmitted from the light emitting element 438 (light emitting portion 438a) is sent to an external optical element (an optical fiber, an optical waveguide and the like) via the optical signal passing region 442 and the microlens 446a.

In the substrate 420 for mounting an IC chip having such configuration, an optical signal sent from the outside via the optical fiber, the optical waveguide and the like (not shown in the figure) is received by the light receiving element 439 (light receiving portion 439a) via the microlens 446b and the optical signal passing region 442, and then converted to an electric signal by the light receiving element 439, and further transmitted to the IC chip 440 via the solder connecting portions 443 and 444, conductor circuits 424, via holes 427, plated through holes 429 and the like.

Furthermore, the transmission distance of the electric signal becomes short since the light receiving element and the light emitting element that conducts the optical/electric signal conversion is mounted at a position close to the IC chip, and thus excellent reliability in the signal transmission can be provided and high-speed communication can also be achieved.

Moreover, in the substrate 420 for mounting an IC chip, since the solder bumps 437 are formed on the solder resist layer 434 with a metal plating layer, an electric signal sent from the IC chip converted to an optical signal as described above is not only transmitted to an external substrate and the like via the optical signal passing region 442 and the like, but also is transmitted to an external substrate and the like via the solder bumps 437.

When the solder bumps are thus formed, the substrate for mounting an IC chip can be connected to an external substrate, such as a substrate for a motherboard and the like, via the solder bumps, and in this case, the substrate for mounting an IC chip can be placed at a predetermined position by a self-alignment function of the solder.

FIG. 5 shows the substrate for mounting an IC chip with a one channel light emitting element and a one channel light receiving element mounted thereon; however, multichannel optical elements may also be mounted on a substrate for mounting an IC chip with both the light emitting element and the light receiving element mounted thereon.

Moreover, when a multichannel optical element is mounted, the structure of the optical signal passing region may be either the batch through hole structure or the individual through hole structure.

Furthermore, the light receiving element and the light emitting element may be mounted on a substrate for mounting an IC chip having an optical signal passing region having a concave shape.

The substrate for mounting an IC chip according to the first aspect of the present invention having such configuration can be manufactured by, for example, a manufacturing method of a substrate for mounting an IC chip according to the sixth aspect of the present invention.

Explanation for the manufacturing method of a substrate for mounting an IC chip according to the sixth aspect of the present invention will be given below.

The manufacturing method of a substrate for mounting an IC chip according to the sixth aspect of the present invention comprises:
(a) a multilayer wiring board manufacturing step of sequentially laminating a conductor circuit and an insulating layer on both faces of a substrate to form a multilayer wiring board;
(b) an optical signal passing region forming step of forming an optical signal passing region that penetrates through the multilayer wiring board or forming an optical signal passing region having a concave shape on a portion of the multilayer wiring board; and
(c) a microlens arranging step of arranging a microlens on an end portion of the optical signal passing region.

Since the manufacturing method of the substrate for mounting an IC chip according to the sixth aspect of the present invention comprises the step of forming the optical signal passing region and the step of arranging the microlens on the end portion of the optical signal passing region, it is able to suitably manufacture the substrate for mounting an IC chip according to the first aspect of the present invention, that is, the substrate for mounting an IC chip that transmits an input/output signal of an optical element via the optical signal passing region. Therefore, the use of the manufacturing method according to the sixth aspect of the present invention makes it possible to manufacture a substrate for mounting an IC chip having excellent transmitting property of an optical signal.

Firstly, the above-mentioned step (a), that is, the multilayer wiring board manufacturing step of forming a multilayer wiring board will be described in the order of processes. More specifically, for example, the multilayer wiring board can be manufactured through, the following processes (1) to (9).

(1) By using an insulating substrate as a starting material, a conductor circuit is formed on the insulating substrate. The insulating substrate include, for example, a glass epoxy substrate, a polyester substrate, a polyimide substrate, a bismaleimide-triazine (BT) resin substrate, a thermosetting polyphenylene ether substrate, a copper-clad laminate, an RCC substrate, and the like.

Moreover, a ceramic substrate such as an aluminum nitride substrate and the like, a silicon substrate, a glass substrate and the like may be used.

The conductor circuit can be, for example, formed by processes in which after a solid conductor layer has been formed on the surface of the insulating substrate by an electroless plating process and the like, the resulting layer is subjected to an etching process. Furthermore, it may also be formed by carrying out an etching process on a copper-clad laminate or an RCC substrate.

Moreover, when the conductor circuits with the insulating substrate interposed there between are connected to each other by plated through holes, after through holes for a plated through hole have been formed in the insulating substrate by using, for example, a drill, a laser and the like, the plated through holes are formed by carrying out an electroless plating process and the like thereon. Here, the through holes for a plated through hole normally has a diameter in the range of 100 μm to 300 μm. Furthermore, when the plated through holes are formed, it is desirable that the plated through holes are filled with a resin filler.

(2) Nextly, according to need, the surface of the conductor circuit is subjected to roughening treatment.

The roughening treatment include, for example blackening (oxidation)/reduction treatment, etching treatment using an etching solution containing a cupric complex and an organic acid salt, treatment by the use of Cu—Ni—P needle alloy plating, and the like.

Herein, when the roughened surface is formed, normally, it is desirable that the roughened surface has the average roughness of a lower limit value of 0.1 μm, and also an upper limit value of 5 μm. When adhesion between the conductor circuit and the insulating layer, and influences to the electric signal transmission performance of the conductor circuit, and the like are taken into consideration, it is more desirable that the lower limit value of the average roughness is 2 μm, and the upper limit thereof is 4 μm.

This roughening treatment is carried out before the filling of a resin filler into the plated through holes, and the roughened surface may also be formed on the wall faces of the plated through holes, thereby improving the adhesion between the plated through holes.

(3) Nextly, the following resin layers can be formed on the substrate on which the conductor circuit has been formed; an uncured resin layer made of a thermosetting resin, a photosensitive resin or a resin prepared by adding a photosensitive group to a part of thermosetting resin, or made of a resin composite containing any one of these resins and a thermoplastic resin; or a resin layer made of a thermosetting resin. Here, at the time of forming these resin layers, for example, the same resin as the resin to be used for the substrate may be used.

The above-mentioned uncured resin layer may be formed by applying an uncured resin by using a roll coater, a curtain coater and the like, or may be formed by a thermal contact-bonding of an uncured (semi-cured) resin film.

Moreover, the resin layer made of the thermoplastic resin can be prepared by thermally contact-bonding a resin molded body formed into a film shape.

Among these methods, it is desirable that the method of thermally contact-bonding an uncured (semi-cured) resin film used, and the contact-bonding process of the resin film can be carried out by using, for example, a vacuum laminator and the like.

Here, although the contact-bonding conditions are not particularly limited, and the appropriate condition may be selected by taking the composition of the resin film and the like into consideration, it is desirable that it is normally under the following conditions: a pressure in the range of 0.25 MPa to 1.0 MPa; a temperature in the range of 40 degrees to 70 degrees; a degree of vacuum in the range of 13 Pa to 1300 Pa; and process time from 10 to 120 seconds.

The thermosetting resin include, for example, epoxy resin, phenol resin, polyimide resin, polyester resin, bismaleimide resin, polyolefin resin, polyphenylene ether resin, polyphenylene resin, fluororesin and the like.

Specific examples of the epoxy resin include, for example, novolak-type epoxy resins such as phenol novolak-type resin, cresol novolak-type resin and the like; and alicyclic epoxy resins that are dicyclopentadiene-modified; and the like.

The photosensitive resin include, for example, acrylic resins and the like.

The resin prepared by adding a photosensitive group to a part of a thermosetting resin include, for example, resins prepared by allowing a thermosetting group of the above-mentioned thermosetting resin to be acrylated with methacrylic acid or acrylic acid, and the like.

The thermoplastic resin include, for example, phenoxy resin, polyether sulfone (PES), polysulfone (PSF), polyphenylene sulfone (PPS), polyphenylene sulfide (PPES), polyphenylene ether (PPE), polyether imide (PI), and the like.

Moreover, the above-mentioned resin composite is not particularly limited as long as it contains a thermosetting resin or a photosensitive resin (including a resin formed by adding a photosensitive group to a part of a thermosetting resin) and a thermoplastic resin, and the specific combination of the thermosetting resin and the thermoplastic resin include, for example, phenol resin/polyether sulfone, polyimide resin/polysulfone, epoxy resin/polyether sulfone, epoxy resin/phenoxy resin, and the like. The specific combination of the photosensitive resin and the thermoplastic resin include, for example, acrylic resin/phenoxy resin, epoxy resin with a part of the epoxy group being acrylated/polyether sulfone, and the like. Here, the above-mentioned resin layer may be constituted by different resin layers of two layers or more.

Furthermore, the above-mentioned resin layer may be formed by using a resin composition for forming a roughened surface.

The resin composition for forming a roughened surface refers to, for example, a resin composition prepared by dispersing a substance that is soluble to a roughening solution made of at least one material selected from the group consisting of an acid, an alkali and an oxidizing agent to an uncured heat-resistant resin matrix that is hardly soluble to a roughening solution made of at least one material selected from the group consisting of an acid, an alkali and an oxidizing agent.

Here, with respect to the above-mentioned terms "hardly soluble" and "soluble", when the same time immersion is carried out in the same roughening solution, those compositions that have a relatively high dissolving rate are referred to as "soluble" compositions for convenience of explanation, and those that have a relatively low dissolving rate are referred to as "hardly soluble" compositions for convenience of explanation.

(4) Nextly, when forming an insulating layer using a thermosetting resin or a resin composite as its material, the insulating layer is prepared by subjecting the uncured resin insulating layer to a curing process, and forming an opening for a via hole therein. In this process, according to need, a through hole for a plated through hole may be formed.

It is desirable that the opening for a via hole is formed through laser treatment. When a photosensitive resin is used as the material for the insulating layer, the opening may be formed through exposing and developing treatments.

Moreover, when forming an insulating layer using a thermoplastic resin as its material, the insulating layer is prepared by forming an opening for a via hole in a resin layer made of a thermoplastic resin. In this case, the opening for a via hole can be formed by using laser treatment.

When a through hole for a plated through hole is formed in this process, the through hole for a plated through hole may be formed by using a drill machining process, laser treatment and the like.

A laser used for the laser treatment include, for example, a carbon dioxide gas laser, an ultraviolet-ray laser, an excimer laser and the like. Among these, it is desirable that an excimer laser and a short pulse carbon dioxide laser are used.

(5) Nextly, a conductor circuit is formed on the surface of the insulating layer including the inner wall of the opening for a via hole.

At the time of forming the conductor circuit, firstly, a thin-film conductor layer is formed on the surface of the insulating layer. The thin-film conductor layer can be formed by using a method such as an electroless plating method, a sputtering method and the like.

The material for the thin-film conductor layer include, for example, copper, nickel, tin, zinc, cobalt, thallium, lead and the like.

Among these, it is desirable that copper and an alloy made of copper and nickel are used since these are excellent in electric properties, economical efficiency and the like.

When the thin-film conductor layer is formed by using the electroless plating method, it is desirable that the thickness of the thin-film conductor layer, has the lower limit thickness of 0.3 µm, and the upper limit being 2.0 µm. It is more desirable that the lower limit is 0.6 µm, and the upper limit is 1.2 µm. Moreover, when it is formed by using the sputtering method, it is desirable that the thickness is in the range of 0.1 µm to 1.0 µm.

Moreover, before forming the thin-film conductor layer, a roughened surface may be prepared on the surface of the insulating layer. By forming the roughened surface, it becomes possible to improve the adhesion between the insulating layer and the thin-film conductor layer. In particular, when the insulating layer is formed by using a resin composition for forming a roughened surface, it is desirable that the roughened surface is formed by using an acid, an oxidizing agent and the like.

Moreover, when the through hole for a plated through hole is formed in the above-mentioned step (4), at the time of forming the thin-film conductor layer on the insulating layer, the thin-film conductor layer may also be formed on the wall face of the through hole so as to prepare the plated through hole.

(6) Nextly, plating resist is formed on a part of the insulating layer having a surface on which the thin-film conductor layer is formed.

The plating resist may be formed, for example, by subjecting a photosensitive dry film and a photomask to exposing and developing treatments after the photosensitive dry film is affixed on the insulting layer, and the photomask, made of a glass substrate and the like on which a plating resist pattern is drawn, is arranged such that it is made in contact with the photosensitive dry film.

(7) Thereafter, by using the thin-film conductor layer as a plating lead, an electroplating process is carried out, and an electroplating layer is formed on a portion on which the plating resist was not formed. As of the electroplating, it is desirable that copper plating is used.

Moreover, it is desirable that the electroplating layer is in the range of 5 μm to 20 μm in thickness.

Thereafter, by removing the plating resist and the thin-film conductor layer below the plating resist, a conductor circuit (including via holes) can be formed.

The removing of the plating resist may be carried out by using, for example, an aqueous alkali solution and the like, and the removing of the thin-film conductor layer may be carried out by using a mixed solution of sulfuric acid and hydrogen peroxide, or an etching solution such as sodium persulfate, ammonium persulfate, ferric chloride, cupric chloride and the like.

Moreover, after the conductor circuit has been formed, the catalyst on the insulating layer may be removed by using an acid or an oxidizing agent according to need. Such means can prevent degradation in electric properties.

Moreover, after this plating resist has been formed, as an alternative of the method for forming the electroplating layer (processes (6) and (7)), a conductor circuit may be formed by using a method in which, after forming an electroplating layer over the entire surface of the thin-film conductor layer, etching treatment is carried out thereon.

When a plated through hole is formed in the above-mentioned processes (4) and (5), the plated through hole may be filled with a resin filler.

When the resin filler is filled into the plated through hole, according to need, a lid plating layer that covers the surface layer portion of the resin filler layer may be formed by carrying out an electroless plating process and the like.

(8) When the lid plating layer has been formed, roughening treatment is carried out on the surface of the lid plating layer, and by further repeating the above-mentioned processes (3) and (4) according to need, an insulating layer is formed. In this process, the plated through hole may either be formed or not.

(9) Furthermore, by repeating the processes of (5) to (8) according to need, the conductor circuit and the insulating layer may be laminated.

By carrying out the processes of (1) to (9), a multilayer wiring board in which a conductor circuit and an insulating layer are laminated on both faces of a substrate can be manufactured.

Additionally, although the manufacturing method of the multilayer wiring board described above in detail is a semi-additive method, the manufacturing method of the multilayer wiring board manufactured through the above-mentioned step (a) is not intended to be limited by the semi-additive method, and may be carried out by using a method such as a full-additive method, a subtractive method, a batch lamination method, a conformal method and the like.

Moreover, although the method in which an insulating layer is formed by using a thermosetting resin, a photosensitive resin or a resin prepared by adding a photosensitive group to a part of thermosetting resin, or formed by using a resin composite containing any one of these resins and a thermoplastic resin has been given in the foregoing explanation, the materials of the insulating layer are not intended to be limited by these, and for example, insulating materials such as ceramics, silicon, glass and the like may be used.

In a manufacturing method of a substrate for mounting an IC chip according to the sixth aspect of the present invention, after the multilayer wiring board has been manufactured through the above-mentioned step (a), the above-mentioned step (b), that is, an optical signal passing region forming step of forming an optical signal passing region that penetrates through the multilayer wiring board, or forming an optical signal passing region having a concave shape on a portion of the multilayer wiring board, is carried out.

Here, the through hole and the concave portion that function as the optical signal passing region to be formed in this process are herein after also referred to as a through hole for an optical path and a concave portion for an optical path, respectively.

Firstly, the through hole for an optical path or the concave portion for an optical path is formed in the multilayer wiring board fabricated through the above-mentioned processes.

The above-mentioned through hole for an optical path and concave portion for an optical path are formed by, for example, a drill machining process, a router machining process, laser treatment, a die machining process and the like.

The laser to be used for the laser treatment may be the same laser as that used for forming the opening for a via hole, and the like.

The formation positions of the through hole for an optical path is not particularly limited, and the appropriate positions may be determined by taking a design of the conductor circuit and mounting positions of the IC chip, optical elements and the like into consideration.

It is desirable that the through hole for an optical path is formed for each optical element such as a light receiving element, a light emitting element and the like, or may be formed for each signal wavelength.

Moreover, it is desirable that the concave portion for an optical path is formed such that, in addition to the optical elements such as the light receiving element and light emitting element and the like, an IC chip can be mounted therein.

When the concave portion for an optical path is formed, at the time of forming insulating layers in the process for fabricating the multilayer wiring board, an opening that penetrates through each insulating layer is formed, so that the concave portion for an optical path is formed at the time of completing the lamination of the insulating layers.

Here, although the opening that penetrates through the insulating layer may be formed by the same method as the method for forming the opening for a via hole, it is desirable that the opening is formed by a drill machining process.

Moreover, when a through hole for an optical path having the shape in which a portion of the wall faces of plural columns are connected to each other is formed as the through hole for an optical path having a batch through hole structure in this process, it is desirable that the following method is used:

Namely, it is desirable that columns that are not adjacent to each other are first formed, and there between, columns are formed such that a portion of the side faces thereof are connected to the side faces of the non-adjacent columns. Therefore, when the through hole for an optical path having the shape in which a portion of the wall faces of plural columns are connected to each other is formed, it is desirable that the number of columns is an odd number.

This configuration is made because, in an attempt to continuously form adjacent columns with portions of the side faces thereof being connected to each other, the tip end of a drill tends to blur toward the column that has already been formed, causing degradation in precision during the drill machining process. When such degradation in precision during the drill machining process occurs, the size of the bottom face of the columns tends to deviate greatly between each column.

In the substrate for mounting an IC chip, due to its designing limitation, the area of a space between the pad (electrode) for mounting an optical element and the through hole for an optical path that functions as an optical signal passing region is small, and therefore, at the time of forming the through hole for an optical path when the position of the through hole deviates or when the through hole is formed greater than the designed size, the through hole may be formed over the pad portion to cause the pad to come off and to reduce the area of the pad.

When the pad comes off, poor connection to the optical element occurs, and when the pad area is reduced, the self-alignment function is not sufficiently exerted, causing a deviation in the mounting position of the optical element, and such deviation in the mounting position of the optical element tends to cause an increase in transmission loss in optical signals.

Accordingly, at the time of forming a through hole for an optical path with the shape in which a portion of the side faces of the adjacent columns are connected to each other, it is desirable that the through hole is formed through the above-mentioned method.

Moreover, tests so as to examine the relationship between the formation order of through hole at the time of forming the through hole for an optical path with the shape in which a portion of the side faces of the adjacent columns are connected to each other, and the positional deviations of the through hole have been carried out by the present inventors, therefore referring to FIG. 20-1, explanation on the tests will be given, and the resulting data will also be shown below. Here, a through hole for an optical path that can be optically connected to a four channel optical element was formed and examined.

FIGS. 20-1A to 20-1D are schematic diagrams that illustrate the method of tests for examining the relationship between the formation order of the through holes and the positional deviations of the through holes.

First, four epoxy substrates having a sufficient size and a thickness of 0.8 mm were prepared, and through holes having the following shape were formed in these epoxy substrates. Thereafter, the hole diameter and the amount of a positional deviation of each of the through holes thus formed were measured.

Here, the hole diameter was observed by using a measuring microscope, from a side of the surface of the epoxy substrate of which the drilling process is to be carried out, and by subjecting the observed hole to a three-point plotting method, the diameter of a hypothetic circle based on the method was measured, the measured value defined as the hole diameter of the through hole.

Moreover, with respect to the positional deviation of the through hole, the amount of positional deviation of the through hole was defined as the greatest value of an amount of deviation between the designed center position and the actual center position, the designed center position being determined based on the position of a through hole firstly formed, of the through holes other than the firstly formed through hole.

Firstly, on the first epoxy substrate, by using a drill having a diameter of 300 μm, five through holes were formed in the order indicated by numbers shown in FIG. 20-1A, such that between each of the holes there is a center-to-center distance of 250 μm. Here, five groups of those through holes with portions of side faces thereof being connected to each other were formed.

As a result, the average hole diameter was 298.2 μm (standard deviation σ: 4.1 μm), and the greatest amount of positional deviation was 8.4 μm.

Secondly, on the second epoxy substrate, by using a drill having a diameter of 300 μm, five through holes were formed in the order indicated by numbers shown in FIG. 20-1B, such that between each of the holes there is a center-to-center distance of 250 μm. Here, five groups of those through holes with portions of side faces thereof being connected to each other were formed.

As a result, the average hole diameter was 298.52 μm (standard deviation σ: 4.3 μm), and the greatest amount of positional deviation was 7.3 μm.

Thirdly, on the third epoxy substrate, by using a drill having a diameter of 300 μm, four through holes were formed in the order indicated by numbers shown in FIG. 20-1C, such that between each of the holes there is a center-to-center distance of 250 μm. Here, five groups of those through holes with portions of side faces thereof being connected to each other were formed.

As a result, the average hole diameter was 301.4 μm (standard deviation σ: 6.3 μm), and the greatest amount of positional deviation was 17.9 μm.

Moreover, on the fourth epoxy substrate serving as a comparative object, by using a drill having a diameter of 150 μm, five through holes were formed in the order indicated by numbers shown in FIG. 20-1D, such that between each of the holes there is a center-to-center distance of 250 μm. In this case, five independent through holes were formed, and with these five through holes as one group of through holes, five of the groups of through holes were formed.

As a result, the average hole diameter was 148.6 μm (standard deviation σ: 3.9 μm), and the greatest amount of positional deviation was 7.4 μm.

The results of these tests indicate that, comparing the case when through holes that are not adjacent to each other were first formed, and there between, columns are formed such that a portion of the side faces thereof are connected to the side faces of the non-adjacent columns to the case when the independent through holes were formed, there was not so much difference between the standard deviation of the average hole diameter and the greatest amount of positional deviation, and in contrast, there was a great difference between the standard deviation of the average hole diameter and the greatest amount of positional deviation when adjacent through holes were continuously formed, and furthermore, the average hole diameter itself became greater compared to the case when through holes that are not adjacent to each other were first formed, and there between, columns are formed such that a portion of the side faces thereof are connected to the side faces of the non-adjacent columns.

Moreover, a brief explanation for the difference between batch through hole structures with other shapes and the above-mentioned shape will also be given below.

FIGS. 20-2E and 20-2F are schematic diagrams that illustrate an optical path for optical signal transmission having a batch through hole structure.

The batch through hole structure, as described above, can be a column shape, a rectangular pillar shape, an elliptical column shape, a pillar shape with a bottom face consisting of straight lines and arcs, a shape in which plural columns are placed in parallel with one another with a portion of the side faces of the adjacent columns being connected to each other (see FIGS. 20-1A to 20-1C) and the like.

The specific examples of the pillar shape with a bottom face consisting of straight lines and arcs include shapes as shown on plan views of FIG. 20-2.

As one example of the bottom face consisting of straight lines and arcs, FIG. 20-2E shows a shape in which semi-circles are attached to both ends of a rectangular shape. The through hole for an optical path of a batch through hole structure having such a bottom face shape can be formed by a router machining process using a drill having a diameter of 300 µm. The through hole may also be formed by using a die machining process.

Moreover, as another example of the bottom face consisting of straight lines and arcs, FIG. 20-2F shows a shape in which each of corner portions of a rectangular shape have a ¼ arc as if the corners were chamfered. The through hole for an optical path of a batch through hole structure having such a bottom face shape can be formed by a router machining process using a drill having a diameter of 100 µm. The through hole may also be formed by using a die machining process.

The through holes for optical paths having the shapes as shown in FIGS. 20-2E and 20-2F can be formed by carrying out a router machining process or a die machining process of one time. In this case, compared to the formation of the through holes for optical paths having the shapes as shown in FIGS. 20-1A to 20-1C that require machining processes of plural times, since the through holes for optical paths are formed by a process of one time, deviations in the positional precision and the size of the through holes for optical paths hardly occur.

Moreover, with respect to the difference between the filling properties of resin compositions to be injected to the through holes for optical paths, when a resin composition is filled into the through holes for optical paths having the shapes shown in FIGS. 20-1A to 20-1C formed through drilling processes of plural times, since a portion close to the portion in which adjacent column-shaped through holes are connected to each other has a protruding shape, there were cases in which voids occurred at the time of filling the resin composition; however, in the case of the through holes for optical paths having the shapes shown in FIGS. 20-2E and 20-2F formed through a drilling process of one time, no voids occurred.

More specifically, after the through hole for an optical path having the shape shown in FIG. 20-1A and the through holes for optical paths having the shape shown in FIGS. 20-2E and 20-2F were filled with a resin composition respectively, and after the resin composition had been cured, these were subjected to a cross-cutting process, and the cross sections were observed by a microscope for any occurrence of voids, with the result that the through hole for an optical path having the shape shown in FIG. 20-1A had a rate of occurrence of voids of 1.7%, while the through holes for optical paths having the shapes shown in FIGS. 20-2E and 20-2F had a rate of occurrence of voids of 0%. As a result, from the viewpoint of the filling property of the resin composition, the shapes shown in FIGS. 20-2E and 20-2F are more desirable than the shapes shown in FIGS. 20-1A to 20-1C.

Here, after forming the through hole for an optical path or concave portion for an optical path (herein after, the two structures are also referred to as through holes etc. for optical paths), a desmearing process may be carried out on the wall faces of the through holes etc. for optical paths according to need.

The desmearing process is carried out by using, for example, treatment with a permanganate solution, plasma treatment, corona treatment and the like.

After forming the through holes etc. for optical paths, according to need, a roughened-surface forming process, which roughens the wall faces of the through holes etc. for optical paths, may be carried out prior to the filling of the uncured resin composition of which is carried out according to need. Adhesion between the wall faces and the metal layer or the resin composition can be made to be improved by such a process.

The forming of the roughened face can be carried out by dissolving portions of the substrate, the insulating layer and the like, which are exposed to the wall face at the time of forming the through holes for optical paths, by using, for example, an acid such as sulfuric acid, hydrochloric acid, nitric acid and the like, an oxidizing agent such as chromic acid, chrome sulfuric acid, permanganate and the like, and acid and oxidizing agent of the like. Moreover, the forming of the roughened face may also be carried out by the use of plasma treatment, corona treatment and the like.

It is desirable that the roughened face has the surface roughness Ra of the lower limit value of 0.5 µm, and the upper limit value of 5 µm. It is more desirable that the lower limit value of the surface roughness Ra is 1 µm, and the upper limit value is 3 µm. Within this range of value, excellent adhesion is provided between the wall face and the metal layer or between the wall face and the resin composition.

After forming the through holes etc. for optical paths, according to need, a metal layer forming process for forming a metal layer on the wall face may be carried out, to make the wall face of the through holes etc. for optical paths consist of metal.

The forming of the metal layer may be carried out by, for example, an electroless plating process, a sputtering process, a vapor deposition process and the like.

More specifically, for example, a method in which, after forming the through holes etc. for optical paths, a catalyst nucleus is attached to the wall face of the through holes etc. for optical paths, and thereafter, the substrate in which the through holes etc. for optical paths have been formed is immersed in an electroless plating bath, and methods of the like may be used.

Moreover, metal layers consisting of two or more layers may be formed by using a combination of an electroless plating process and a sputtering process, or by carrying out an electroplating process after an electroless plating process and/or a sputtering process.

Furthermore, when forming a metal layer in this process, the metal layer may be a metal layer made of glossy metal.

In such a metal-layer forming process, it is desirable that a metal layer is formed on the wall face of the through holes etc. for optical paths, and on the outermost layer formed as an outermost layer-insulating layer in the above-mentioned step (a), a conductor circuit is formed as a outermost layer-conductor circuit.

More specifically, for example, firstly, at the time of forming the metal layer on the wall face of the through holes etc. for optical paths by an electroless plating process and the like, a metal layer is also formed on the entire surface of the outermost layer-insulating layer.

Secondly, plating resist is formed on the metal layer formed on the surface of this outermost layer-insulating layer. The forming of the plating resist is carried out by, for example, subjecting a photosensitive dry film and a photomask to exposing and developing treatments after the photosensitive dry film is affixed on the metal resist, and the photomask, made of a glass substrate and the like on which a plating resist pattern is drawn, is arranged such that it is made in contact with the photosensitive dry film.

Finally, by using the metal layer formed on the outermost layer-insulating layer as a plating lead, an electroplating process is carried out to form an electroplating layer on a portion on which the plating resist was not formed, and thereafter, by removing the plating resist and the metal layer below the plating resist, an independent conductor circuit is formed on the outermost layer-insulating layer.

Therefore, in this case, it is desirable that the metal layer is made of the same material as that of the conductor circuit.

After forming the metal layer, a roughened face may be formed on the wall face of the metal layer. The forming of the roughened face can be carried out by, for example, blackening (oxidation)/reduction treatment, etching treatment using an etching solution containing a cupric complex and an organic acid salt, and the like, and treatment using Cu—Ni—P needle alloy plating, and treatments of the like.

Moreover, the wall face of the through holes etc. for optical paths to be formed by a manufacturing method of a substrate for mounting an IC chip according to the sixth aspect of the present invention may be formed by a resin material.

When resin is used as the material of the substrate and insulating layer formed by the fore-mentioned step, it means that the wall face of the through holes etc. for optical paths is also made of resin, even if no specific treatment was carried out during the present step.

Alternatively, a resin layer forming step may be carried out separately so that the wall face of the through holes etc. for optical paths is formed by a resin layer.

When the resin layer is formed separately, more specifically, after through holes etc. for optical paths have been formed, resin is filled into the through holes etc. for optical paths, and thereafter, the through holes etc. for optical paths are again formed such that a part of the filled resin is left on the wall face, thereby making the wall face of the through holes etc. for optical paths to be made of resin.

Here, it is desirable that the compositions of the resin layer on the wall face and the resin composition filled into the optical signal passing region are made almost the same except for the difference of the refractive indexes. Thus, adhesion between the two members is improved.

Moreover, in order to improve the adhesion between the two members, a primer process may be carried out on the surface of the resin layer.

At the time when, once after the filling of the resin composition, the through holes for optical paths are formed again, the shape thereof may be formed such that the shape of its cross section is symmetrical with that of the through holes for optical paths firstly formed, or may be such that, for example, when the resin composition is filled into the through holes for optical paths of the batch through hole structure, through holes for optical paths of an individual through hole structure are formed thereafter.

Nextly, according to need, a resin composition filling process for filling an uncured resin composition into the through holes or concave portions (through holes etc. for optical paths) is carried out.

After the uncured resin composition has been filled into the through holes etc. for optical paths, curing treatment is carried out thereon, and a portion of the optical signal passing region that penetrates through the substrate and the insulating layer and is made of the resin composition is formed.

The specific filling method for the uncured resin composition is not particularly limited, and for example, methods such as a printing method, a potting method and the like can be carried out.

At the time of carrying out the filling of the uncured resin composition by the printing process, the uncured resin composition may be printed by a single printing process or may be separately printed by two or more times. Moreover, the printing process may be carried out simultaneously on both faces of the multilayer wiring board.

Moreover, when filling the uncured resin composition, the amount of the uncured resin composition to be filled is to be a little greater than the inner product of the through holes etc. for optical paths, and upon completion of the filling, excessive resin composition overflowed from the through holes etc. for optical paths may be removed.

The removing process of the excessive resin composition can be carried out by, for example, a polishing process and the like. Moreover, at the time of removing the excessive resin composition, the state of the resin composition may be a semi-cured state or a completely cured state, the appropriate state being selected depending on the material and the like for the resin composition.

When the concave portion for an optical path has been formed, a sealing frame may be formed on the surface of the multilayer wiring board so as to prevent the resin composition filled into the concave portion for an optical path from spreading over the surface of the multilayer wiring board without limit.

By carrying out such through hole forming process, as well as the roughened surface forming process, the metal layer forming process, the resin layer forming process and the resin composition filling process, which are used according to need, an optical signal passing region can be formed on the multilayer wiring board manufactured through the above-mentioned step (a).

The step (a) (multilayer wiring board manufacturing process) and the step (b) thus far have been explained as different processes; however, some sequences thereof may be carried out in parallel with each other.

More specifically, for example, in the step (b), at the time of forming the metal layer, after the forming of the outermost-layer-insulating layer has been formed in the multilayer wiring board manufacturing process, without forming a conductor circuit on the surface thereof, the metal layer can also be formed on the surface of the outermost layer-insulating layer simultaneously during the metal layer forming process, and by carrying out the above-mentioned processes, an independent conductor circuit can be formed. In this case, of course, even when the metal layer forming process is not carried out, the conductor circuit can be formed on the surface of the insulating layer by using the above-mentioned method.

For example, after forming a thin-film conductor layer on the outermost layer-insulating layer in the above-mentioned multilayer wiring board manufacturing process, according to need, a thick-affixing process of the thin film conductor layer is carried out through electroplating, and thereafter, the above-mentioned optical signal passing region is formed prior to forming the conductor circuit through etching, and after that, the conductor circuit is formed through etching.

Furthermore, when, at the time of carrying out the resin composition filling process, the concave portion for an optical path has been formed on the multilayer wiring board, it is necessary to mount an optical element prior to filling the resin composition, and when an IC chip is mounted inside the concave portion for an optical path, it is also necessary to mount the IC chip together. Here, the mounting of the IC chip may be carried out depending on the design, and it is not necessarily required to mount it inside the concave portion for an optical path.

Explanation for a method for mounting the optical element and the IC chip inside the concave portion for an optical path will be given below.

Firstly, a part of the conductor circuit is exposed to the bottom face of the concave portion for an optical path such that a connection terminal to the optical element and the like is formed. Thereafter, according to need, a plated layer may be formed on the exposed portion of the conductor circuit.

Nextly, after the optical element and the IC chip have been attached to the bottom face of the concave portion for an optical path, the optical element and the IC chip are electrically connected to the conductor circuit of the multilayer wiring board.

Moreover, depending on cases, these may be connected to the conductor circuit formed on the outermost layer-insulating layer by wire bonding.

The attaching operations of the optical element and the IC chip can be carried out by, for example, an eutectic joining method, a solder joining method, a resin joining method and the like. Moreover, the optical element and the like may be attached by using silver paste or gold paste.

With respect to the method for electrically connecting the optical element and the IC chip to the conductor circuit of the multilayer wiring board, it is desirable that a wire bonding process is used. This process provides a greater degree of design freedom at the time of attaching the optical element and the like, and is also advantageous in economical efficiency.

With respect to the wire bonding process, conventionally known methods, namely, a nail-head bonding method and a wedge bonding method may be used.

Here, the mounting of the optical element and the like may be carried out through tape bonding, flip-chip bonding and the like.

After the through holes etc. for optical paths have been formed on the multilayer wiring board through the above-mentioned steps, a solder resist layer forming process for forming a solder resist layer having openings that communicate with the through hole and the concave portion (through holes etc. for optical paths) formed through the above-mentioned steps is carried out according to need.

More specifically, the solder resist layer can be formed by carrying out, for example, the following processes (1) and (2).

(1) Firstly, a layer composed of a solder resist composition is formed on the outermost layer of the multilayer wiring board having the through holes etc. for optical paths formed therein.

The layer of the solder resist composition can be formed by using a solder resist composition made of, for example, polyphenylene ether resin, polyolefin resin, fluororesin, thermoplastic elastomer, epoxy resin, polyimide resin and the like.

(2) Nextly, on the layer of the solder resist composition, an opening that communicates with the through holes etc. for an optical path (herein after, referred to also as opening for an optical path) is formed.

More specifically, the opening can be formed through, for example, exposing and developing processes, laser treatment and the like.

At the time of forming the opening for an optical path, it is desirable that an opening for forming a solder bump (an opening used for mounting an IC chip and an optical element) is formed simultaneously. Here, the forming of the opening for an optical path and the forming of the opening for forming a solder bump may be carried out separately.

Moreover, at the time of forming the solder resist layer, a resin film having openings at desired positions are preliminarily fabricated, and a solder resist layer which has the opening for an optical path and the opening for forming a solder bump may be formed by affixing the resin film to the outermost layer of the multilayer wiring board.

By carrying out the above-mentioned processes (1) and (2), the solder resist layer having the opening that communicates with the through hole for an optical path can be formed on the multilayer wiring board having the through holes and the like for an optical path.

An uncured resin composition may be filled into the opening for an optical path formed in the solder resist layer with the same method as that of the through holes etc. for optical paths. By subjecting the uncured resin composition to a curing process after the uncured resin composition has thus been filled into the opening for an optical path in the solder resist layer, the optical signal passing region composed of the resin composition can be formed.

Depending on cases, a metal layer may be formed on the wall face of the opening for an optical path formed in the solder resist layer.

Moreover, in these processes, it is desirable that polishing treatment is carried out on the surface where the resin composition is exposed on the through holes etc. for optical paths to flatten the exposed surface. By flattening the exposed surface, it becomes possible to reduce the possibility of interference in transmission of communication light.

The above-mentioned polishing treatment may be carried out by, for example, a buff polishing process, a polishing process using sand paper and the like, a mirror-face polishing process, a clean polishing process, a wrapping process, and processes of the like. Moreover, chemical polishing treatment using an acid, an oxidizing agent, a chemical solution and the like may also be carried out. Moreover, the polishing treatment may be conducted by a combination of two or more of these methods.

Next, the above-mentioned step (c), that is, the microlens arranging step for arranging microlenses on an end portion of the optical signal passing region, is carried out.

In order to arrange microlenses on the end portion of the optical signal passing region, the microlenses may be directly arranged on the resin composition, when the optical signal passing region is filled with a resin composition, or may be arranged on the optical signal passing region with an adhesive layer. Moreover, a microlens array may be arranged thereon with an adhesive layer.

The method for directly arranging microlenses onto the resin composition include, for example, a method in which an appropriate amount of uncured resin for an optical lens is dropped on the resin composition and the dropped uncured resin for an optical lens is subjected to a curing process.

In the above-mentioned method, at the time of dropping an appropriate amount of the uncured resin for an optical lens on the resin composition, a device such as a dispenser, an ink-jet, a micro-pipet, a micro-syringe and the like may be used. Here, since the uncured resin for an optical lens dropped on the resin composition by using such a device tries to form a spherical shape due to its surface tension, it holds a semi-spherical shape on the resin composition, and thereafter, by subjecting the uncured semi-spherical resin for an optical lens to curing treatment, a microlens with a semi-spherical shape can be formed on the resin composition.

The diameter, the shape of curved face and the like of the microlens thus formed can be controlled by adjusting the viscosity and the like of the uncured resin for an optical lens appropriately, while taking the wettability of the resin composition with respect to the uncured resin for an optical lens into consideration.

Moreover, in the manufacturing method of the substrate for mounting an IC chip according to the sixth aspect of the present invention, in this microlens arranging step, when the solder resist layer is formed, the microlens may be arranged in the opening for an optical path.

When the opening for an optical path is formed by a vacancy, the microlens can be directly arranged on the resin composition filled into the through hole for an optical path which is, in other words within the opening for an optical path, and when the opening for an optical path is filled with a resin composition, the microlens can be arranged between the resin composition filled into the through hole for an optical path and the resin composition filled into the opening for an optical path.

As of the method for arranging the microlens in the opening for an optical path when the opening for an optical path is formed by a vacancy, for example, the same method and the like as that of the above-mentioned method in which the microlens is arranged on the end portion of the opening for an optical path by using a resin for an optical lens may be used.

When the opening for an optical path is filled with a resin composition, for example, the following method may be used: after a multilayer wiring board having a through hole for an optical path filled with a resin composition therein has been fabricated, a microlens is arranged on the resin composition filled into the through hole for an optical path by using the resin for an optical lens in the same method as described above, and thereafter, a solder resist layer having an opening for an optical path is then formed, and the opening for an optical path is filled with a resin composition to arrange a microlens between the resin composition filled into the through hole for an optical path and the resin composition filled into the opening for an optical path. Here, when this method is used, the order of the arrangement of the microlens and the formation of the solder resist may be reversed.

In the manufacturing method of a substrate for mounting an IC chip according to the sixth aspect of the present invention, after the above-mentioned processes (a) to (c) are carried out, and when the through hole for an optical path has been formed through the above-mentioned processes, a substrate for mounting an IC chip can be manufactured by further carrying out a mounting process of an optical element and a forming of a solder pad and a solder bump.

In other words, a portion of the conductor circuit which is exposed by the forming of the opening for forming a solder bump is coated with corrosion-resistant metal such as nickel, palladium, gold, silver, platinum and the like, and thus a solder pad is formed. Among these, it is desirable that a coat layer be formed by metals such as nickel-gold, nickel-silver, nickel-palladium, nickel-palladium-gold and the like.

The coat layer may be formed by, for example, plating, vapor deposition, electro-coating and the like, and among these, it is desirable that plating is used because of its uniformity in the coat layer.

The formation of the solder pad may be carried out before the microlens arranging step (c).

Moreover, after solder paste has been filled into the solder pads via a mask having an opening at a portion corresponding to the solder pad, a reflow process is carried out thereon to form the solder bump.

Furthermore, optical elements (a light receiving element and a light emitting element) are mounted on the solder resist layer. The mounting process of the optical elements can be carried out, for example, with the solder bump. For example, at the time of forming the solder bump, the optical elements may be preliminarily attached at the time of injecting the solder paste, and the optical elements may be mounted simultaneously with the reflow process.

Here, as an alternative of the solder, the optical elements may be mounted by using a conductive adhesive and the like.

The manufacturing method according to the sixth aspect of the present invention with these processes makes it possible to suitably manufacture the above-mentioned substrate for mounting an IC chip according to the first aspect of the present invention.

Next, explanation for a substrate for a motherboard according to the second aspect of the present invention will be given below. The substrate for a motherboard according to the second aspect of the present invention is a substrate for a motherboard comprising: a substrate with a conductor circuit and an insulating layer laminated together with an optical waveguide formed on at least one face thereof, and an optical element or a substrate for mounting an IC chip with the optical element mounted thereon which can be mounted on at least one face thereof, wherein an optical signal passing region is provided on the substrate for a motherboard, and a microlens is arranged on an end portion of the optical signal passing region on a side on which the optical element or the substrate for mounting an IC chip is mounted.

Since the substrate for a motherboard according to the second aspect of the present invention has the optical waveguide formed thereon together with the optical signal passing region provided thereon, an optical signal can be transmitted via the optical waveguide and the optical signal passing region.

Furthermore, in the substrate for a motherboard according to the second aspect of the present invention, since the microlens is arranged on an end portion of the optical signal passing region on the side on which the substrate for mounting an IC chip is mounted, an optical signal that enters the optical waveguide and an optical signal that is emitted from the optical waveguide pass through the microlens, and thus diffusion in the optical signal can be suppressed and input/output signals of the optical waveguide can be transmitted more effectively. Consequently, a substrate for a motherboard of which the loss in the optical signal hardly occurs, and which can reduce the transmission loss can be provided.

Moreover, optical signals can be transmitted more positively between the optical waveguide formed on the substrate for a motherboard and optical parts and the like mounted on the substrate for mounting an IC chip and substrates of the like, and an optical communication system having high reliability in transmission of optical signals can be achieved.

In the substrate for a motherboard according to the second aspect of the present invention, the optical waveguide is formed thereon, and optical signals can be transmitted via this optical waveguide.

Examples of the optical waveguide include an organic optical waveguide made of a polymer material and the like, an inorganic optical waveguide made of quartz glass, a compound semiconductor and the like, and optical waveguides of the like. Among these, it is desirable that the organic optical waveguide made of a polymer material and the like is used. This is because this material provides excellent adhesion to the insulating layer and easiness in processing.

The polymer material is not particularly limited as long as it has little absorption within the communication wavelength band, and examples thereof include a thermosetting resin, a thermoplastic resin, a photosensitive resin, a resin of which a part of a thermosetting resin is allowed to have a photosensitive property, a resin composite between a thermosetting resin and a thermoplastic resin, a composite between a photosensitive resin and a thermoplastic resin, and the like.

Specific examples thereof include: acrylic resins such as PMMA (polymethyl methacrylate), heavy-hydrogenated PMMA, heavy-hydrogen fluorided PMMA and the like; polyimide resins such as fluorided polyimide and the like; epoxy resins; UV-setting epoxy resins; polyolefin resins, silicone resins such as heavy-hydrogenated silicon resin and the like; siloxane resins; polymers produced from benzo-cyclobutene; and the like.

When the optical waveguide is an optical waveguide in a multi-mode, it is desirable that the material is selected from an acrylic resin, an epoxy resin and an UV-setting epoxy resin, and when the optical waveguide is an optical waveguide in a single mode, it is desirable that the material is selected from a polyimide resin, a silicon resin and a siloxane resin.

Moreover, it is desirable that of a portion of the optical waveguide corresponding to the core is in the range of 1 to 100 μm in thickness, and in the range of 1 to 100 μm in width. If the width is less than 1 μm, the forming thereof tends to become difficult, and in contrast, if the width exceeds 100 μm, the design freedom of conductor circuits and the like that constitute the substrate for a motherboard tends to be lowered.

It is desirable that the ratio between the thickness and the width of the portion of the optical waveguide corresponding to the core is close to 1:1. This is made because the plane shapes of the light receiving portion of the light receiving element and the light emitting portion of the light emitting element are formed into a round shape. However, the ratio between the thickness and width thereof is not particularly limited, normally and can be in the range of about 1:2 to about 2:1.

When the optical waveguide is an optical waveguide in a single mode with a communication wavelength of 1.31 μm or 1.55 μm, it is more desirable that the core part thereof is in the range of 5 to 15 μm in thickness and in width, and most desirable therefor to be around 10 μm. When the optical waveguide is an optical waveguide in a multi-mode with a communication wavelength of 0.85 μm, it is more desirable that the core part thereof is in the range of 20 to 80 m in thickness and in width, and most desirable therefor to be around 50 μm.

Moreover, the optical waveguide may be mixed with particles. By mixing particles therein, the optical waveguide is made less susceptible to occurrence of cracks. In other words, when no particles are mixed in the optical waveguide, cracks tend to occur in the optical waveguide due to difference of the coefficients of thermal expansion between the optical waveguide and the other layers (the substrate, insulating layer and the like); however, by mixing particles in the optical wave guide to adjust the coefficients of thermal expansion so that the difference of the thermal expansion coefficient thereof with the other layers is made smaller, consequently making the optical waveguide less susceptible to occurrence of cracks.

Moreover, in addition to the above-mentioned resin component, the optical waveguide may contain particles such as resin particles, inorganic particles, metal particles and the like. By mixing these particles therein, the thermal expansion coefficients between the optical waveguide and layers such as the insulating layer and solder resist layer can be appropriately adjusted.

The specific material and shape of the above-mentioned particles are the same as the particles contained in the microlens that constitutes the substrate for mounting an IC chip according to the first aspect of the present invention.

It is desirable that the particle size of the particles is shorter than the communication wavelength. If the particle size is longer than the communication wavelength, the transmission of optical signals tends to be inhibited.

It is desirable that the particle size is 0.01 μm in lower limit and 0.8 μm in upper limit. When particles that deviate from this range are contained, the grain size distribution becomes too wide, and as a result, when those particles are mixed in the resin composition, deviations in the viscosity of the resin composition become greater and reproducibility at the time of preparing the resin composition becomes poor; consequently, it becomes difficult to prepare a resin composition having a predetermined viscosity.

It is more desirable that the particle size is 0.1 μm in lower limit, and 0.8 μm in upper limit. When the particle size is set within this range, the applying of the resin composition by using as pin coating process, a roll coating process and processes of the like can be carried out properly, and the resin composition can also be easily adjusted to a predetermined viscosity at the time of preparing the resin composition with the particles mixed therein.

In particular, most desirably, the lower limit of the particle size is set to 0.2 μm, and the upper limit thereof is set to 0.6 μm. This range is most suitable for the applying of the resin composition and the forming of a core part of the optical waveguide. Furthermore, within this range, deviations in the optical waveguides formed, in particular, deviations in the core part becomes the smallest, and the device for optical communication can also be provided with an extremely excellent characteristics.

Moreover, two kinds or more of particles having different particle sizes may be contained therein, as long as the particles have particle sizes within this range.

It is desirable that the mixed amount of the particles is 10% by weight in lower limit, and it is more desirable therefor to be 20% by weight in lower limit. In contrast, it is desirable that the particles are mixed 80% by weight in upper limit, and it is more desirable therefor to be mixed 70% by weight in upper limit. If the mixed amount of the particles is less than 10% by weight, the effects obtained by the mixing of the particles may not be exerted, and if the mixed amount of the particles exceeds 80% by weight, the transmission of the optical signal may be inhibited.

Although not particularly limited, the optical waveguide is preferable to be formed into a sheet shape because such shape can be formed easily.

Moreover, when the optical waveguide is the configuration of a core and a clad, the particles may be mixed in both the core and the clad; however, it is desirable that the particles are not mixed in the core, but only in the clad surrounding the core. The reasons for this will be described below.

When the particles are mixed in the optical waveguide, depending on adhesion between the particles and the resin component of the optical waveguide, an air layer tends to be formed on the interface between the particles and the resin component; thus, in this case, the refraction direction of light is changed by this air layer to cause a greater transmission loss in the optical waveguide. In contrast, when the particles are mixed only in the clad portion, the above-mentioned problem of a greater transmission loss in the optical waveguide due to the mixed particles can be avoided, and cracks hardly occur in the optical waveguide.

Moreover, it is desirable that an optical path conversion mirror is formed in the optical waveguide. By the forming the optical path conversion mirror, it becomes possible to change the optical path to a desired angle.

As will be described later, the formation of the optical path conversion mirror can be carried out by cutting one end of the optical waveguide. Moreover, instead of forming the optical path conversion mirror in the optical waveguide, a member having an optical path conversion part may be placed on the end portion of the optical waveguide.

Moreover, the optical path conversion mirror may be prepared as a mirror on which a metal film is vapor deposited.

The configurations other than the optical waveguide such as the substrate, the insulating layer and the optical signal passing region are almost the same as those of the substrate for mounting an IC chip according to the first aspect of the present invention except for the sizes thereof.

Therefore, in the substrate for a motherboard according to the second aspect of the present invention, it is desirable that the wall face of the optical signal passing region is made of resin or metal, and the wall face thereof has a surface roughness Ra of 0.1 to 5 μm.

In the substrate for a motherboard, it is desirable that light emitted from the optical waveguide is formed into collimated light via the above-mentioned microlens, and it is also desirable that the spot region made on the core of the optical waveguide by the light that enters the optical waveguide via the microlens overlaps the core by 35% or more.

Moreover, in the substrate for a motherboard, it is desirable that the microlens is directly arranged on the end portion of the optical signal passing region that has been subjected to water-repellent treatment or hydrophilic treatment, and that the microlens is mixed with particles.

Explanation for one embodiment of a substrate for a motherboard according to the second aspect of the present invention will be given below, by making reference to the drawings.

FIGS. 6 and 7 are cross sectional views that schematically show one example of the substrate for a motherboard according to the second aspect of the present invention.

The substrate for a motherboard having an embodiment according to the present invention is mainly divided into two modes depending on the shapes of an optical signal passing region.

Namely, the two modes include an optical signal passing region having a batch through hole structure (herein after, also referred to as the substrate for a motherboard according to the first embodiment), and an optical signal passing region having an individual through hole structure (herein after, also referred to as the substrate for a motherboard according to the second embodiment).

Here, it is desirable that the substrate for a motherboard according to the first embodiment has a mode in which the optical element is a multichannel optical element, the optical signal passing region is constituted by a single optical path which can transmit an optical signal from or to a multichannel optical element, and the microlens is a microlens array having plural lenses.

In this case, it is desirable that the single optical path which can transmit an optical signal from or to a multichannel optical element is designed to have a shape in which portions of wall faces of plural columns are connected to one another, and it is more desirable that at least one of the plural columns is a dummy column that does not transmit any optical signal.

Moreover, it is desirable that the substrate for a motherboard according to the second embodiment has a mode in which the optical element is a multichannel optical element, and the optical signal passing region is constituted by plural independent optical paths.

FIG. 6 shows one example of the substrate for a motherboard according to the first embodiment.

As shown in FIG. 6, a substrate 520 for a motherboard has a structure in which both a conductor circuit 524 and an insulating layer 522 are laminated on both faces of a substrate 521, and the conductor circuits with the substrate 521 interposed there between, and the conductor circuits with the insulating layer 522 interposed there between, are electrically connected by a plated through hole 529 and a via hole 527, respectively. Moreover, a solder resist layer 534 is formed on the outermost layer.

This substrate 520 for a motherboard has an optical signal passing region 542 provided so as to penetrate through the substrate 521, the insulating layer 522 and the solder resist layer 534.

A portion of this optical signal passing region 542 that penetrates through the substrate 521, the insulating layer 522 and the solder resist layer 534 is filled with a resin composition 547.

Moreover, the diameter of the portion that penetrates through the solder resist layer 534 is the same as that of a portion that penetrates through the substrate 521 and the insulating layer 522, and the shape of the longitudinal section of the portion penetrating through the solder resist layer 534 is a rectangular shape. Here, a metal layer may be formed on the wall face of the optical signal passing region.

On the outermost layer of the insulating layer 522 on one of the faces of the substrate 520 for a motherboard (the lower side in the figure), an optical waveguide 550, constituted by four cores 551a to 551d and a clad 552, is formed. Moreover, an optical path conversion mirror is formed at the end portion of each of the cores 551a to 551d, so that an optical signal can be transmitted between the optical waveguide and the optical signal passing region 542. Here, the optical signal passing region 542 has a size which can sufficiently transmit optical signals transmitted via any of the four cores, and is formed through a batch process such that it penetrates through the substrate 521, the insulating layer 522 and the solder resist layer 534. Here, as shown in FIG. 6, the portion of the optical signal passing region 542 that penetrates through the solder resist layer 534 may be filled with a resin composition or may be formed by a vacancy. Moreover, a metal layer may be formed around the portion of the optical signal passing region 542 that penetrates through the substrate 521 and the insulating layer 522.

Solder bumps 537 are formed on the solder resist layer 534 on the opposite side from the side the optical waveguide of the substrate for a motherboard 520 is formed.

Moreover, on an end portion the opposite side from the side of the optical waveguide 550 arranged on the optical signal passing region 542, a microlens array 546 in which four lenses 546a to 546d are placed in parallel with one another is arranged through an adhesive (not shown in the figure). Here, the lenses 546a to 546d are arranged at positions corresponding to the cores 551a to 551d, each having an end portion with the optical path conversion mirror formed thereon.

Therefore, an optical signal transmitted via the optical waveguide 550 passes through each of the lenses 546a to 546d that constitute the microlens array 546, and by thus arranging the microlens array 546 on one end of the optical signal passing region 542 in this manner, a transmission loss in the optical signal can be reduced.

As an alternative of the microlens array 546, four microlenses may be individually arranged at predetermined positions.

When the microlenses are directly arranged on an end portion of the optical signal passing region, it is desirable that the microlenses are arranged on the end portion of the optical signal passing region that has been subjected to water repellent treatment or hydrophilic treatment.

Moreover, since the solder bumps 537 are formed on the solder resist layer 534 with a metal plating layer, the substrate 520 for a motherboard can be connected to an external substrate such as a substrate for mounting an IC chip and the like via the solder bumps, and the transmission of the electric signal with the external substrate can be carried out.

When an external substrate is connected to the substrate for a motherboard via the solder bumps, the external substrate can be placed at a predetermined position by a self-alignment function of the solder.

In the substrate for a motherboard on which such an optical waveguide having plural cores is formed, the diameter of each of the microlenses arranged on the end portion of the optical signal passing region can be appropriately determined depending on the pitch between each of the cores.

The shape of the optical signal passing region of the batch through hole structure include, for example, the same shape as that of the above-mentioned optical signal passing region of the substrate for mounting an IC chip according to the first embodiment.

It is desirable that the size of the optical signal passing region is in the range of 100 μm to 5 mm in both the longitudinal side and the lateral side. More specifically, when the optical signal passing region has a column shape, it is desirable that the diameter of the bottom face is within the above-mentioned range, and when the region has anyone of the above-mentioned pillar shapes, it is desirable that both the length of the longest portion of the bottom face and the length of a portion orthogonal to the longest portion are within the above-mentioned range.

If the diameter of the cross section is less than 100 μm, the transmission of an optical signal may be inhibited in some cases, and on the other hand, if the length exceeds 5 mm, the transmission loss of an optical signal cannot be improved, and there may be difficulty in miniaturizing the substrate for a motherboard.

At the time of forming the optical signal passing region in the substrate for a motherboard, it is desirable that the optical signal passing region has such a size that light emitted from the optical waveguide (core) and light that enters the optical waveguide (core) are not reflected on the wall faces and no interference is caused between adjacent optical signals. This is because a transmission loss due to reflection of light on the wall faces of the optical signal passing region and interference between optical signals do not occur.

Thus, a desirable cross-sectional shape for the optical signal passing region of the batch through hole structure was examined.

Here, the substrate for a motherboard which was examined was provided with an optical waveguide which was a four channel optical waveguide, the cross-sectional size of each of the cores being 50×50 μm, the refractive index of the core being 1.52, the refractive index of the clad being 1.50, and the refractive index of a resin composition to be filled into the optical signal passing region being 1.50.

The results of the examination indicate that in the substrate for a motherboard having the above-mentioned mode, when the substrate for a motherboard has the thickness of 0.6 mm and the distance between each of the cores is 250 μm for example, the optical signal passing region of a batch through hole structure should have a cross-sectional shape which is greater than a shape in which semi-circles having a radius of 112.5 μm are attached to both sides of a quadrangle having a size of 225×900 μm to be able to transmit an optical signal without causing reflection on the wall faces of the optical signal passing region and interference between signal lights, and when the substrate for a motherboard has the thickness of 1.2 mm and the distance between each of the cores is 500 μm for example, the optical signal passing region of a batch through hole structure should have a cross-sectional shape which is greater than a shape in which semi-circles having a radius of 200 μm are attached to both sides of a quadrangle having a size of 400×1600 μm to be able to transmit an optical signal without causing reflection on the wall faces of the optical signal passing region and interference between signal lights.

Nextly, explanation for the substrate for a motherboard according to the second embodiment will be given below.

FIG. 7 shows the substrate for a motherboard according to the second embodiment.

Except for the difference between the shape of the optical signal passing region, the structure of the substrate for a motherboard according to the second embodiment, namely, the structure of a substrate for mounting a motherboard of the embodiment having the optical signal passing region of the individual through hole structure, is the same as that of the substrate for mounting a motherboard of the embodiment shown in FIG. 6. Therefore, detailed explanation for only the shape of the optical signal passing region will be given hereunder.

As shown in FIG. 7, in the substrate 620 for a motherboard, four independent optical signal passing regions 642a to 642d are provided so as to penetrate through a substrate 621, an insulating layer 622 and a solder resist layer 634.

Portions of the optical signal passing regions 642a to 642d that penetrate through the substrate 621, the insulating layer 622 and the solder resist layer 634 are filled with a resin composition 647.

Here, the diameter of the portion penetrating through the solder resist layer 634 is the same as that of the portions that penetrate through the substrate 621 and the insulating layer 622, and the shape of the longitudinal section of the portion penetrating through the solder resist layer 634 is a rectangular shape.

On the outermost layer of the insulating layer 622 on one of the faces of the substrate 620 for a motherboard (the lower side in the figure), an optical waveguide 650, constituted by four cores 651a to 651d and a clad 652, is formed.

Moreover, optical path conversion mirrors are formed on end portions of each of the cores 651a to 651d, so that optical signals can be transmitted between the cores 651a to 651d of the optical waveguide and the optical signal passing regions 642a to 642d. Here, the optical signal passing regions 642 are independently formed so that optical signals transmitted via the four cores can be transmitted respectively.

Here, as shown in FIG. 7, the portions of the optical signal passing regions 642a to 642d penetrating through the solder resist layer 634 may be filled with a resin composition or may be formed by a vacancy. Moreover, a metal layer may be formed around the portions of the optical signal passing regions 642 that penetrate the substrate 621 and the insulating layer 622.

Moreover, microlenses 646a to 646d are arranged on end portions of the optical signal passing regions 642a to 642d on the opposite side from the side on which the optical waveguide 650 is formed.

Therefore, an optical signal transmitted via the optical waveguide 650 and an optical signal transmitted toward the optical waveguide 650 passes through the microlenses 646a to 646d. By thus arranging the microlenses 646a to 646d on each end of the optical signal passing regions 642 respectively, the transmission loss of the optical signal can be suppressed.

Furthermore, the microlenses 646a to 646d are directly arranged on a resin composition 647 formed on portions of the optical signal passing regions 642a to 642d that penetrate through the substrate 621, the insulating layer 622 and the solder resist layer 634.

Here, as an alternative of the microlenses 646a to 646d, a microlens array having four lenses placed in parallel with each other may be arranged thereon with an adhesive.

Moreover, since the solder bumps 637 are formed on the solder resist layer 634 with a metal plating layer, the substrate 620 for a motherboard can be connected to an external substrate such as a substrate for mounting an IC chip and the like via the solder bumps, and the transmission of the electric signal with the external substrate can be carried out.

When an external substrate is connected to the substrate for a motherboard via the solder bumps, the external substrate can be placed at a predetermined position a self-alignment function of the solder.

In the substrate for a motherboard on which such an optical waveguide having plural cores is formed, the diameter of each of the microlenses arranged on the end portions of the optical signal passing regions can be appropriately determined depending on the pitch between each of the cores.

The shape of the optical signal passing regions of the individual through hole structure include, for example, the same shape as that of the above-mentioned optical signal passing region of the substrate for mounting an IC chip according to the second embodiment.

Moreover, with respect to the size of each of the optical signal passing regions, it is desirable that across section thereof has a lower diameter limit of 100 µm, and also an upper diameter limit of 500 µm. If the diameter of the cross section is less than 100 µm, the optical path may be blocked and the filling of the optical signal passing regions with an uncured resin composition may also become difficult. On the other hand, even if the diameter is greater than 500 µm, the transmitting property of the optical signal is not sufficiently improved, and the design freedom of the conductor circuit and the like that constitute the substrate for mounting a motherboard tends to be inhibited.

At the time of forming the optical signal passing regions in the substrate for a motherboard, it is desirable that the optical signal passing regions have such sizes that light emitted from the optical waveguide (core) and light that enters the optical waveguide (core) are not reflected on the wall faces. This is because a transmission loss due to reflection of the light on the wall faces of the optical signal passing regions does not occur.

Thus, a desirable cross-sectional shape for the optical signal passing regions having the individual through hole structure was examined.

Here, the substrate for a motherboard which was examined was provided with an optical waveguide which was a four channel optical waveguide, the cross-sectional size of each of the cores being 50×50 µm, the refractive index of the core being 1.52, the refractive index of the clad being 1.50 and the refractive index of a resin composition to be filled into the optical signal passing region being 1.50.

The results of the examination indicate that in the substrate for a motherboard having the above-mentioned mode, when the substrate for a motherboard has the thickness of 0.3 mm and the distance between each of the cores is 250 µm for example, the optical signal passing regions of the individual through hole structure should have a diameter of 191 µm or more to be able to transmit an optical signal without causing reflection on the wall faces of the optical signal passing regions, and when the substrate for a motherboard has the thickness of 0.8 mm and the distance between each of the cores is 500 µm for example, the optical signal passing regions of the individual through hole structure should have a diameter of 391 µm or more to be able to transmit an optical signal without causing reflection on the wall faces of the optical signal passing regions.

Explanation will be given below of the manufacturing method of a substrate for a motherboard according to the seventh aspect of the present invention.

The manufacturing method of the substrate for a motherboard according to the seventh aspect of the present invention is a manufacturing method of a substrate for a motherboard comprising:
(a) an optical wiring board manufacturing step of forming an optical wiring board by sequentially laminating a conductor circuit and an insulating layer on at least one face of a substrate and by also forming an optical waveguide on the substrate and/or the insulating layer;
(b) an optical signal passing region forming step of forming an optical signal passing region on the optical wiring board; and
(c) a microlens arranging step of arranging a microlens on one end of the optical signal passing region.

Since the manufacturing method of the substrate for a motherboard according to the seventh aspect of the present invention comprises the step of forming the optical signal passing region and the optical waveguide, and the step of arranging microlenses on an end portion of the optical signal passing region, a preferred substrate for a motherboard according to the second aspect of the present invention, namely, the substrate for a motherboard that transmits an optical signal through the optical signal passing region and/or the optical waveguide, can be manufactured. Therefore, by using the manufacturing method of the substrate for a motherboard according to the seventh aspect of the present invention, a substrate for a motherboard excellent in the transmitting property of an optical signal can be manufactured.

Explanation for the order of steps of the manufacturing method of the substrate for a motherboard according to the seventh aspect of the present invention will be given hereunder.

Here, in the manufacturing method of the substrate for a motherboard according to the seventh aspect of the present invention, the optical wiring board manufacturing step and the optical signal passing region forming step are not necessarily required to follow this order, and can be appropriately carried out in combination depending on the design of the substrate for a motherboard.

In the manufacturing method of the substrate for a motherboard according to the seventh aspect of the present invention, firstly, depending on the design, the above-mentioned step (a), namely, the optical wiring board manufacturing step, and the above-mentioned step (b), namely, the optical signal passing region forming step are carried out in parallel with each other.

More specifically, for example, the following processes (1) to (8) are carried out.

(1) Firstly, in the same manner as the processes (1) and (2) of the multilayer wiring board manufacturing process in the manufacturing step of the substrate for mounting an IC chip according to the sixth aspect of the present invention, a conductor circuit is formed on both faces of a substrate, and a plated through hole that connects the conductor circuits having the substrate interposed there between is also formed. In also this process, the surface of the conductor circuit and the wall face of the plated through hole are roughened according to need.

(2) Nextly, according to need, an insulating layer and a conductor circuit are laminated in alternate fashion and in repetition on the substrate on which the conductor circuit has been formed.

More specifically, the insulating layer and the conductor circuit can be laminated in alternate fashion and in repetition, by using the same method as the processes (3) to (8) of the multilayer wiring board manufacturing step in the manufacturing method of the substrate for mounting an IC chip according to the sixth aspect of the present invention.

In also these processes, a plated through hole that penetrates through the substrate and the insulating layer, and a lid plating layer may be formed in the same manner as the manufacturing method of the substrate for mounting an IC chip.

The process for laminating the insulating layer and the conductor circuit in alternate fashion may be carried out only once, or may be carried out several times.

As in the method for manufacturing the substrate for mounting an IC chip, a subtractive method may be used as the method for forming the conductor circuit on the insulating layer according to this process.

Moreover, as will be described later, when, at the time of forming an optical waveguide, the optical waveguide is formed on the insulating layer and the like, whose side is, referring to the substrate with such layers laminated thereon, opposite from the side confronting the substrate for mounting an IC chip and the like, a through hole for an optical path, which has a resin layer for an optical path formed therein, or which has a metal layer and a resin layer formed on its wall face, is formed in this process according to need. Here, the through hole for an optical path functions as an optical signal passing region.

As a specific method for forming the through hole for an optical path (optical signal passing region), the same method as in step (b) (optical signal passing region forming step) of the manufacturing method of the substrate for mounting an IC chip according to the sixth aspect of the present invention may be used.

The forming of the optical signal passing region that penetrates through this substrate and the like may be carried out after the forming of the optical waveguide through the following step (3).

Moreover, the forming of the through hole for an optical path may be carried out by, for example, a drill machining process, laser treatment, and the like.

The laser to be used in the laser treatment may be, for example, the same laser used at the time of forming an opening for a via hole, and lasers of the like.

The through hole for an optical path may be formed as either a batch through hole or individual through holes, according to design.

(3) Nextly, an optical waveguide is formed at a predetermined designed position on the substrate and/or the insulating layer. When the formation of the optical waveguide is carried out by using an inorganic material such as quartz glass and the like as its material, an optical waveguide preliminarily formed into a predetermined shape may be attached with an adhesive.

Moreover, the optical waveguide made of the inorganic material may be formed by allowing an inorganic material such as $LiNbO_3$ $LiTaO_3$ and the like to grow through, a liquid-phase epitaxial method, a chemical vapor deposition (CVD) method, a molecular beam epitaxial method, and methods of the like.

Methods for forming an optical waveguide made from a polymer material include: (1) a method in which a film for forming an optical waveguide which is preliminarily formed into a film shape and arranged on a releasing film and the like, is affixed onto the insulating layer; (2) a method in which an optical waveguide is directly formed on the insulating layer and the like by successively laminating a lower clad, a core and an upper clad on the insulating layer, and methods of the like.

As the method for forming an optical waveguide, the same method may be used for both the forming of the optical waveguide on the releasing film and the forming thereof on the insulating layer and the like.

More specifically, a method using a reactive ion etching process, an exposing and developing method, a metal-mold forming method, a resist forming method, a method using these methods in combination, and methods of the like may be used.

In the method using a reactive ion etching process (i) firstly, a lower clad is formed on a releasing film, an insulating layer and the like (herein after, simply referred to as a releasing film etc.), (ii) and then, a resin layer for forming a core is formed by applying a resin composition for a core to the lower clad, and according to need, it is subjected to a curing process. (iii) Nextly, a resin layer for forming a mask is formed on the resin layer for forming a core, and this resin layer for forming a mask is subjected to exposing and developing processes such that a mask (etching resist) is formed on the resin layer for forming a core.

(iv) Nextly, the resin layer for forming a core is subjected to a reactive ion etching process, so that the resin layer for forming a core corresponding to a portion of which the mask is not formed is removed therefrom, and a core is formed on the lower clad. (v) Finally, by forming an upper clad on the lower clad such that the core is covered, an optical waveguide is formed.

By this method using the reactive ion etching, an optical waveguide that is excellent in dimensional reliability can be formed. Furthermore, this method is also excellent in reproducibility.

Moreover, in the exposing and developing method, (i) firstly, a lower clad is formed on a releasing film etc., (ii) and then, a resin composition for a core is applied to the lower clad, and by subjecting this to a semi-curing process, a resin layer for forming a core is formed according to need.

(iii) Next, a mask, having a drawn pattern corresponding to a portion of which the core is to be formed, is placed on the layer of the resin composition for forming a core, and thereafter subjected to exposing and developing processes to form a core on the lower clad. (iv) Finally, by forming an upper clad on the lower clad such that the core is covered, an optical waveguide is formed.

Since the number of processes is few in this exposing and developing method, this method is preferred to be used at the time of the mass-producing of the optical waveguides, and since the number of heating processes is few, a stress is hardly exerted in the optical waveguide.

Moreover, since the optical waveguide can be formed on the substrate based upon an alignment mark, an optical element and the core of an optical waveguide can be positioned with high precision through a passive alignment process.

In the metal-mold forming method, (i) firstly, a lower clad is formed on a releasing film etc., (ii) and then, a groove for forming a core is formed on the lower clad through the forming of the metal-mold. (iii) Moreover, a resin composition for a core is filled into the groove through a printing process, and thereafter subjected to a curing process, to form a core. (iv) Finally, by forming an upper clad on the lower clad such that the core is covered, an optical waveguide is formed.

This metal-mold forming method is preferred to be used at the time of the mass-producing of optical waveguides, and can form optical waveguides that are excellent in dimensional reliability. Furthermore, this method is also excellent in reproducibility.

In the resist forming method, (i) firstly, a lower clad is formed on a releasing film etc., (ii) and then, after a resin composition for a core has been applied to the lower clad, and subjected to exposing and developing processes, a resist for forming a core is formed on a portion on the lower clad of which the core is not formed.

(iii) Nextly, a resin composition for a core is applied to the portion on the lower clad of which the resist is not formed, (iv) and moreover, a core is formed on the lower clad, by curing the resin composition for a core, and thereafter separating the resist for forming a core therefrom. (v) Finally, by forming an upper clad on the lower clad such that the core is covered, an optical waveguide is formed.

This resist forming method is preferred to be used at the time of the mass-producing of optical waveguides, and can form optical waveguides that are excellent in dimensional reliability. Moreover, this method is also excellent in reproducibility.

At the time of forming an optical waveguide made from a polymer material by using these methods, and when the optical waveguide is formed with a core mixed with particles, the metal-mold forming method is more desirable than the exposing and developing method. The reasons for this are described hereunder.

In other words, when the groove for forming a core has been formed on the lower clad through the metal-mold forming method, and thereafter, the core is formed in the groove by using the metal-mold forming method, all the particles to be mixed in the core are contained in the core, and the surface of the core will be flat, thus providing an excellent optical signal transmission performance. In contrast, when the core is formed through the exposing and developing method, the particles tend to partly protrude from the core surface, or pits caused by removed particles tend to appear on the core surface, and irregularities may be formed on the core surface; thus, light is not reflected in a desired direction due to the irregularities, and consequently, transmitting property of the optical signal is reduced.

Here, an optical path conversion mirror is formed at the optical waveguide.

The optical path conversion mirror may be formed before attaching the optical waveguide onto the insulating layer, or may be formed after being attached onto the insulating layer; however, except for the case in which the optical waveguide is directly formed onto the insulating layer, it is desirable that the light path conversion mirror is preliminarily formed. This is because operations can be carried out easily, and also because scratches and damages to other members constituting the substrate for a motherboard, the substrate, the conductor circuit, the insulating layer, and the like can be prevented during the operations.

The method for forming the optical path conversion mirror is not particularly limited, and conventionally known forming methods may be used. More specifically, a machining process using a diamond saw having a V-shaped tip with 90 degrees, a process using reactive ion etching treatment, a laser ablation, and methods of the like may be used. Moreover, as an alternative of the forming of the optical path conversion mirror, an optical path conversion member may be embedded therein.

Moreover, when an optical path conversion mirror which converts an optical path to 90 degrees is formed in the optical waveguide, the angle made by the face of the lower clad contacted to the substrate or the insulating layer, and the face of the mirror on which the optical path is converted, may be 45 degrees or 135 degrees.

The forming processes of the optical waveguide and the optical path conversion mirror can be carried out, for example, based upon an alignment mark that has been preliminarily formed inside the optical signal passing region and the like, on the substrate for a motherboard.

Here, an explanation for the method in which the optical waveguide is formed on the substrate or on the insulating layer of the outermost layer has been made; however, at the time of manufacturing the above-mentioned optical wiring board, there may be cases in which the optical waveguide is formed between the substrate and the insulating layer, or between the insulating layers.

When the optical waveguide is to be formed between the substrate and the insulating layer, a substrate having conductor circuits formed on both faces thereof is fabricated in the process (1), and thereafter, an optical waveguide is formed on a portion on the substrate of which the conductor circuit is not formed by using the same method as the process (3), and by forming an insulating layer using the same process as the process (2) thereafter, the optical waveguide can be formed at the above-mentioned position.

When the optical waveguide is to be formed between the insulating layers, at least one insulating layer is laminated on the substrate of which the conductor circuits have been formed in the same manner as the processes (1) and (2), and thereafter, an optical waveguide is formed on the insulating layer in the same manner as the process (3), and by further repeating the same method as the process (2) thereafter, the optical waveguide is formed between the insulating layers.

(4) Nextly, a layer of a solder resist composition is formed on the outermost layer of the substrate in which the optical waveguide has been formed according to need.

This layer of the solder resist composition can be formed by using the same resin composition as the resin composition used at the time of forming a solder resist layer in the manufacturing method of a substrate for mounting an IC chip according to the sixth aspect of the present invention.

Here, depending on cases, the optical waveguide according to the process (3) may be formed over the entire outermost layer of the substrate, so as to allow the optical waveguide to serve as a solder resist layer.

(5) Nextly, openings for forming solder bumps (openings in which a substrate for mounting an IC chip and various surface mounting-type electronic parts are mounted) and openings for optical paths are formed on the solder resist layer on the side confronting the substrate for mounting an IC chip and the like.

The forming processes of the openings for forming solder bumps and the openings for optical paths can be carried out by using the same method as the method for forming the openings for forming solder bumps in the manufacturing method of the substrate for mounting an IC chip according to the sixth aspect of the present invention, namely, the exposing and developing processes, the laser treatment, and the like.

Here, the forming process of the openings for forming solder bumps and the forming process of the openings for optical paths may be carried out simultaneously, or may be carried separately.

Among these, at the time of forming the solder resist layer, it is desirable that a method in which, as the material thereof, a resin composition containing a photosensitive resin is applied to the outermost layer of the substrate, and the openings for forming solder bumps and the openings for optical paths are formed by carrying out exposing and developing processes is selected.

This is because damages to the optical waveguide located below the openings for optical paths can be prevented at the time of forming the openings, when the openings for optical paths are formed through the exposing and developing processes.

Moreover, at the time of forming the solder resist layer, a solder resist layer having the openings for forming solder bumps and the openings for optical paths may be formed by fabricating a resin film having openings at desired positions preliminarily, and affixing it.

When through holes for optical paths are formed with an optical waveguide formed on the side of the substrate which is opposite from the side confronting the substrate for mounting an IC chip, the openings for optical paths should be formed so as to communicate with the through holes for optical paths at the time of forming the openings for optical paths in this process.

Moreover, according to need, openings for forming solder bumps may be formed on a solder resist layer on the opposite side from the face confronting the substrate for mounting an IC chip.

This is because, in the subsequent processes, external connection terminals can also be formed on the solder resist layer on the opposite side from the face confronting the substrate for mounting an IC chip.

(6) Nextly, according to need, the portions of the conductor circuit, exposed by the forming of the openings for forming solder bumps, are coated with corrosion resistant metal such as nickel, palladium, gold, silver, platinum and the like, and solder pads are formed. More specifically, the same method as the method used in the manufacturing method of the substrate for mounting an IC chip according to the sixth aspect of the present invention may be used.

(7) Nextly, an uncured resin composition is filled into the openings for optical paths formed in the step (5), and then subjected to a curing process to form resin layers for optical paths. It is desirable that, in this process, the uncured resin composition to be filled is the same resin composition to be filled into the above-mentioned through holes for optical paths.

Moreover, as is mentioned above, when through holes for optical paths and openings for optical paths are formed so as to form optical waveguides, whose side is, referring to the substrate, opposite from the side confronting the substrate for mounting an IC chip and the like, the through holes for optical paths and the openings for optical paths may be filled with an uncured resin composition, and when the uncured resin composition is filled therein, the filling processes may be carried out on the through holes for optical paths and the openings for optical paths simultaneously, and the curing process may be carried out thereafter; alternatively, after through holes for optical paths have been formed on the optical wiring board, the filling and the curing processes of the uncured resin composition are carried out, and a solder resist layer having openings for optical paths is formed, and an filling and a curing process of an uncured resin composition may be further carried out thereafter.

(8) Nextly, after filling the solder pads with solder paste via a mask in which openings are formed at portions corresponding to the solder pads, solder bumps are formed by the carrying out of a reflow process.

By forming these solder bumps, a substrate for mounting an IC chip and various surface-mounting type electronic parts can be mounted via the solder bumps. Here, the solder bumps may be formed according to need, and even when the solder bumps are not formed, a substrate for mounting an IC chip and various surface-mounting type electronic parts to be mounted can be mounted through bumps formed thereon.

Moreover, with respect to the solder resist layer on the opposite side from the face confronting the substrate for mounting an IC chip, it is not necessary to particularly form external connection terminals thereto, and pins may be arranged, or solder balls may be formed according to need, so that PGA and BGA structures may be formed.

Next, the step (c), namely, the microlens arranging step for arranging a microlens at one end of the optical signal passing region formed through the above-mentioned processes, is carried out.

At the time of arranging the microlens, when the optical signal passing region is filled with a resin composition, the microlens may be directly arranged on the resin composition, or may be arranged on the optical signal passing region with an adhesive layer. Moreover, a microlens array may be placed with an adhesive layer.

As of the specific method, the same method as the method used in the step (c) (microlens arranging step) in the manufacturing method of the substrate for mounting an IC chip according to the sixth aspect of the present invention may be used.

Here, depending on cases, the step (c) (microlens arranging step) may be carried out prior to forming the solder pads and the solder bumps.

In the manufacturing method of the substrate for a motherboard according to the seventh aspect of the present invention, after these processes (a) to (c) have been carried out, the solder pads and the solder bumps are formed to complete the manufacturing processes for the substrate for a motherboard.

Here, the same method as the method used for manufacturing the substrate for mounting an IC chip according to the sixth aspect of the present invention may be used as the method for forming the solder pads and solder bumps.

Explanation for a device for optical communication according to the third aspect of the present invention will be given below. The device for optical communication according to the third aspect of the present invention is a device for optical communication, wherein the substrate for mounting an IC chip according to the first aspect of the present invention, on which the IC chip is mounted, is mounted on the substrate for a motherboard according to the second aspect of the present invention.

In the device for optical communication according to the third aspect of the present invention, an output signal from a light emitting element mounted on a substrate for mounting an IC chip and an input signal to a light receiving element mounted thereon can be transmitted via the substrate for a motherboard.

Here, since the substrate for mounting an IC chip according to the first aspect of the present invention is mounted on the substrate for a motherboard according to the second aspect of the present invention, excellent transmitting property of optical signals can be provided.

In the device for optical communication according to the third aspect of the present invention, it is desirable that microlenses are arranged on an end portion of an optical signal passing region formed on the substrate for mounting an IC chip, the arranged position thereof being the side confronting the substrate for a motherboard, and an end portion of an optical signal passing region formed on the substrate for a motherboard, the arranged position thereof being the side confronting the substrate for mounting an IC chip.

When the microlenses are arranged on these portions, an optical signal emitted from the substrate for mounting an IC chip with the light emitting element mounted thereon can be positively transmitted to a light receiving element mounted on another substrate for mounting an IC chip via an optical waveguide formed on the substrate for a motherboard.

Explanation for an embodiment of a device for optical communication according to the third aspect of the present invention will be given below, by making reference to the drawings.

FIG. 8 is a cross-sectional view that schematically shows one example of the embodiment of a device for optical communication according to the third aspect of the present invention.

FIG. 8 shows a device 760 for optical communication having a structure in which a substrate 2720 for mounting an IC chip with a light receiving element 2739 mounted thereon and a substrate 1720 for mounting an IC chip with a light emitting element 1738 mounted thereon are mounted on a substrate 720 for a motherboard.

The substrate 1720 for mounting an IC chip has a structure in which a conductor circuit 1724 and an insulating layer 1722 are laminated on both faces of a substrate 1721, and the conductor circuits with the substrate 1721 interposed there between, and the conductor circuits with the insulating layer 1722 interposed there between are electrically connected by plated through holes and via holes 1727 (not shown in the figure), respectively. Moreover, a solder resist layer 1734 is formed on the outermost layer.

In this substrate 1720 for mounting an IC chip, an optical signal passing region 1742 is formed in a manner so as to penetrate through the substrate 1721, the insulating layer 1722 and the solder resist layer 1734.

This optical signal passing region 1742 is filled with a resin composition 1747 at a portion that penetrates through the substrate 1721, the insulating layer 1722 and the solder resist layer 1734.

On one of the faces of the substrate 1720 for mounting an IC chip, a light emitting element 1738 is surface-mounted with a solder connecting portion 1744 such that a light emitting portion 1738a confronts the optical signal passing region 1742. Although not shown in the figure, with solder connecting portions, an IC chip is surface-mounted on a face of the substrate 1720 for mounting an IC chip on the same side as the side on which the light emitting element 1738 is mounted.

The substrate 2720 for mounting an IC chip has a structure in which a conductor circuit 2724 and an insulating layer 2722 are laminated on both faces of a substrate 2721, and the conductor circuits with the substrate 2721 interposed there between, and the conductor circuits with the insulating layer 2722 interposed there between are electrically connected by plated through holes and via holes 2727 (not shown in the figure), respectively. Moreover, a solder resist layer 2734 is formed on the outermost layer.

In this substrate 2720 for mounting an IC chip, an optical signal passing region 2742 is formed so as to penetrate through the substrate 2721, the insulating layer 2722 and the solder resist layer 2734.

This optical signal passing region 2742 is filled with a resin composition 2747 at a portion that penetrates through the substrate 2721, the insulating layer 2722 and the solder resist layer 2734.

On one face of the substrate 2720 for mounting an IC chip, a light receiving element 2739 is surface-mounted with a solder connecting portion 2744 such that a light emitting portion 2739a confronts the optical signal passing region 2742. Although not shown in the figure, with solder connecting portions, an IC chip is surface-mounted on a face on the same side as the side on which the light receiving element 2739 of the substrate 2720 for mounting an IC chip is mounted.

The substrate 720 for a motherboard has a structure in which a conductor circuit 744 and an insulating layer 722 are laminated on both faces of a substrate 721, and the conductor circuits with the substrate 721 interposed there between, and the conductor circuits with the insulating layer 722 interposed there between are electrically connected by plated through holes 729 and via holes (not shown in the figure). Moreover, a solder resist layer 734 is formed on the outermost layer.

In this substrate 720 for a motherboard, an optical signal passing region 742 is formed so as to penetrate through the substrate 721, the insulating layer 722 and the solder resist layer 734.

This optical signal passing region 742 is filled with a resin composition 747 at a portion that penetrates through the substrate 721, the insulating layer 722 and the solder resist layer 734.

The portion penetrating through the solder resist layer 734 has the same diameter as the diameter of the portion penetrating through the substrate 721 and the insulating layer 722, and the shape of the longitudinal section of the portion penetrating through the solder resist layer 734 is a rectangular shape.

On the outermost layer of the insulating layer 722 on the opposite side from the side on which the substrates 1720 and 2720 for mounting an IC chip for the substrate for a motherboard 720 are mounted, an optical waveguide 750 constituted by a core 751 and a clad 752 is formed.

Moreover, an optical path conversion mirror is formed at each end of the optical waveguide 750 such that an optical signal can be transmitted between the optical waveguide 750 and the optical signal passing region 742.

Moreover, on an end portion the opposite side from the side on which the optical waveguide 750 for the optical signal passing region 742 is formed, microlenses 746a and 746b are arranged. Here, the microlenses 746a and 746b are respectively arranged at positions corresponding to the ends of the core 751, each of which has the optical path conversion mirror formed thereon.

In the device 760 for optical communication, with solder connecting portions 1743 and 2743, the substrates 1720 and 2720 for mounting an IC chip are mounted on the face of the substrate 720 for a motherboard, of which is opposite from the side on which the optical waveguide 750 is formed.

Here, the substrates 1720 and 2720 for mounting an IC chip are respectively mounted on predetermined positions through the self-alignment function.

In the device 760 for optical communication having such configuration, an electric signal emitted from the IC chip (not shown in the figure) mounted on the substrate 1720 for mounting an IC chip is converted to an optical signal in the light emitting element 1738, and the optical signal emitted from the light emitting element 1738 (light emitting portion 1738a) is transmitted to the light receiving element 2739 (light receiving portion 2739a) via the optical signal passing region 1742, the microlens 1746, the microlens 746a, the optical signal passing region 742, the optical waveguide 750, the optical signal passing region 742, the microlens 746b, the microlens 2746 and the optical signal passing region 2742. After having been converted to an electric signal in the light receiving element 2739, the resulting signal is transmitted through the microlens to the IC chip (not shown in the figure) mounted on the substrate 2720 for mounting an IC chip and processed therein.

In such device for optical communication, since the optical signal is transmitted via the microlenses arranged on the end portions of the optical signal passing regions, the optical signal can be transmitted positively.

Here, the embodiment of the device for optical communication according to the third aspect of the present invention is not intended to be limited by the embodiment shown in FIG. 8, and, for example, an embodiment shown in FIG. 9 may also be applied.

FIG. 9 is a cross-sectional view that schematically shows another example of the embodiment of the device for optical communication according to the third aspect of the present invention.

FIG. 9 shows a device 860 for optical communication having a structure in which a substrate 1820 for mounting an IC chip with a light emitting element 1838 mounted thereon and a substrate 2820 for mounting an IC chip with a light receiving element 2839 mounted thereon are mounted on a substrate 820 for a motherboard.

In comparison with the device 760 for optical communication shown in FIG. 8, the device 860 for optical communication is designed so that the structure of the substrate 820 for a motherboard is the same as the structure of the substrate 720 for a motherboard, although the structures of the substrates 1820 and 2820 for mounting an IC chip therein are different.

Therefore, explanation for the embodiment of the device 860 for optical communication, mainly in relation to the structures of the substrates 1820 and 2820 for mounting an IC chip, will be given below.

The substrate 1820 for mounting an IC chip has a structure in which a conductor circuit 1844 and an insulating layer 1822 are laminated on both faces of a substrate 1821, and the conductor circuits with the substrate 1821 interposed there between, and the conductor circuits with the insulating layer 1822 interposed there between are electrically connected by plated through holes 1829 and via holes 1827, respectively. Moreover, a solder resist layer 1834 is formed on the outermost layer.

The substrate 1820 for mounting an IC chip has an optical signal passing region 1842 that is formed into a concave shape.

A light emitting element 1838 and an IC chip (not shown in the figure) are mounted inside the optical signal passing region 1842 by wire bonding 1849, and a resin composition 1847 is filled into the optical signal passing region.

Moreover, a microlens 1846 is arranged on an end portion of the optical signal passing region 1842 on the opposite side from the side on which the light emitting element 1838 is mounted.

The substrate 2820 for mounting an IC chip has a structure in which a conductor circuit 2844 and an insulating layer 2822 are laminated on both faces of a substrate 2821, and the conductor circuits with the substrate 2821 interposed there between, and the conductor circuits with the insulating layer 2822 interposed there between are electrically connected by plated through holes 2829 and via holes 2827, respectively. Moreover, a solder resist layer 2834 is formed on the outermost layer.

The substrate 2820 for mounting an IC chip has an optical signal passing region 2842 that is formed into a concave shape.

A light receiving element 2839 and an IC chip (not shown in the figure) are mounted inside the optical signal passing region 2842 by wire bonding 2848, and a resin composition 2847 is filled into the optical signal passing region.

Moreover, a microlens 2846 is arranged on an end portion of the optical signal passing region 2842 on the opposite side from the side on which the light receiving element 2839 is mounted.

As described above, the substrate 820 for a motherboard has the same structure as that of the substrate for a motherboard shown in FIG. 8.

In the device 860 for optical communication, with solder connecting portions 1843 and 2843, the substrates 1820 and 2820 for mounting an IC chip are mounted on the face of the substrate 820 for a motherboard on the opposite side from the side on which the optical waveguide 850 is formed.

Here, the substrates 1820 and 2820 for mounting an IC chip are respectively mounted on predetermined positions through self-alignment function of the solder.

In the device 860 for optical communication having the above-mentioned configuration, an electric signal emitted from the IC chip mounted on the substrate 1820 for mounting an IC chip (not shown in the figure) is converted to an optical signal in the light emitting element 1838, and the optical signal emitted from the light emitting element 1838 (light emitting portion 1838a) is transmitted to the light receiving element 2839 (light receiving portion 2839a) via the optical signal passing region 1842, the microlens 1846, the microlens 846a, the optical signal passing region 842, the optical waveguide 850, the optical signal passing region 842, the microlens 846b, the microlens 2846 and the optical signal passing region 2842. After having been converted to an electric signal in the light receiving element 2839, the resulting signal is transmitted to the IC chip mounted on the substrate 2820 for mounting an IC chip (not shown in the figure) to be processed therein.

In such device for optical communication, since the optical signal is transmitted via the microlenses arranged on the end portions of the optical signal passing regions, the optical signal can be transmitted positively.

Here, in the device for optical communication shown in FIGS. 8 and 9, one channel optical elements (light emitting element and light receiving element) are mounted on the substrate for mounting an IC chip, and the optical signal passing region used for transmitting an one channel optical signal is formed on each of the substrates for mounting an IC chip and on the substrate for a motherboard.

However, the embodiment of the device for optical communication according to the third aspect of the present invention is not intended to be limited by the embodiments shown in FIGS. 8 and 9, and any mode may be used as long as the substrate for mounting an IC chip according to the first aspect of the present invention is mounted on the substrate for a motherboard according to the second aspect of the present invention.

Therefore, a multichannel optical element may be mounted on the substrate for mounting an IC chip, and both the substrate for mounting an IC chip and the substrate for a motherboard may be provided with an optical signal passing region of the batch through hole structure, an optical signal passing region of the individual through hole structure, and the like, so as to transmit an optical signal from the multichannel optical element.

When plural substrates for mounting an IC chip are mounted on the substrate for a motherboard, substrates for mounting an IC chip having different structures in the optical signal passing region, such as a substrate for mounting an IC chip with an optical signal passing region of a batch through hole structure formed thereon and a substrate for mounting an IC chip with an optical signal passing region with a concave-shape formed thereon, may be mounted on a single substrate for a motherboard.

Furthermore, a microlens array may also be arranged with an adhesive on a substrate for mounting an IC chip and a substrate for a motherboard that constitute the device for optical communication according to the third aspect of the present invention.

Explanation for a desirable thickness of the substrate for mounting an IC chip and the substrate for a motherboard will be given below, by exemplifying the device for optical communication according to the embodiment shown in FIG. 8.

More specifically, for example, when a PD (light receiving diameter: φ60 to 80 μm) is used as the light receiving element; a microlens array with a pitch of 250 μm (diameter: 100 to 240 μm, sag height: 3 to 120 μm) is used as the microlens; and an optical waveguide with a core size of 50×50 μm is used as the optical waveguide, it is desirable that the substrate for mounting an IC chip has the thickness in the range of 0.5 to 1.6 mm when an implanted-type VCSEL element (spreading angle: 8 degrees, light-emitting area diameter: φ15 μm) is used as the light emitting element. It is desirable that the substrate for mounting an IC chip has the thickness in the range of 0.5 to 0.9 mm when an oxidation constriction type light emitting element (spreading angle: 15 degrees, light-emitting area diameter: φ18 μm) is used as the light emitting element. Moreover, it is desirable that the substrate for mounting an IC chip has the thickness of about 0.5 mm when an oxidation constriction type light emitting element (spreading angle: 25 degrees, light-emitting area diameter: φ18 μm) is used as the light emitting element. If the thickness is less than 0.5 mm, warping may easily occur in the substrate.

It is desirable that the substrate for a motherboard has the thickness in the range of 0.5 to 0.75 mm.

Moreover, within the above-mentioned range of the microlens, it is more desirable that the diameter is in the range of 200 to 240 μm, and the sag height is in the range of 5 to 50 μm.

Here, the desired thickness of the substrate for mounting an IC chip and the substrate for a motherboard as well as the desired shape of a microlens are clarified through simulations by the use of an optical designing software program ZEMAX (produced by focus Software, INC.).

A detailed explanation for a desired shape of a microlens to be arranged in the device for optical communication according to the third aspect of the present invention will be given below in detail.

Here, a device for optical communication having almost the same mode as the mode shown in FIG. 8 will be described as an example.

More specifically, desirable shapes of the microlens 1746 formed on the substrate 1720 for mounting an IC chip, the microlens 2746 formed on the substrate 2720 for mounting an IC chip and the microlenses 746a and 746b formed on the substrate 720 for a motherboard, in particular, desirable sag heights of the microlenses when the diameter of each of the microlenses is set to 220 μm, are clarified through simulation processes by examining a device for optical communication in which: as the substrate 2720 for mounting an IC chip is used a substrate for mounting an IC chip having a thickness of 0.7 mm on which a four channel light receiving element 2739 having a light-receiving diameter of +70 μm is mounted, and an optical signal passing region of the batch through hole structure having in its plan view a rectangular shape with an arc formed on each corner thereof is formed; as the substrate 1720 for mounting an IC chip is used a substrate for mounting an IC chip having a thickness of 0.7 mm on which a four channel light emitting element 1738 with a spreading angle of 8 degrees is mounted, and an optical signal passing region of the batch through hole structure having in its plan view a rectangular shape with an arc formed on each corner thereof is formed; and as the substrate 720 for a motherboard is used a substrate for a motherboard having a thickness of 0.7 mm on which an optical waveguide in which a core having a size of 50 μm in width×50 μm in thickness is sandwiched by clads having a thickness of 50 μm is formed, and an optical signal passing region of the batch through hole structure having in its plan view a rectangular shape with an arc formed on each corner thereof is formed.

Here, the microlens 2746 arranged on the substrate 2720 for mounting an IC chip is used for allowing an optical signal to converge on the light receiving portion 2739a of the light receiving element 2739; the microlens 1746 arranged on the substrate for mounting an IC chip 1720 is used for forming the optical signal into collimated light; and the microlenses 746a and 746b arranged on the substrate 720 for a motherboard are used to converge the optical signal toward the core 751 of the optical waveguide 750 and to convert the optical signal to collimated light, respectively.

Moreover, with respect to the evaluation of each microlens, the microlens 1746 arranged on the substrate 1720 for mounting an IC chip is evaluated, after the fabricating of the substrate 1720 for mounting an IC chip, and prior to the mounting thereof on the substrate for a motherboard, by calculating a condensing distance based on a NFP (Near Field Pattern) of a power meter. The microlens 746a arranged on the substrate 720 for a motherboard is evaluated, after the mounting of the substrate 1720 for mounting an IC chip on the substrate 720 for a motherboard, by the NFP of the end portion of the optical waveguide 750 on the side confronting the light emitting element. The microlens 746b arranged on the substrate for a motherboard is evaluated by the NFP in the mouthing region of the substrate 2720 for mounting an IC chip. The microlens 2746 arranged on the substrate 2720 for mounting an IC chip is evaluated, after the mounting of the substrate 2720 for mounting an IC chip without the light receiving element 2739 mounted thereon, by the NFP in the region where the light receiving element 2739 is to be mounted.

As a result, it is desirable that the microlens 746a arranged on the substrate 720 for a motherboard has the sag height of 12 μm in upper limit and 10 μm in lower limit. Within this range, the transmitted light can be positively made into collimated light.

It is also desirable that the focal length of the microlens 746a is within the range of 0.75±0.05 mm.

Moreover, it is desirable that the microlens 1746 arranged on the substrate 1720 for mounting an IC chip with the light emitting element mounted thereon has the sag height of 10 μm in upper limit and 8 μm in lower limit. Within this range, the transmitted light can be positively made into collimated light.

Furthermore, it is desirable that the microlens 2746 arranged on the substrate 2720 for mounting an IC chip with the light receiving element mounted thereon has the sag height of 12 μm in upper limit and 10 μm in lower limit. Within this range, the transmitted light can be positively made into collimated light. It is also desirable that the focal length of the microlens 2746 is within the range of 0.75±0.05 mm.

It is desirable that the microlens 746b arranged on the substrate 720 for a motherboard has the sag height of 10 μm in upper limit and 8 μm in lower limit. Within this range, the transmitted light can be positively made into collimated light.

The same results were also obtained in the device for optical communication according to the embodiment shown in FIG. 9.

Hereinbefore, the desirable sag height has been described with the thickness of the substrate for mounting an IC chip and the substrate for a motherboard being equal; however, it is of course understood that the desirable sag height changes depending on the thickness of the substrate for mounting an IC chip and the substrate for a motherboard.

Moreover, by using the same system as the system in which the desirable sag height of the above-mentioned microlens was simulated, the desirable thickness of the substrate for a motherboard when the diameter of the microlens is fixed to 220 μm while the sag height of the microlens was changed, was further examined.

As a result, it is desirable that the substrate for a motherboard has the thickness in the range of 1.525 to 0.325 μm when the microlens formed at a portion of the substrate for a motherboard confronting the light emitting element having the sag height changed within the range of 7 to 19 μm was examined.

It is also desirable that, when the microlens formed in the substrate for mounting an IC chip with the light receiving element mounted thereon having the sag height changed within the range of 7 to 19 μm, the substrate for mounting an IC chip with a light receiving element mounted thereon has the thickness in the range of 1.525 to 0.325 μm.

As described above, the device for optical communication according to the third aspect of the present invention has a structure in which the substrate for mounting an IC chip according to the first aspect of the present invention is mounted on the substrate for a motherboard according to the second aspect of the present invention.

Accordingly, it is desirable that, in the above-mentioned substrate for a motherboard, the spot region made on the core of the optical waveguide by the light that enters the optical waveguide via the microlens overlaps the core by 35% or more, and in the above-mentioned substrate for mounting an IC chip of which a light receiving element is used as the optical element, it is desirable that the spot region made on the light receiving portion of the light receiving element by the light that enters the light receiving element via the microlens overlaps the light receiving portion by 22% or more.

In the device for optical communication according to the present invention (for example, the embodiment shown in FIG. 8), how much light emitted from the light emitting element can be converged on the core of the optical waveguide and how much light emitted from the core can be converged on the light receiving portion of the light receiving element are factors to cause effects on the transmission loss of an optical signal transmitted between the light emitting element and the light receiving element via the optical waveguide.

Therefore, the following tests were conducted so as to evaluate the transmitting property of the optical signal by referring to the degree of overlapped light made on the core by the spot region of light that enters the core of the optical waveguide and the degree of overlapped light made on the light receiving portion by the spot region of light that enters the light receiving portion of the light receiving element.

In this case were evaluated the degree of overlapped light made on the core by the spot region of light that enters the core of the optical waveguide and the degree of overlapped light made on the light receiving portion by the spot region of light that enters the light receiving portion of the light receiving element, which were required when the optical waveguide to be formed on the substrate for a motherboard has its length changed to 5, 50 and 100 cm, and optical signals to be transmitted have transmission rates of 2.5 Gbps and 10 Gbps. Here, the above-mentioned evaluation processes were carried out by using the device for optical communication of the embodiment shown in FIG. 8.

More specifically, the evaluation processes were carried out by using a device for optical communication in which: as the substrate 2720 for mounting an IC chip, a substrate for mounting an IC chip having a thickness of 0.7 mm with a microlens arranged thereon on which a four channel light receiving element 2739 with a light-receiving diameter of φ80 μm is mounted, and an optical signal passing region of the batch through hole structure having in its plan view a rectangular shape with an arc formed on each corner thereof is formed; as the substrate 1720 for mounting an IC chip, a substrate for mounting an IC chip having a thickness of 0.7 mm with a microlens arranged thereon on which a four channel light emitting element 1738 with a spreading angle of 24 degrees is mounted, and an optical signal passing region of the batch through hole structure having in its plan view a rectangular shape with an arc formed on each corner thereof is formed; and as the substrate 720 for a motherboard, a substrate for a motherboard having a thickness of 0.7 mm with a microlens mounted thereon on which an optical waveguide (transmission loss: 0.08 dB/cm) with a core having a size of 50 μm in width×50 μm in thickness is sandwiched by clads having a thickness of 50 μm is formed, and an optical signal passing region of the batch through hole structure having in its plan view a rectangular shape with an arc formed on each corner thereof is formed.

Here, all the optical signal passing regions are filled with a resin composition with the transmittance of 90%/mm. Moreover, a metal mirror is formed on both ends of the optical waveguide, and the transmission loss caused by this mirror is 0.5 dB.

Moreover, with respect to the transmission loss caused by each of the constituent members of the device for optical communication, the transmission loss between the light emitting element and the optical waveguide as well as between the optical waveguide and the light receiving element is 1 dB; the transmission loss of the optical waveguides of 5 cm, 50 cm and 100 cm are 0.4 dB, 4 dB and 8 dB, respectively; and the transmission loss of the optical path conversion mirror is as described above.

By taking into consideration that, when the transmission rates are 2.5 Gbps and 10 Gbps, the permissible transmission loss of the entire device for optical communication are 18 dB and 14 dB, respectively, the following results were obtained by calculating the permissible losses in the optical waveguide and the light receiving portion, and the degree of overlapped light made on the core by the spot region of light that enters the core of the optical waveguide and the degree of overlapped light made on the light receiving portion by the spot region of light that enters the light receiving portion of the light receiving element.

With respect to the degree of overlapped light made on the light receiving portion by the spot region of light that enters the light receiving portion of the light receiving element, it became clear that an optical signal can be transmitted when (1) the transmission rate is 2.5 Gbps and the optical waveguide is 5 cm and the degree of overlapped light made on the light receiving portion by the spot region of light that enters the light receiving portion of the light receiving element becomes 22% or more, since the transmission loss in the light receiving portion becomes 7.3 dB or less, (2) the transmission rate is 10 Gbps and the optical waveguide is 5 cm and the light receiving portion is overlapped by the spot region by 32% or more, since the transmission loss in the light receiving portion becomes 5.3 dB or less, (3) the transmission rate is 2.5 Gbps and the optical waveguide is 50 cm and the light receiving portion is overlapped by the spot region by 30% or more, since the transmission loss in the light receiving portion becomes 5.3 dB or less, (4) the transmission rate is 2.5 Gbps and the optical waveguide is 100 cm as well as when the transmission rate is 10 Gbps and the optical waveguide is 50 cm and when the light receiving portion is overlapped by the spot region by 43% or more, since the transmission loss in the light receiving portion becomes 3.5 dB or less, and (5) the transmission rate is 10 Gbps and the optical waveguide is 100 cm and the light receiving portion is overlapped by the spot region by 66% or more, since the transmission loss in the light receiving portion becomes 1.5 dB or less.

With respect to the degree of overlapped light made on the core by the spot region of light that enters the core of the optical waveguide, it became clear that an optical signal can be transmitted when (1) the transmission rate is 2.5 Gbps and the optical waveguide is 5 cm and the degree of overlapped light made on the core by the spot region of light that enters the core of the optical waveguide becomes 35% or more, since the transmission loss in the core becomes 7.3 dB or less, (2) the transmission rate is 10 Gbps and the optical waveguide is 5 cm and the core is overlapped by the spot region by 43.5% or more, since the transmission loss in the core becomes 5.3 dB or less, (3) the transmission rate is 2.5 Gbps and the optical waveguide is 50 cm and the core is overlapped by the spot region by 42% or more, since the transmission loss in the core becomes 5.5 dB or less, (4) the transmission rate is 2.5 Gbps and the optical waveguide is 100 cm as well as when the transmission rate is 10 Gbps and the optical waveguide is 50 cm and when the core is overlapped by the spot region by 49% or more, since the transmission loss in the core becomes 3.5 dB or less, and (5) the transmission rate is 10 Gbps and the optical waveguide is 100 cm and the core is overlapped by the spot region by 66% or more, since the transmission loss in the core becomes 1.5 dB or less.

These results indicate that, in the above-mentioned substrate for a motherboard, it is desirable that the spot region made on the core of the optical waveguide by light that enters the optical waveguide via the microlens overlaps the core by 35% or more, and that, in the above-mentioned substrate for mounting an IC chip of which a light receiving element is used as the optical element, it is desirable that the spot region made on the light receiving portion of the light receiving element by light that enters the light receiving element via the microlens overlaps the light receiving portion by 22% or more.

Explanation for a manufacturing method of the device for optical communication according to the third aspect of the present invention will be given below.

The device for optical communication according to the third aspect of the present invention can be manufactured through processes in which, after the substrate for mounting an IC chip according to the first aspect of the present invention and the substrate for a motherboard according to the second aspect of the present invention have been manufactured separately through the above-mentioned manufacturing methods, the two substrates are connected to each other via solder and the like.

More specifically, a device for optical communication is formed by placing the substrate for mounting an IC chip with solder bumps formed thereon and the substrate for a motherboard on which solder bumps are formed at predetermined positions in predetermined directions such that they are aligned to face each other, and then connecting the two substrates to each other through are flow process.

Here, among the faces of the substrate for mounting an IC chip and the substrate for a motherboard of which is confronting each other, there may be a case in which the solder bumps are formed only on either of the faces.

This is because the two substrates may be electrically connected even in such a case.

Moreover, at the time of manufacturing the device for optical communication, it is not necessarily required to take the method in which, after the substrate for mounting an IC chip and the substrate for a motherboard have been completed, the two substrates are connected, and the following method may be used.

In other words, the device for optical communication may be manufactured by, referring to the manufacturing process for the substrate for a motherboard, laminating a conductor circuit and an insulating layer on at least one surface of a substrate, and thereafter, prior to forming an optical waveguide, mounting a substrate for mounting an IC chip with an optical element mounted thereon, and then carrying out a process for affixing the optical waveguide thereon.

In this case, a positioning process of the optical waveguide by a passive alignment process using an alignment mark may be used; however, since the positioning process of the optical waveguide may also be carried out by an active alignment process, a positional deviation (error from the designed value) of the light waveguide can be minimized.

Moreover, the mounting of the substrate for mounting an IC chip can be carried out, for example, based upon an alignment mark preliminarily formed on the substrate for a motherboard or within the optical signal passing region.

Explanation for a device for optical communication according to the fourth aspect of the present invention will be given below.

A fourth aspect of the present invention is a device for optical communication comprising: an optical element or a substrate for mounting an IC chip with the optical element mounted thereon mounted on a substrate for a motherboard having a conductor circuit and an insulating layer laminated and an optical waveguide formed on at least one face of a substrate, wherein at least one microlens is arranged on an optical path connecting said optical waveguide and said optical element, and light that enters said optical waveguide or said optical element is converged via the microlens.

In the device for optical communication according to the fourth aspect of the present invention, since a microlens is arranged on the optical path connecting the optical waveguide and the optical element, and light that enters the optical waveguide or the optical element is converged via the microlens, an optical signal can be positively transmitted to the optical waveguide and the optical element, and thus an excellent transmitting property of optical signals can be provided.

The device for optical communication according to the fourth aspect of the present invention is constituted by a substrate for a motherboard and an optical element or a substrate for mounting an IC chip with the optical element mounted thereon.

Here, the substrate for a motherboard may be the same as the substrate for a motherboard that constitutes the device for optical communication according to the third aspect of the present invention.

The optical element and the substrate for mounting an IC chip with the optical element mounted thereon may be the same as the optical element and the substrate for mounting an IC chip that constitute the device for optical communication according to the third aspect of the present invention.

When the device for optical communication is constituted by such a substrate for a motherboard, optical element and substrate for mounting an IC chip, at least one microlens is arranged on an optical path connecting the optical waveguide and the optical element, and light that enters the optical waveguide or the optical element is configured to be converged via the microlens.

In the device for optical communication according to the fourth aspect of the present invention, the at least one microlens arranged on the optical path connecting the optical waveguide and the optical element is not arranged on an end portion of the optical signal passing region as in the device for optical communication according to the third aspect of the present invention, and may be arranged within the optical signal passing region.

Explanation for the embodiment in which the microlens is formed within the optical signal passing region will be given below, by making reference to the drawings.

FIG. 21 is a cross-sectional view that schematically shows one example of the device for optical communication according to the fourth aspect of the present invention.

FIG. 21 shows a device 960 for optical communication in which a light emitting element 938 and a light receiving element 939 are directly mounted on a substrate 920 for a motherboard.

The substrate 920 for a motherboard has a structure that a conductor circuit 924 and an insulating layer 922 are laminated on both faces of a substrate 921, and the conductor circuits with the substrate 921 interposed there between, and the conductor circuits with the insulating layer 922 interposed there between are electrically connected by plated through holes 929 and via holes (not shown in the figure), respectively. Moreover, a solder resist layer 934 is formed on the outermost layer.

In this substrate 920 for a motherboard, an optical signal passing region 942 is provided so as to penetrate through the substrate 921, the insulating layer 922 and the solder resist layer 934.

A part of this optical signal passing region 942 is filled with a resin composition 947 at a portion that penetrates through the substrate 921 and the insulating layer 922.

Moreover, inside the optical signal passing region 942, and on an end portion on the opposite side from the side on which the optical waveguide 950 is arranged, microlenses 946a and 946b are arranged. Here, the microlenses 946a and 946b are arranged at positions corresponding to the ends of the core 951, respectively.

On the outermost layer of the insulating layer 922 on the opposite side from the side on which the light emitting element 938 and the light receiving element 939 of the substrate 920 for a motherboard are mounted, an optical waveguide 950 constituted by a core 951 and a clad 952 is formed.

Moreover, an optical path conversion mirror is formed at each end of the optical waveguide 950 such that an optical signal can be transmitted between the optical waveguide 950 and the optical signal passing region 942.

At positions of the substrate 920 for a motherboard corresponding to the optical signal passing region 942 on the surface the opposite side from the side on which the optical waveguide 950 is formed, the light emitting element 938 and the light receiving element 939 are mounted through solder connecting portion 944, respectively.

Here, both the light emitting element 938 and the light receiving element 939 are mounted on predetermined positions by the self-alignment function.

Since, in the device 960 for optical communication having such configuration, an optical signal emitted from the light emitting element 938 (light emitting portion 938a) is transmitted to the light receiving element 939 (light receiving portion 939a) via the optical signal passing region 942 made of air, the microlens 946a, the optical signal passing region 942 filled with a resin composition, the optical waveguide 750, the optical signal passing region 942 filled with a resin composition, the microlens 946b and the optical signal passing region 942 made of air, the optical signal can be positively transmitted.

The reason why the optical signal can be positively transmitted as described above is because, here, the microlens 946a allows the optical signal from the light emitting element 938 to be converged toward the core 951 of the optical waveguide 950, and the microlens 946b allows the optical signal from the core 951 of the optical waveguide 950 to be converged toward the light receiving element 939.

Moreover, the substrate for a motherboard that constitutes the device for optical communication according to the fourth aspect of the present invention may be prepared as a substrate for a motherboard in which an optical waveguide is formed on the outermost layer on the side confronting the optical element or the substrate for mounting an IC chip. Explanation for an embodiment of the device for optical communication having such a configuration will be given below, by making reference to the drawings.

The explanation will be given by making reference to FIGS. 22 and 23. FIG. 22 is a cross-sectional view that schematically shows one example of the embodiment of the device for optical communication according to the fourth aspect of the present invention.

FIG. 22 shows a device 3160 for optical communication in which a substrate 4120 for mounting an IC chip with a light emitting element 4138 mounted thereon and a substrate 5120 for mounting an IC chip with a light receiving element 5139 mounted thereon are mounted on a substrate 3120 for a motherboard.

The substrate 3120 for a motherboard has a structure that a conductor circuit 3144 and an insulating layer 3122 are laminated on both faces of a substrate 3121, and the conductor circuits with the substrate 3121 interposed there between, and the conductor circuits with the insulating layer 3122 interposed there between are electrically connected by plated through holes 3129 and via holes (not shown in the figure), respectively.

An optical waveguide 3150 constituted by a core 3151 and a clad 3152 is formed on a part of the outermost layer on the side on which the substrate for mounting an IC chip is mounted, and optical path conversion mirrors are formed on each end of this optical waveguide 3150, such that an optical signal can be transmitted between the light emitting element and the light receiving element mounted on the substrate for mounting an IC chip, which will be described later. Moreover, a solder resist layer is formed on a region other than the region on which the optical waveguide 3150 is formed on the outermost layer of the substrate 3120 for a motherboard.

Here, the substrate 3120 for a motherboard has neither an optical signal passing region formed thereon, nor microlens arranged thereon, as in the substrate 920 for a motherboard shown in FIG. 8.

On the side of the substrate 3120 for a motherboard on which the optical waveguide 3150 is formed, the substrate 4120 for mounting an IC chip with a light emitting element 4138 mounted thereon and the substrate 5120 for mounting an IC chip with a light receiving element 5139 mounted thereon are mounted.

Here, the substrates 4120 and 5120 for mounting an IC chip have the same configurations as the substrates 1720 and 2720 for mounting an IC chip shown in FIG. 8, respectively. Therefore, the explanation for the substrates for mounting an IC chip will be omitted. The reason why number of the connecting portions of the substrate for a motherboard is different between the substrates 4120 and 5120 for mounting an IC chip shown in FIG. 22 and the substrates 1720 and 2720 for mounting an IC chip shown in FIG. 8, is because the drawings are formed so as to clarify the modes of the optical waveguides, and the configurations are substantially the same.

In the device 3160 for optical communication having such configuration, an optical signal emitted from a light emitting element 4138 (light emitting portion 4138a) is transmitted to a light receiving element 5139 (light receiving portion 5139a) via an optical signal passing region 4142, a microlens 4146a, the optical waveguide 3150, a microlens 5146a and the optical signal passing region 5142.

In this case, since the microlens 4146a allows the optical signal from the light emitting element 4138 to be converged toward the core 3151 of the optical waveguide 3150, and the microlens 5146a allows the optical signal from the core 3151 of the optical waveguide 3150 to be converged toward the light receiving element 5139, the optical signal can be positively transmitted between the light emitting element and the light receiving element.

In the device for optical communication according to the fourth aspect of the present invention, it is desirable that at least two of the above-mentioned microlenses are arranged, and light emitted from the optical waveguide or the optical element is converged or is formed into converged light.

As a specific embodiment of this configuration, for example, a mode in which a substrate for mounting an IC chip is mounted on a substrate for a motherboard as shown in FIG. 8, and modes of the like may be used.

Since light emitted from the optical waveguide or the optical element is converged or is formed into collimated light in the device for optical communication in this embodiment, the light is not reflected on the wall faces of the optical signal passing region at the time of transmitting an optical signal, and can be transmitted between the optical element and the optical waveguide more easily. Therefore, it will be difficult for the attenuation of the optical signal due to reflection on the wall faces of the optical signal passing region to occur, and the optical signal can be positively transmitted between the optical element and the optical waveguide.

With respect to another embodiment, for example, an embodiment as shown in FIG. 23 may be used. FIG. 23 is a cross-sectional view that schematically shows one example of the embodiment of the device for optical communication according to the fourth aspect of the present invention.

FIG. 23 shows a device 3260 for optical communication in which a substrate 4220 for mounting an IC chip with a light emitting element 4238 mounted thereon and a substrate 5220 for mounting an IC chip with a light receiving element 5239 mounted thereon are mounted on a substrate 3220 for a motherboard.

Since the configuration of the substrate 3220 for a motherboard is the same as the configuration of the substrate 3120 for a motherboard shown in FIG. 22, the explanation therefor will be omitted.

On the side of the substrate 3220 for a motherboard on which the optical waveguide 3250 is formed, the substrate 4220 for mounting an IC chip with a light emitting element 4238 mounted thereon and the substrate 5220 for mounting an IC chip with a light receiving element 5239 mounted thereon are mounted.

Here, the substrates 4220 and 5220 for mounting an IC chip have the same configurations as the substrates 4120 and 5120 for mounting an IC chip shown in FIG. 22, respectively, except for the difference between the arrangement positions of the microlenses. Therefore, explanation for only the arrangement positions of the microlenses will be given below.

In the substrates 4120 and 5120 for mounting an IC chip, the microlens is arranged on only the end portion of the optical signal passing region on the opposite side from the side on which the optical element is mounted. In contrast, in the substrate 4220 for mounting an IC chip, microlenses 4246a and 4246b are arranged on the both end portions of the optical signal passing region 4242, and in the substrate 5220 for mounting an IC chip, microlenses 5246a and 5246b are arranged on the both end portions of the optical signal passing region 5242.

In the device 3260 for optical communication having the such configuration, an optical signal emitted from the light emitting element 4238 (light emitting portion 4238a) is transmitted to the light receiving element 5239 (light receiving portion 5239a) via the microlens 4246b, the optical signal passing region 4242, the microlens 4246a, the optical waveguide 3250, the microlens 5246a, the optical signal passing region 5242 and the microlens 5246b. Here, the microlens 4246b forms the optical signal from the light emitting element 4238 into collimated light, and the microlens 4246a allows the optical signal to be converged toward the core 3251 of the optical waveguide 3250, and in addition, the microlens 5246a forms the optical signal from the core 3251 of the optical waveguide 3250 into collimated light, and the microlens 5246b allows the optical signal to be converged toward the light receiving element 5239, and thus, the optical signal can be positively transmitted.

As described above, the embodiment as shown in FIG. 8 is also one of the embodiments of the present invention, but when the device for optical communication according to the fourth aspect of the present invention has a structure in which a substrate for mounting an IC chip with an optical element mounted thereon is mounted on a substrate for a motherboard, only at least one microlens is to be arranged on an optical path connecting the optical waveguide and the optical element, and it is not necessarily required for microlenses to be arranged on both the substrate for a motherboard and the substrate for mounting an IC chip.

More specifically, for example, the device for optical communication according to the fourth aspect of the present invention include an embodiment that is almost the same as the device for optical communication shown in FIG. 8 and has a microlens arranged only on the substrate for a motherboard side, an embodiment that is almost the same as the device for optical communication shown in FIG. 8 and has a microlens arranged only on the substrate for mounting an IC chip side (see FIG. 24) and an embodiment that is almost the same as the device for optical communication shown in FIG. 8, and has a structure in which microlenses are arranged only on the substrate for mounting an IC chip with a light emitting element mounted thereon and on the end portion of the optical signal passing region of the substrate for a motherboard on the side confronting the substrate for mounting an IC chip with a light receiving element mounted thereon, and embodiments of the like.

As the method for manufacturing the device for optical communication according to the fourth aspect of the present invention, the same method as the method for manufacturing the device for optical communication according to the third aspect of the present invention may be used.

Explanation for a device for optical communication according to the fifth aspect of the present invention will be given below.

The device for optical communication according to the fifth aspect of the present invention is a device for optical communication comprising: a substrate for mounting an IC chip with a light emitting element mounted thereon and a substrate for mounting an IC chip with a light receiving element mounted thereon mounted on a substrate for a motherboard having a conductor circuit and an insulating layer laminated and an optical waveguide formed on at least one face of a substrate, wherein an optical signal passing region optically connected to both ends of the optical waveguide is formed in the substrate for a motherboard, and a microlens is arranged on an end portion of the optical signal passing region on the opposite side from the side that is optically connected to the optical waveguide, an optical signal passing region optically connected to the light emitting element is formed in the substrate for mounting an IC chip with the light emitting element mounted thereon, and a microlens is arranged on an end portion of the optical signal passing region on the opposite side from the side that is optically connected to the light emitting element, an optical signal passing region optically connected to the light receiving element is formed in the substrate for mounting an IC chip with the light receiving element mounted thereon, and a microlens is arranged on an end portion of the optical signal passing region on the opposite side from the side that is optically connected to the light receiving element, and light emitted from the light emitting element is formed into collimated light via the microlens arranged on the substrate for mounting an IC chip with the light emitting element mounted thereon, the collimated light is converged via one of the microlenses arranged on the substrate for a motherboard to enter one end of the optical waveguide, and then is transmitted through the optical waveguide, and light emitted from the other end of the optical waveguide is formed into collimated light via the other microlens arranged on the substrate for a motherboard, and the collimated light is converged by the microlens arranged on the substrate for mounting an IC chip with the light receiving element mounted thereon to enter the light receiving element.

In the device for optical communication according to the fifth aspect of the present invention, a substrate for mounting an IC chip that has a light receiving element mounted thereon and an optical signal passing region formed thereon and a substrate for mounting an IC chip that has a light emitting element mounted thereon and an optical signal passing region formed thereon are mounted on the substrate for a motherboard on which an optical waveguide and an optical signal passing region are formed, and microlenses having predetermined functions are arranged at predetermined positions. Therefore, when light emitted from the light emitting element is transmitted to the light receiving element via the optical signal passing region and the optical waveguide, this light can be transmitted without being reflected on wall faces of the optical signal passing region. Thus, the device for optical communication according to the fifth aspect of the present invention provides an excellent transmission performance of the optical signal between the light emitting element and the light receiving element without causing attenuation due to reflection.

The device for optical communication according to the fifth aspect of the present invention is constituted by a substrate for a motherboard and a substrate for mounting an IC chip with an optical element (light receiving element or light emitting element) mounted thereon.

The substrate for a motherboard can be the same substrate for a motherboard as that constituting the device for optical communication according to the third aspect of the present invention, and the like.

Moreover, the substrate for mounting an IC chip with the optical element mounted thereon can be the same substrate for mounting an IC chip as that constituting the device for optical communication according to the third aspect of the present invention, and the like.

In the above-mentioned substrate for a motherboard, an optical signal passing region optically connected to both ends of the optical waveguide is formed, and a microlens is arranged on an end portion of the optical signal passing region on the opposite side from the side that is optically connected to the optical waveguide. Furthermore, in this configuration, the microlens, arranged on the side on which the substrate for mounting an IC chip with the light emitting element mounted thereon is mounted, allows an optical signal transmitted from the light emitting element to be converged on the core of the optical waveguide, and the microlens, arranged on the side on which the substrate for mounting an IC chip with the light emitting element mounted thereon is mounted, forms light emitted from the core into collimated light.

In the substrate for mounting an IC chip with the light emitting element mounted thereon, the optical signal passing region optically connected to the light emitting element is formed, and a microlens is also arranged on an end portion of the optical signal passing region on the opposite side from the side optically connected to the light emitting element, and this microlens forms light emitted from the light emitting element into collimated light.

Moreover, in the substrate for mounting an IC chip with the light receiving element mounted thereon, the optical signal passing region optically connected to the light receiving element is formed, and a microlens is also arranged on an end portion of the optical signal passing region on the opposite side from the side optically connected to the light receiving element, and this microlens converges light transmitted from the substrate for a motherboard onto the light emitting element.

In the device for optical communication according to the fifth aspect of the present invention having such configuration, light emitted from the light emitting element is formed into collimated light via the microlens arranged on the substrate for mounting an IC chip with the light emitting element mounted thereon, and this collimated light is converged via one of the microlenses arranged on the substrate for a motherboard, and after having entered one end of the optical waveguide, the resulting light is transmitted through the optical waveguide, and the light emitted from the other end of the optical waveguide is formed into collimated light via the other microlens arranged on the substrate for a motherboard, such that the collimated light is converged by the microlens arranged on the substrate for mounting an IC chip with the light receiving element mounted thereon, and entering the light receiving element. Therefore, at the time of transmitting an optical signal between the light emitting element and the light receiving element, the optical signal can be transmitted without causing reflection on the wall faces of the optical signal passing region, and the optical signal can be positively transmitted without attenuation due to reflection.

The method for manufacturing the device for optical communication according to the fifth aspect of the present invention can be the same method as the method for manufacturing the device for optical communication according to the third aspect of the present invention, and methods of the like.

Various embodiments of the device for optical communication have been described as the device for optical communications according to the third to fifth aspects of the present invention.

The following explanation will compare and discuss the specific structures of the devices for optical communication according to the above-mentioned embodiments.

More specifically, by using the device 760 for optical communication according to the embodiment shown in FIG. 8, the device 760' for optical communication according to the embodiment shown in FIG. 24, the device 3160 for optical communication shown in FIG. 22, and the device 3260 for optical communication shown in FIG. 23 as examples, the shapes of the microlens which converges light emitted from the light emitting element onto the core of the optical waveguide, and light emitted from the optical waveguide onto the light receiving portion of the light receiving element are compared.

In addition, in the embodiments in which two microlenses are arranged on the optical path between the optical element and the optical waveguide (device 760 for optical communication and device 3260 for optical communication), the microlenses are designed such that an optical signal between the microlenses is formed into collimated light.

With respect to these devices for optical communication, a substrate for mounting an IC chip with a light emitting element mounted thereon having the following structure was used: four channels of VCSELs with a spreading angle of 24 degrees, the pitch there between being 250 μm, were flip-chip mounted on a substrate for mounting an IC chip of 550 μm in thickness with a gap of 50 μm therefrom, and an optical signal passing region, its cross-section having a shape in which semi-circles having a radius of 150 μm are attached to both ends of a rectangular shape the size of 300×750 μm, and filled with a transparent epoxy resin having a refractive index of 1.50.

Moreover, a substrate for mounting an IC chip with a light receiving element mounted thereon having the following structure was used: four channels of PDs with of a light receiving portion having a diameter of 80 μm, the pitch there between being 250 μm, were flip-chip mounted on a substrate for mounting an IC chip of 1950 μm in thickness with a gap of 50 μm there between, and an optical signal passing region, its cross section having a shape in which semi-circles having a radius of 150 μm are attached to both ends of a rectangular shape having the size of 300×750 μm, and filled with a transparent epoxy resin having a refractive index of 1.50. Furthermore, a substrate for a motherboard having the following structure was used: an optical waveguide formed with a core having a size of 50×50 μm with four channels, a clad formed on the periphery thereof, the upper and lower portions of the clad with the core formed therein having the thickness of 50 μm; and when the optical signal passing region was formed in the substrate for a motherboard (in the case of the devices of 760 and 760' for optical communication), an optical signal passing region, its cross section having a shape in which semi-circles having a radius of 150 μm are attached to both ends of a rectangular shape having the size of 300×750 μm, and filled with a transparent epoxy resin having a refractive index of 1.50 was used.

Moreover, the thickness of the substrate for a motherboard was set to 450 μm in the devices 760, 3160 and 3260 for optical communication, and to 150 μm in the device 760' for optical communication.

The gap between a substrate for a motherboard and a substrate for mounting an IC chip when the substrate for mounting an IC chip was mounted on the substrate for a motherboard was set to 300 μm in the devices 760, 3160 and 3260 for optical communication, and to 100 μm in the device 760' for optical communication.

With respect to the devices for optical communication in which each member has the above-mentioned shapes, microlenses were designed so as to satisfy the above-mentioned requirements.

Consequently, the following results were obtained with respect to the shapes of the microlens satisfying the above-mentioned requirements. Table 1 shows the results thereof. In the table, the diameter and height of the microlens and the ratio of the height and the diameter thereof (height/diameter) are shown. Here, as the ratio of the height and the diameter (height/diameter) becomes greater, the radius of curvature of the microlens becomes greater.

TABLE 1

|  | Symbol of microlens | Diameter | Height | Height/Diameter |
|---|---|---|---|---|
| Device 760 for optical communication (FIG. 8) | 1746 | 220 | 33 | 0.15 |
|  | 746a | 220 | 13 | 0.059 |
|  | 746b | 220 | 30 | 0.136 |
|  | 2746 | 220 | 11 | 0.05 |
| Device 3260 for optical communication (FIG. 23) | 4246b | 38 | 19 | 0.5 |
|  | 4246a | 200 | 65 | 0.325 |
|  | 5246a | 210 | 58 | 0.276 |
|  | 5246b | 140 | 30 | 0.214 |
| Device 760' for optical communication (FIG. 24) | 1746' | 220 | 74 | 0.336 |
|  | 2746' | 220 | 80 | 0.364 |
| Device 3160 for optical communication (FIG. 22) | 4146a | 220 | 85 | 0.386 |
|  | 5146a | 220 | 75 | 0.341 |

As clearly indicated by the results of Table 1, in the examples in which two microlenses were arranged on the optical path between the optical element and the optical waveguide (devices 760 and 3260 for optical communication), the ratio of the height and the diameter of the microlens (height/diameter) varies depending on the positions on which the microlens and the optical waveguide are arranged.

More specifically, the ratio of the height and the diameter of the microlens (height/diameter) are smaller in the device 760 for optical communication compared to the device 3260 for optical communication. This is because, when the distance between the optical element or the optical waveguide and the microlens is short, the focal length of the lens needs to be shortened, causing a greater radius of curvature in the microlens.

Moreover, when the example in which one microlens was arranged on the optical path between the optical element and the optical waveguide (devices 7601 and 3160 for optical communication), there was not a big difference between the ratio of the height and the diameter of the microlenses (height/diameter) of the two devices.

When the microlens arranged on the devices 7601 and 3160 for optical communication is compared with the microlens arranged on the device 3260 for optical communication, the ratio of the height and diameter of the microlens (height/diameter) that is arranged so as to converge an optical signal from the light emitting element in the device 3260 for optical communication (microlens 4246b) becomes greater than that of the microlens that is arranged on the device 7601 or 3160 for optical communication (microlenses 1746, 4146a and 5146a). This clearly indicates that, when a microlens is arranged to a position close to the light emitting element, the absolute value of the radius of curvature needs to be made greater.

Moreover, when the positional precision of constituent members constituting the device for optical communication, that is, in particular, the positional precision of the optical element and the optical waveguide is examined, the following facts have been found, for example, in the device 760 for optical communication having the structure shown in FIG. 8.

(1) When a process for mounting an optical element is carried out after an optical waveguide film has been affixed through a passive alignment process, the optical waveguide film is affixed based upon alignment marks formed on the upper face and the lower face of the substrate for a motherboard; thus, between the optical waveguide and the optical element, a positional deviation in the range of around 10 to 15 µm from the designed value tends to occur.

(2) When an optical waveguide is directly formed by applying a resin composition based upon alignment marks formed on the upper face and the lower face of the substrate for a motherboard, and an optical path conversion mirror is then formed thereon, a positional deviation in the range of around 10 to 20 µm from the designed value tends to occur between the optical waveguide and the optical element.

(3) Even when a substrate for mounting an IC chip with an optical element mounted thereon is mounted and an optical waveguide is formed through an active alignment process prior to forming the optical waveguide on the substrate for a motherboard, a positional deviation of about 2 µm from the designed value tends to occur between the optical waveguide and the optical element.

Moreover, the positional deviation between the optical waveguide and the optical element also tends to occur in the manufacturing processes of the device 3260 for optical communication as shown in FIG. 23, and when the optical waveguide is formed through a passive alignment process, a positional deviation in the range of around 5 to 6 µm tends to occur, and when the optical waveguide is formed through an active alignment process, a positional deviation in the range of around 8 to 10 µm tends to occur. Here, the reason that the active alignment process causes a greater positional deviation is because the head of an attaching device fails to suppress the tip of the optical waveguide (an optical path conversion mirror forming portion).

In the device for optical communication, the occurrence of a positional deviation between the optical waveguide and the optical element from the designed value is inevitable in the manufacturing processes thereof.

When such a positional deviation from the designed value occurs, no matter how precisely the microlens is designed, the focal point of the microlens deviates from the core of the optical waveguide, the light receiving portion of the light receiving element and the like.

Here, since the focal length is shorter when the radius of curvature of the microlens is greater, even a slight positional deviation tends to cause great influence on the microlens.

Moreover, at the time of arranging the microlens, a slight error from the designed value is caused, leading to a result that, as the radius of curvature becomes greater, the focal length varies greatly even with a slight error.

Therefore, taking these points into consideration, it is desirable that the ratio of the height and the diameter of the microlens constituting the device for optical communication (height/diameter) becomes smaller, namely, that the radius of curvature of the microlens becomes smaller, from the viewpoint that the microlens becomes less susceptible to influences from a positional deviation in constituent members that inevitably occurs at the time of manufacturing the device for optical communication, and an excellent optical signal transmitting property can be provided. Moreover, since shortening the radius of curvature of the microlens is equivalent to lengthening the focal length of the microlens, it is desirable that an optical signal passing region is formed on the substrate for mounting an IC chip and the substrate for a motherboard so as to ensure a proper distance between the microlens and the optical waveguide or the optical element.

More specifically, with respect to the device for optical communication, it is considered that the device 760 for optical communication shown in FIG. 8 is more desirable than the device 3260 for optical communication shown in FIG. 23, and that the device 760' for optical communication shown in FIG. 24 is more desirable than the device 3160 for optical communication shown in FIG. 22.

EXAMPLES

A more detailed explanation for the present invention will be given below.

Example 1

A. Fabrication of Resin Film for Insulating Layer

To 20 parts by weight of ethyldiglycol acetate and 20 parts by weight of solvent naphtha were added 30 parts by weight of bisphenol A-type epoxy resin (epoxy equivalent: 469, EPICOAT 1001 made by Yuka Shell Epoxy K.K.), 40 parts by weight of cresol novolak-type epoxy resin (epoxy equivalent: 215, EPICRON N-673 made by Dainippon Ink & Chemicals, Inc.) and 30 parts by weight of triazine structure-containing phenol novolak resin (phenolic hydroxide group equivalent: 120, PHENOLITE KA-7052 made by Dainippon Ink & Chemicals, Inc.) so as to be dissolved therein while being stirred under heat, and to this were further added 15 parts by weight of polybutadiene rubber with epoxidized terminals (DENAREX R-45EPT, made by Nagase Kasei Kogyo K.K.), 1.5 parts by weight of 2-phenyl-4,5-bis(hydroxymethyl) imidazole pulverized product, 2 parts by weight of fine pulverized silica and 0.5 parts by weight of silicone-based antifoamer, so that an epoxy resin composition was prepared.

After the resulting epoxy resin composition had been applied onto a PET film of 38 µm in thickness by using a roll coater so as to provide a thickness of 50 µm when dried, the resulting film was dried for 10 minutes at a temperature in the range of 80 to 120° C., so that a resin film for an insulating layer was fabricated.

B. Preparation of Resin Composition for Filling Through Hole

A vessel was charged with 100 parts by weight of bisphenol F-type epoxy monomer (YL983U made by Yuka Shell Epoxy K.K., molecular weight: 310), 170 parts by weight of silane coupling agent-coated $SiO_2$ beads (CRS1101-CE made by ADTEC Corp.) having a mean particle diameter of 1.6 µm and a maximum particle diameter of 15 µm or less, and 1.5 parts by weight of leveling agent (PELENOL S4 made by San Nopco Co., Ltd.), followed by stirring to prepare a resin filler having a viscosity of 45 to 49 Pa·s at 23±1° C. Here, as a curing agent, 6.5 parts by weight of imidazole curing agent (2E4MZ-CN made by Shikoku Corp.) was used.

C. Manufacturing of Substrate for Mounting IC Chip (1) A copper-clad laminated board, prepared by laminating a 18 µm-thick copper foil 28 on both faces of an insulating substrate 21 made of glass epoxy resin or BT (bismaleimide-triazine) resin having a thickness of 0.7 mm, was used as a starting material (see FIG. 10A). First, this copper-clad laminated board was drilled and electrolessplated and subjected to a pattern-wise etching to form a conductor circuit 24 and a plated through hole 29 on both faces of the substrate 21.

(2) The substrate formed with the plated through hole 29 and the conductor circuit 24 was rinsed with water and dried. Then, blackening treatment using an aqueous solution containing NaOH (10 g/l), NaClO$_2$ (40 g/l) and Na$_3$PO$_4$ (6 g/l) as a blackening bath (oxidation bath) and reduction treatment using an aqueous solution containing NaOH (10 g/l) and NaBH$_4$ (6 g/l) as a reduction bath were carried out to form a roughened surface (not shown in the figure) on the conductor circuit 24 including the plated through hole 29 (see FIG. 10B).

(3) Within 24 hours after preparing the resin filler described in the above-mentioned B, layers of the resin filler 30' were formed through the following method, inside the plated through hole 29, and on a portion of which the conductor circuit is not formed and on the edge of the conductor circuit 24, both of which the position is on either of the surfaces of the substrate 21.

First, after the resin filler had been filled into the plated through hole by using a squeezee, the filled-in resin was dried at 100° C. for 20 minutes. Then, a mask having an opening at a portion corresponding to the portion of which the conductor circuit is not formed was placed on the substrate, and, by using a squeezee, the resin filler was also filled into the portion of which the conductor circuit is not formed that forms a concave portion, and dried at 100° C. for 20 minutes, such that the layers of the resin filler 30' were formed (see FIG. 10C).

(4) On the one side of the substrate treated as described in the above-mentioned (3), the resin filler was ground with a belt sander grind using a #600 belt grinding paper (made by Sankyo Rikagaku Co., Ltd.) so as to leave no resin filler 30' on the surface of the conductor circuit 24 and the land surface of the plated through hole 29, and buffing was carried out to remove scratches caused by the belt sander grind. This grinding process was carried out on the other side of the substrate as well.

Then, heat treatment was carried out for 1 hour at 100° C., for 3 hours at 120° C., for 1 hour at 150° C. and for 7 hours at 180° C., such that a resin filler layer 30 was formed.

In this manner, an insulating substrate (see FIG. 10D) was obtained as follows: the surface layer portion of the resin filler 30', formed in the plated through hole 29 and the portion of which the conductor circuit is not formed, and the surface of the conductor circuit 24 were flattened, the resin filler 30' and the side faces of the conductor circuit 24 were firmly joined together via the roughened surface (not shown in the figure), and the inner wall surface of the plated through hole 29 and the resin filler 30' were firmly joined together via the roughened surface (not shown in the figure). Through these processes, the surface of the resin filler layer 30 and the surface of the conductor circuit 24 were made flush with each other.

(5) Then, the substrate was washed with water and acid-degreased, and then soft-etched, and by spraying an etching solution over both faces of the substrate, the surface of the conductor circuit 24 and the land surface of the plated through hole 29 were etched, such that a roughened surface (not shown in the figure) was formed over the entire surface of the conductor circuit 24. As the etching solution, an etching solution (MEC etch BOND made by Mec Co., Ltd.) containing 10 parts by weight of imidazole copper (II) complex, 7 parts by weight of glycolic acid and 5 parts by weight of potassium chloride was used.

(6) Then, a resin film for an insulating layer, which was slightly larger than the substrate fabricated in the above-mentioned A, was placed on the substrate, and temporarily press-bonded thereto under conditions of pressure of 0.4 MPa, a temperature of 80° C. and a press-bonding time of 10 seconds, and subjected to a cutting process thereafter, and the resulting film was affixed thereto by using a vacuum laminator device through the following method, such that an insulating layer 22 was formed (see FIG. 10E).

In other words, the resin film for an insulating layer was actually press-bonded onto the substrate under conditions of a degree of vacuum of 65 Pa, a pressure of 0.4 MPa, a temperature of 80° C. and a press-bonding time of 60 seconds, and then heated for curing at 170° C. for 30 minutes.

(7) Next, by applying a CO$_2$ gas laser having a wavelength of 10.4 μm onto the insulating layer 22 via a mask of 1.2 mm in thickness in which a through hole was formed, under conditions of one shot of a beam diameter of 4.0 mm, in a top-hat mode, a pulse width of 8.0 μs, and the through hole of the mask having 1.0 mm in diameter, an opening 26 for a via hole of 80 μm in diameter was formed on the insulating layer 22 (see FIG. 10F).

(8) The substrate in which the opening 26 for a via hole had been formed was immersed for 10 minutes in a solution at 80° C. containing permanganate of 60 g/l, and epoxy resin particles remaining on the surface of the insulating layer 22 were dissolved and removed, such that a roughened face (not shown in the figure) was formed on the surface including the inner wall faces of the opening 26 for a via hole.

(9) Next, the substrate that had been subjected to the above-mentioned processes was immersed in a neutralizing solution (made by Shipley Co., Ltd.), and then washed with water.

On the surface of the surface-roughened substrate (roughened depth: 3 μm), a palladium catalyst was applied to deposit the catalyst nucleus on the surface of the insulating layer 22 (including the inner wall faces of the opening 26 for a via hole) (not shown in the figure). In other words, the substrate was immersed in a catalyst solution containing palladium chloride (PdCl$_2$) and stannous chloride (SnCl$_2$), such that the catalyst was applied thereto by depositing palladium metal.

(10) Next, the substrate was immersed in an electroless copper plating solution of the following composition, to form a thin-film conductor layer (electroless copper plating film) 32, 0.6 to 3.0 μm in thickness, on the surface of the insulating layer 22 (including the inner wall faces of the opening 26 for a via hole) (see FIG.

| (Electroless plating solution) | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-Bipyridyl | 100 mg/l |
| Polyethylene glycol (PEG) | 0.10 g/l |
| (Electroless plating condition) | |
| 40 minutes at a bath temperature of 30° C. | |

(11) A commercial photosensitive dry film was affixed to the substrate on which the thin-film conductor layer (electroless copper plating film) 32 was formed, and with a mask set in position, an exposure at 100 mJ/cm$^2$ and a development with a 0.8% sodium carbonate solution were carried out to provide a 20 μm-thick plating resist 23 (see FIG. 11B).

(12) Then, the substrate was washed with water at 50° C. to be degreased, and after having been washed with water at 25° C., the resulting substrate was further washed with sulfuric acid, and then subjected to electroplating under the following conditions, such that a 20 μm-thick copper electroplating film 33 was formed on the portion of which the plating resist 23 is not formed (see FIG. 11C).

| (Electroplating solution) | |
|---|---|
| Sulfuric acid | 2.24 mol/l |
| Copper Sulfate | 0.26 mol/l |
| Additive (KAPARACID HL made by Atotech Japan K.K.) | 19.5 ml/l |
| (Electroplating conditions) | |
| Current density | 1 A/dm$^2$ |
| Time | 65 min |
| Temperature | 22 ± 2° C. |

(13) Then, after the plating resist 23 was separated with 5% NaOH, the thin-film conductor layer beneath the plating resist 23 was etched and dissolved with a mixed solution of sulfuric acid and hydrogen peroxide to form a 18 μm-thick conductor circuit 24 (including via hole 27), constituted by the thin-film conductor layer (electroless copper plating film) 32 and the copper electroplating film 33, was formed (see FIG. 11D).

(14) By using the same etching solution as the etching solution used in the above-mentioned step (5), a roughened face (not shown in the figure) was formed on the surface of the conductor circuit 24, and the same steps as those used in the steps (6) to (8) were carried out, to laminate and form an insulating layer 22, which had an opening 26 for a via hole and was provided with the roughened face (not shown in the figure) formed on its surface (see FIG. 12A).

(15) Next, by using the same method as the method used in the step (9), a catalyst was applied to the surface of the insulating layer 22 (including inner wall faces of the opening 26 for a via hole), and the substrate was immersed in the same electroless copper plating aqueous solution as the electroless plating solution used in the step (10), such that a thin-film conductor layer (electroless copper plating film) 32 was formed on the surface of the insulating layer 22 (including inner wall faces of the opening 26 for a via hole) (see FIG. 12B).

(16) By using the same method as the method used in the step (11), a plating resist 23 was provided, and by using the same method as the method used in the step (12), a 20 μm-thick copper electroplating film 33 was formed on the portion of which the plating resist 23 is not formed (see FIG. 12C).

(17) By using the same method as the method used in the step (13), the plating resist 23 was separated and the thin-film conductor layer beneath the plating resist 23 was removed to form a conductor circuit 24 (including via hole 27).

Furthermore, by using the same method as the method used in the step (2), oxidation-reduction treatment was carried out to form a roughened face (not shown in the figure) on the surface of the conductor circuit 24.

Thereafter, a through hole 31 for an optical path (with a rectangular shape (240 μm in width×1000 μm in length) with arcs formed on the corners in its plan view), which penetrates through the substrate 21 and the insulating layer 22, was formed by drilling, and the wall faces of the through hole 31 for an optical path were subjected to desmearing treatment (see FIG. 12D). In this case, the through hole 31 for an optical path of the batch through-hole structure was formed.

(18) Next, resin was placed on a padding mask of a printing machine and a screen printing operation was carried out, so that the through hole 31 for an optical path was filled with the resin, and this was then cured at 120° C. for one hour as well as at 150° C. for one hour. Thereafter, the resin protruding from the through hole 31 for an optical path was ground with a #3000 grind paper, and further ground with alumina particles of 0.05 μm to flatten the surface to form a resin composition layer 47.

In this step, the resin was prepared by adding 40% by weight of pulverized silica having a grain-size distribution of 0.1 to 0.8 μm to epoxy resin (transmittance 91%/mm, CTE 82 ppm), such that the transmittance was adjusted to 82%/mm, with CTE and the viscosity being adjusted to 42 ppm and 200000 cps, respectively.

The epoxy resin had a refractive index of 1.50 after the curing process.

(19) A vessel was charged with 46.67 parts by weight of a photosensitized oligomer (molecular weight: 4000) dissolved in diethylene glycol dimethyl ether (DMDG) at a concentration of 60 weight %, the photosensitized oligomer prepared by acrylating 50% of the epoxy groups of cresol novolak-type epoxy resin (made by Nippon Kayaku Co., Ltd.), 15.0 parts by weight of bisphenol A-type epoxy resin (trade name: EPICOAT 1001, made by Yuka Shell Epoxy K.K.) dissolved in methyl ethyl ketone at a concentration of 80 weight %, 1.6 parts by weight of imidazole curing agent (trade name: 2E4MZ-CN, made by Shikoku Corp.), 4.5 parts by weight of photosensitive difunctional acrylic monomer (trade name: R604, made by Nippon Kayaku Co., Ltd.), 1.5 parts by weight of a photosensitive polyvalent acrylic monomer (trade name: DPE6A made by Kyoei Chemical Co., Ltd.), and 0.71 parts by weight a dispersion antifoamer (trade name: S-65, made by San Nopco Co., Ltd.), and followed by stirring to prepare a mixed composition. To this mixed composition were added 2.0 parts by weight of benzophenone (made by Kanto Chemical Co., Inc.) as the photopolymerization initiator, and 0.2 parts by weight of Michler's ketone (made by Kanto Chemical Co., Inc.) as the photosensitizer, to give a solder resist resin composition having a viscosity of 2.0 Pa·s at 25° C.

Here, the viscosity measurement was carried out with a type B viscometer (type DVL-B, manufactured by Tokyo Keiki Co., Ltd.) using Rotor No. 4 for 60 min$^{-1}$ (rpm) and Rotor No. 3 for 6 min$^{-1}$ (rpm).

(20) The solder resist composition was applied to both faces of the substrate on which the resin composition layer 47 was formed so as to have a thickness of 30 μm, and this was subjected to drying treatment at 70° C. for 20 minutes and at 70° C. for 30 minutes, such that a layer 34' of the solder resist composition was formed (see FIG. 13A).

(21) Next, on a 5 mm-thick photomask having patterns of an opening for forming a solder bump and an opening for an optical path drawn thereon, held in close contact with the layer 34' of the solder resist composition on the IC chip mounting side, an exposure with ultraviolet rays at 1000 mJ/cm$^2$ and a development with DMTG solution were carried out to form openings. Here, the diameter of the cross section of the opening for an optical path thus formed was the same as the diameter of the cross section of the through hole for an optical path formed in the step (17).

Then, heat treatment was carried out at 80° C. for 1 hour, at 100° C. for 1 hour, at 120° C. for 1 hour, and at 150° C. for 3 hours to cure the layer of the solder resist composition, to form a 20 μm-thick solder resist layer 34 with the opening 48 for forming a solder bump and the opening 31b for an optical path (see FIG. 13B).

Moreover, a commercial solder resist composition may also be used as the solder resist composition.

(22) Next, the opening for an optical path formed in the step (21) was filled with resin that was the same as the epoxy resin filled in the step (18) through screen printing, and after having been subjected to curing treatment, the substrate was subjected to grinding treatment to flatten its surface, and a resin composition layer 47 was formed thereonto provide an optical signal passing region 42 (see FIG. 13C).

(23) Then, the substrate with the solder resist layer 34 formed thereon was immersed for 20 minutes in an electroless nickel plating bath (pH=4.5) containing nickel chloride ($2.3\times10^{-1}$ mol/l), sodium hypophosphite ($2.8\times10^{-1}$ mol/l) and sodium citrate ($1.6\times10^{-1}$ mol/l) to form a 5 μm-thick nickel plating layer in the opening 48 for forming a solder bump. This substrate was immersed for 7.5 minutes in an electroless gold plating solution at 80° C., containing gold potassium cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l) such that a 0.03 μm-thick gold plating layer on the nickel plating layer is formed to be solder pads 36.

(24) Next, by using an inkjet device through the following method, microlenses 46a to 46d were arranged on an end portion of the resin composition layer 47 formed in the optical signal passing region 42 on the opposite side from the side on which the optical element is to be mounted (see FIG. 14A).

In other words, after adjusting an UV setting epoxy-based resin (transmittance: 94%/mm, refractive index: 1.53) to a viscosity of 20 cps at room temperature (25° C.), this resin was adjusted to a viscosity of 8 cps at a temperature of 40° C. in the resin container of the inkjet device, and the resin was applied to predetermined positions on the end portion of the resin composition layer 47, and this was irradiated with UV light (500 mW/min), such that the resin was cured to provide the microlenses 46a to 46d, each having a diameter of 220 μm and a sag height of 9 μm.

Here, this step may be carried out prior to the step (23).

(25) Next, solder paste was printed on the opening 47 for forming a solder bump formed in the solder resist layer 34, and the light emitting element 38 was attached thereto by positioning the light emitting portion 38a thereof, and subjecting it to reflow at 200° C., and thus the light emitting element 38 was mounted and solder bumps 37 were also being formed in the opening 48 for forming a solder bump.

Thereafter, by adding 60% by weight of pulverized silica having a grain-size distribution of 0.1 to 0.8 μm to epoxy resin (transmittance: 90%/mm, CTE: 73 ppm), a resin for under-filling in which the transmittance was set to 80%/mm, with CTE and the viscosity being adjusted to 30 ppm and 50 cps, respectively, was prepared, and this resin for under-filling was applied around the light emitting element, and left so as to be swept into a gap (50 μm) between the light emitting element and the solder resist layer, and moreover, by curing the resin for under-filling at 120° C. for 1 hour and at 150° C. for 2 hours, an under-fill layer having a refractive index of 1.50 was formed.

Through these steps, a substrate for mounting an IC chip was obtained (see FIG. 14B).

In this example, a flip-chip type VCSEL (made by ULM Photonics GmbH) was used as the light emitting element 38. This light emitting element was used as a 4-channel array element with a pitch of 250 μm.

Here, in the substrate for mounting an IC chip manufactured in this example, the portion of the optical signal passing region that penetrates through the substrate, the insulating layer and the solder resist layer was filled with a resin composition.

Moreover, at the time of manufacturing the substrate for mounting an IC chip of this example, the substrate for mounting an IC chip may be manufactured through the following steps.

After the thin-film conductor layer had been formed through the step (15), without the forming of the solder resist, a solid electroplating layer was formed on the thin-film conductor layer by the same method as the step (16), and the forming of the through hole for an optical path, the filling of the resin composition and the curing and grinding processes were carried out in the same manner as the steps (17) and (18) such that the through hole penetrates through the thin-film conductor layer and the electroplating layer in this state, and thereafter, the thin-film conductor layer and the electroplating layer were subjected to etching treatment to form a conductor circuit, and the steps subsequent to the step (19) may be carried out to manufacture a substrate for mounting an IC chip.

Example 2

A substrate for mounting an IC chip was obtained by carrying out the same steps as those in Example 1, except that, at the time of arranging a microlens on an end portion of the resin composition layer 47 in the step (24) of Example 1, a resin composition (transmittance: 84%/mm) prepared by adding 20% by weight of pulverized silica having a grain-size distribution of 0.1 to 0.8 μm to the epoxy resin used in Example 1 was used.

Example 3

A substrate for mounting an IC chip was obtained by carrying out the same steps as those in Example 1, except that, at the time of arranging a microlens on an end portion of the resin composition layer 47 in the step (24) of Example 1, a resin composition (transmittance: 82%/mm) prepared by adding 40% by weight of pulverized silica having a grain-size distribution of 0.1 to 0.8 μm to the epoxy resin used in Example 1 was used.

Example 4

A substrate for mounting an IC chip was obtained by carrying out the same steps as those in Example 1, except that, at the time of arranging a microlens on an end portion of the resin composition layer 47 in the step (24) of Example 1, a resin composition (transmittance: 82%/mm) prepared by adding 50% by weight of pulverized silica having a grain-size distribution of 0.1 to 0.8 μm to the epoxy resin used in Example 1 was used.

Example 5

A substrate for mounting an IC chip was obtained by carrying out the same steps as those in Example 1, except that, at the time of arranging a microlens on an end portion of the resin composition layer 47 in the step (24) of Example 1, a resin composition (transmittance: 82%/mm), prepared by adding 60% by weight of pulverized silica having a grain-size distribution of 0.1 to 0.8 µm to the epoxy resin used in Example 1 was used.

Example 6

A substrate for mounting an IC chip was obtained by carrying out the same steps as those in Example 1, except that, at the time of arranging a microlens to an end portion of the resin composition layer 47 in the step (24) of Example 1, a resin composition (transmittance: 81%/mm) prepared by adding 70% by weight of pulverized silica having a grain-size distribution of 0.1 to 0.8 µm to the epoxy resin used in Example 1 was used.

Examples 7 to 12

A substrate for mounting an IC chip was obtained by carrying out the same steps as those in each of Examples 1 to 7, except that in each of Examples 1 to 7, a dispenser was used in place of the inkjet device when the microlens was arranged. Here, at the time of using the dispenser, the resin with a viscosity of 20 cps, as it is, was used.

Example 13

A substrate for mounting an IC chip was obtained by carrying out the same steps as those in Example 1, except that, at the time of arranging a microlens in the step (24) of Example 1, by using the following method, a microlens array with four lenses was arranged with an adhesive layer on an end portion of the optical signal passing region.

First, epoxy resin (transmittance: 91%/mm, CTE: 72 ppm) was poured into a metal mold that had been machined into a microlens array shape, and this was subjected to curing treatment at 120° C. for 1 hour and at 150° C. for 2 hours, and the cured resin was taken out of the metal mold, to fabricate a microlens array.

Next, epoxy resin (viscosity: 500 cps, refractive index: 1.45 to 1.55, transmittance 91%/mm, CTE: 70 ppm) was applied to the end portion of the optical signal passing region on which the microlens array was to be arranged by using a dispenser, as an adhesive.

Furthermore, the microlens array with a protective tape being affixed thereto was sucked by using a suction nozzle of a flip-chip device, and mounted on the substrate with precision of 10 µm or less by using alignment marks on the substrate. Then, the adhesive was cured at 120° C. for 10 minutes.

Here, the thickness of the adhesive was set to about 10 µm.

In this example, after the protective tape had been affixed onto the microlens array, the microlens array was mounted; however, without using the protective tape, the microlens array may be sandwiched by a chuck of the flip-chip device and mounted thereon.

Example 14

A substrate for mounting an IC chip was obtained by carrying out the same steps as those in Example 1, except that, at the time of forming a through hole for an optical path in the step (17) of Example 1, four through holes for optical paths were formed with a pitch of 250 µm by using a drill having a diameter of 150 µm. Thus, the substrate for mounting an IC chip manufactured in this example was provided with an optical signal passing region having an individual through-hole structure.

In this example, the through hole for an optical path was formed by using the drill having a diameter of 150 µm; however, normally, a drill having a diameter in the range of around 100 to 400 µm may be used. More specifically, for example, individual through holes with a pitch of 500 µm may be formed by using a drill having a diameter of 300 µm.

Example 15

A substrate for mounting an IC chip was obtained by carrying out the same steps as those in Example 1, except that, at the time of forming a through hole for an optical path in the step (17) of Example 1, five through holes for optical paths were formed with a pitch of 250 µm by using a drill having a diameter of 300 µm. Thus, the substrate for mounting an IC chip manufactured in this example was provided with an optical signal passing region having a batch through-hole structure that had a shape in which wall faces of adjacent columns are partly connected to one another, with at least one dummy column formed therein. Here, the through holes for optical paths were formed through a sequence of processes shown in FIG. 20A.

Example 16

First, the same steps as those of the steps (1) to (17) of Example 1 (except for the drilling process) were carried out so that a conductor circuit and an insulating layer were laminated on both faces of a substrate, and a drilling process was then carried out to form a concave portion for an optical path that penetrates through the two insulating layers.

Next, the same step as the step (23) of Example 1 was carried out to form a nickel plating layer and a gold plating layer on the surface of the conductor circuit exposed to the bottom face of the concave portion for an optical path, and then, a light emitting element and an IC chip were mounted on the bottom face of the concave portion for an optical path by wire bonding.

The same resin composition containing epoxy resin as the resin composition used in the step (18) of Example 1 was filled into the concave portion for an optical path by using a squeeze, and after having been dried, the surface layer thereof was flattened by buffing. This was further subjected to a curing process to form a resin composition layer.

Next, by carrying out the same steps as the steps (19) to (22) of Example 1, a layer of a solder resist composition in which an opening for forming a solder bump and an opening for an optical path communicating with the concave portion for an optical path were formed, and a resin composition was filled into the opening for an optical path to form an optical signal passing region.

Next, according to the following method, by using an inkjet device, a microlens was arranged on an end portion of the side to which the resin composition layer formed on the optical signal passing region is exposed. The forming of the microlens was carried out by using the same method as that of the step (24) of Example 1.

Thereafter, a substrate for mounting an IC chip was obtained by forming a solder bump on the opening for forming a solder bump by using the same method as that of the step (25) of Example 1.

With each of the substrates for mounting an IC chip of Examples 1 to 16 thus obtained, the IC chip mounting process and the resin sealing process were carried out, and a detector was attached to an end portion of the optical signal passing region of the substrate for mounting an IC chip on the opposite side from the light emitting element mounting side.

Thereafter, an optical signal of 2.5 Gbps was transmitted from the light emitting element, and an optical signal was detected by the detector; consequently, a desired optical signal could be detected.

Accordingly, it was apparent that each of the substrates for mounting an IC chip manufactured in these examples could positively transmit an optical signal via the optical signal passing region and the microlens.

Moreover, with respect to each of the substrates for mounting an IC chip according to Examples 1 to 12, the coating property of the resin at the time of arranging the microlens was examined, and the results indicate that the substrates for mounting an IC chip according to Examples 1 to 4 and Examples 7 to 11 are less susceptible to deviation in the amount of coat of the resin, and thus a microlens having a desired shape can be arranged, and in the substrates for mounting an IC chip according to Examples 5, 6 and 12, although there is slight deviation in the amount of coat of the resin, the resulting microlens can sufficiently serve as a microlens.

On each of the substrates for mounting an IC chip according to Examples 1 to 16 were carried out 250 cycles, 500 cycles and 1000 cycles of a liquid-phase temperature cycle test, one cycle consisting of a 3 minutes at −55° C. and 3 minutes at 125° C. Thereafter, each of the substrates for mounting an IC chip were cross-cut, and the inside of the substrate for mounting an IC chip including the microlens and the optical signal passing region was observed for any cracks to consequently find that there were no cracks at any of the portions of the substrate for mounting an IC chip.

Moreover, reflow processes of five times in total were carried out on each of the substrates for mounting an IC chip according to Examples 1 to 16, and after each reflow process, the presence or absence of a crack in the microlens was observed. As a result, no cracks were observed in any of the conditions.

Here, on the assumption of mounting by Pb soldering, the reflow process was carried out under a temperature profile of a peak temperature of 260° C., a heating period exceeding 220° C. within 30 seconds and a pre-heating temperature in the range of 170 to 200° C. for one minute or more.

The following tests were carried out to confirm the influences from the reflow process given to the transmission loss of the microlens, when particles were mixed in the microlens.

Test Examples 1 to 7

Pulverized silica having a grain-size distribution of 0.1 to 0.8 μm, also mixed in Example 1, was added to the same epoxy resin as the epoxy resin used for arranging the microlens in Example 1 at mixture amount (% by weight) shown in Table 2 to prepare transmittance measuring samples, and to evaluate the influences of the number of reflow processes to the transmittance of the microlens. The results thereof are shown in Table 2.

Here, each of the transmittance measuring samples had a size of 10 mm in length×10 mm in width×100 μm in height, and the measurements were carried out by using a spectrophotometer (UV-3101PC manufactured by Shimadzu Corp.).

TABLE 2

| | Particle (% by weight) | Prior to reflow process (%/min) | After the first reflow process (%/min) | After the second reflow process (%/min) | After the third reflow process (%/min) | After the fourth reflow process (%/min) | After the fifth reflow process (%/min) |
|---|---|---|---|---|---|---|---|
| Test Example 1 | 0 | 91.1 | 87.6 | 84.1 | 82.6 | 79.7 | 76.9 |
| Test Example 2 | 5 | 86.3 | 84.3 | 83.1 | 82.6 | 81.8 | 81.6 |
| Test Example 3 | 10 | 84.2 | 84.1 | 84.2 | 84.2 | 84.3 | 84.2 |
| Test Example 4 | 20 | 84.3 | 84.3 | 84.1 | 84.3 | 84.2 | 84.2 |
| Test Example 5 | 40 | 82.4 | 82.4 | 82.2 | 82.3 | 82.2 | 82.1 |
| Test Example 6 | 60 | 82.3 | 82.1 | 82.2 | 82.4 | 82.2 | 82.2 |
| Test Example 7 | 70 | 81.4 | 81.7 | 81.6 | 81.5 | 81.5 | 82.4 |

The results shown in Table 2 indicate that, although the transmittance is lowered slightly due to the reflow process, the transmittance hardly changes after the reflow process have been repeated plural times.

Example 17

A. Fabrication of Resin Film for Insulating Layer

A resin film for an insulating layer was fabricated by carrying out the same steps as those in the process A of Example 1.

B. Preparation of Resin Composition for Filling Through Hole

A resin composition for filling a through hole was prepared by carrying out the same steps as those in the process B of Example 1.

C. Manufacturing of Substrate for a Motherboard
 (1) A copper-clad laminated board, prepared by laminating a 18 μm-thick copper foil 78 on both faces of an insulating substrate 71 made of a glass epoxy resin or a BT (bismaleimide-triazine) resin having a thickness of 0.7 mm, was used as a starting material (see FIG. 15A). First, this copper-clad laminated board was drilled and electroless-plated and subjected to a pattern-wise etching to form a conductor circuit 74 and a plated through hole 79 on both faces of the substrate 71.
 (2) The substrate formed with the plated through hole 79 and the conductor circuit 74 was rinsed with water and dried. Then, blackening treatment using an aqueous solution containing NaOH (10 g/l), NaClO$_2$ (40 g/l) and Na$_3$PO$_4$ (6 g/l) as a blackening bath (oxidation bath) and reduction treatment using an aqueous solution containing NaOH (10 g/l) and NaBH$_4$ (6 g/l) as a reduction bath were carried out to form a roughened surface (not shown in the figure) on the conductor circuit 74 including the plated through hole 79 (see FIG. 15B).

(3) Within 24 hours after preparing the resin filler described in the above-mentioned B, layers of the resin filler 80' were formed through the following method, inside the plated through hole 79, and on a portion of which the conductor circuit is not formed and on the edge of the conductor circuit 74, both of which the position is on either of the surfaces of the substrate 71.

First, after the resin filler had been filled into the plated through hole by using a squeezee, the filled-in resin was dried at 100° C. for 20 minutes. Then, a mask having an opening at a portion corresponding to the portion of which the conductor circuit is not formed was placed on the substrate, and by using a squeezee, the resin filler was also filled into the portion of which the conductor circuit is not formed that forms a concave portion, and dried at 100° C. for 20 minutes, such that the layers of the resin filler 80' were formed (see FIG. 15C).

(4) On the one side of the substrate treated as described above in the above-mentioned (3), the resin filler was ground with a belt sander grind using a #600 belt grinding paper (made by Sankyo Rikagaku Co., Ltd.) so as to leave no resin filler 80' on the surface of the conductor circuit 74 and the land surface of the plated through hole 79, and buffing was carried out to remove scratches caused by the belt sander grind. This grinding process was carried out on the other side of the substrate as well.

Then, heat treatment was carried out for 1 hour at 100° C., for 3 hours at 120° C., for 1 hour at 150° C. and for 7 hours at 180° C., such that a resin filler layer 80 was formed.

In this manner, an insulating substrate (see FIG. 15D) was obtained as follows: the surface layer portion of the resin filler 80' formed in the plated through hole 79 and the portion of which the conductor circuit is not formed, and the surface of the conductor circuit 74 were flattened, the resin filler 80' and the side faces of the conductor circuit 74 were firmly joined together via the roughened surface (not shown in the figure), and the inner wall surface of the plated through hole 79 and the resin filler 80' were firmly joined together via the roughened surface (not shown in the figure). Through these processes, the surface of the resin filler layer 80 and the surface of the conductor circuit 74 were made flush with each other.

(5) Then, the substrate was washed with water and acid-degreased, and then soft-etched, and by spraying an etching solution over both faces of the substrate, the surface of the conductor circuit 74 and the land surface of the plated through hole 79 were etched, such that a roughened surface (not shown in the figure) was formed over the entire surface of the conductor circuit 74. As the etching solution, an etching solution (MEC etch BOND made by Mec Co., Ltd.) containing 10 parts by weight of imidazole copper (II) complex, 7 parts by weight of glycolic acid and 5 parts by weight of potassium chloride was used.

(6) Then, a resin film for an insulating layer, which was slightly larger than the substrate fabricated in the above-mentioned A, was placed on the substrate, and temporarily press-bonded thereto under conditions of a pressure of 0.4 MPa, a temperature of 80° C. and a press-bonding time of 10 seconds, and subjected to a cutting process thereafter, and the resulting film was affixed thereto by using a vacuum laminator device through the following method, such that an insulating layer 72 was formed (see FIG. 15E).

In other words, the resin film for an insulating layer was actually press-bonded onto the substrate under conditions of a degree of vacuum of 65 Pa, a pressure of 0.4 MPa, a temperature of 80° C. and a press-bonding time of 60 seconds, and then heated for curing at 170° C. for 30 minutes.

(7) Next, by applying a CO$_2$ gas laser having a wavelength of 10.4 µm onto the insulating layer 72 via a mask of 1.2 mm in thickness in which a through hole was formed, under conditions of one shot of a beam diameter of 4.0 mm, in a top-hat mode, a pulse width of 8.0 µs, and the through hole of the mask having 1.0 mm in diameter, an opening 76 for a via hole of 80 µm in diameter was formed on the insulating layer 72 (see FIG. 15F).

(8) The substrate in which the opening 76 for a via hole had been formed was immersed for 10 minutes in a solution at 80° C. containing permanganate of 60 g/l, and epoxy resin particles remaining on the surface of the insulating layer 72 were dissolved and removed, such that a roughened face (not shown in the figure) was formed on the surface including the inner wall faces of the opening 76 for a via hole.

(9) Next, the substrate that had been subjected to the above-mentioned processes was immersed in a neutralizing solution (made by Shipley Co., Ltd.), and then washed with water.

On the surface of the surface-roughened substrate (roughened depth: 3 µm), a palladium catalyst was applied to deposit the catalyst nucleus on the surface of the insulating layer 72 (including the inner wall faces of the opening 76 for a via hole) (not shown in the figure). In other words, the substrate was immersed in a catalyst solution containing palladium chloride (PdCl$_2$) and stannous chloride (SnCl$_2$), such that the catalyst was applied thereto by depositing palladium metal.

(10) Next, the substrate was immersed in an electroless copper plating solution of the following composition, to form a thin-film conductor layer (electroless copper plating film) 82, 0.6 to 3.0 µm in thickness, on the surface of the insulating layer 72 (including the inner wall faces of the opening 76 for a via hole) (see FIG. 16A).

| (Electroless plating solution) | |
|---|---|
| NiSO$_4$ | 0.003 mol/l |
| Tartaric acid | 0.200 mol/l |
| Copper sulfate | 0.030 mol/l |
| HCHO | 0.050 mol/l |
| NaOH | 0.100 mol/l |
| α,α'-Bipyridyl | 100 mg/l |
| Polyethylene glycol (PEG) | 0.10 g/l |
| (Electroless plating condition) | |
| 40 minutes at a bath temperature of 30° C. | |

(11) A commercial photosensitive dry film was affixed to the substrate on which the thin-film conductor layer (electroless copper plating film) 82 was formed, and with a mask set in position, an exposure at 100 mJ/cm$^2$ and a development with a 0.8% sodium carbonate solution were carried out to provide a 20 µm-thick plating resist 73 (see FIG. 16B).

(12) Then, the substrate was washed with water at 50° C. to be degreased, and after having been washed with water at 25° C., the resulting substrate was further washed with sulfuric acid, and then subjected to electroplating under the following conditions, such that a 20 μm-thick copper electroplating film 83 was formed on the portion of which the plating resist 73 is not formed (see FIG. 16C).

|  |  |
|---|---|
| (Electroplating solution) | |
| Sulfuric acid | 2.24 mol/l |
| Copper Sulfate | 0.26 mol/l |
| Additive | 19.5 ml/l |
| (KAPARACID HL made by | |
| Atotech Japan K.K.) | |
| (Electroplating conditions) | |
| Current density | 1 A/dm$^2$ |
| Time | 65 min |
| Temperature | 22 ± 2° C. |

(13) Then, after the plating resist 73 was separated with 5% NaOH, the thin-film conductor layer beneath the plating resist 73 was etched and dissolved with a mixed solution of sulfuric acid and hydrogen peroxide to form a 18 μm-thick conductor circuit 74 (including via hole 77), constituted by the thin-film conductor layer (electroless copper plating film) 82 and the copper electroplating film 83, was formed (see FIG. 16D).

(14) By using the same etching solution as the etching solution used in the above-mentioned step (5), a roughened face (not shown in the figure) was formed on the surface of the conductor circuit 74, and the same steps as those used in the steps (6) to (8) were carried out, to laminate and form an insulating layer 72, which had an opening 76 for a via hole and was provided with the roughened face (not shown in the figure) formed on its surface

(15) Next, by using the same method as the method used in the step (9), a catalyst was applied to the surface of the insulating layer 72 (including inner wall faces of the opening 76 for a via hole), and the substrate was immersed in the same electroless copper plating aqueous solution as the electroless plating solution used in the step (10), such that a thin-film conductor layer (electroless copper plating film) 82 was formed on the surface of the insulating layer 72 (including inner wall faces of the opening 76 for a via hole) (see FIG. 17A).

(16) By using the same method as the method used in the step (11), a plating resist 73 was provided, and by using the same method as the method used in the step (12), a 20 μm-thick copper electroplating film 83 was formed on the plating resist 73 non-formation portion (see FIG. 17B).

(17) By using the same method as the method used in the step (13), the plating resist 73 was separated and the thin-film conductor layer beneath the plating resist 73 was removed to form a conductor circuit 74 (including via hole 77) (see FIG. 17C).

Furthermore, by using the same method as the method used in the step (2), oxidation-reduction treatment was carried out to form a roughened face (not shown in the figure) on the surface of the conductor circuit 74.

Thereafter, a through hole 81 for an optical path (with a rectangular shape (240 μm in width×1000 μm in length) with arcs formed on the corners in its plan view), which penetrates through the substrate 71 and the insulating layer 72, was formed by drilling, and the wall faces of the through hole 81 for an optical path were subjected to desmearing treatment (see FIG. 17D). In this case, the through hole 81 for an optical path of the batch through-hole structure was formed.

(18) Next, resin was placed on a padding mask of a printing machine and a screen printing operation was carried out, so that the through hole 81 for an optical path was filled with the resin, and this was then cured at 120° C. for one hour as well as at 150° C. for one hour. Thereafter, the resin protruding from the through hole 81 for an optical path was ground with a #3000 grind paper, and further ground with alumina particles of 0.05 μm to flatten the surface to form a resin composition layer 97 (see FIG. 18A).

In this step, the resin was prepared by adding 40% by weight of pulverized silica having a grain-size distribution of 0.1 to 0.8 μm to epoxy resin (transmittance 91%/mm, CTE 82 ppm), such that the transmittance was adjusted to 82%/mm, with CTE and the viscosity being adjusted to 42 ppm and 200000 cps, respectively.

The epoxy resin had a refractive index of 1.50 after the curing process.

(19) Next, by using the following method, an optical waveguide 50 with four cores 51a to 51d arranged therein in parallel with one another was formed at an end portion of the through hole 96 for an optical path in which the resin composition layer 97 was formed. First, an acrylic resin (refractive index: 1.52, transmittance: 94%/mm, CTE: 72 ppm) to prepare a resin for forming a core, then an acrylic resin (refractive index: 1.51, transmittance: 93%/mm, CTE: 70 ppm) to prepare a resin for forming a clad, adjusted to a transmittance of 81%/mm, a CTE of 53 ppm and a viscosity of 1000 cps by the adding of 25% by weight of pulverized silica having a grain-size distribution of 0.1 to 0.8 μm.

The resin for forming a clad was applied to an end portion of the through hole for an optical path by using a spin coater (1000 pm/10 sec), and this was pre-baked at 80° C. for 10 minutes, subjected to exposure treatment at 2000 mJ and post-baked at 150° C. for 1 hour to form a lower clad of 50 μm in thickness (see FIG. 18B).

Next, the resin for forming a core was applied onto the lower clad 52 by using a spin coater (1200 pm/10 sec), and this was pre-baked at 80° C. for 10 minutes, subjected to exposure treatment at 1000 mJ and development treatment through a dipping process using 1% TMH for 2 minutes, and post-baked at 150° C. for 1 hour to form cores 51a to 51d, each having a size of 50 μm in width×50 μm in thickness (see FIG. 18C).

Next, the resin for forming a clad was applied thereto by using a spin coater (1000 pm/10 sec), and this was pre-baked at 80° C. for 10 minutes, subjected to exposure treatment at 2000 mJ, and post-baked at 150° C. for 1 hour to form an upper clad with a thickness of 50 μm from the core, and thus, an optical waveguide 50 constituted by the cores 51a to 51d and the clad 52 were prepared.

Thereafter, a dicing process was carried out on both ends of the optical waveguide 50 by using #3000 blade with 90 degrees, and a Cr/Au metal vapor deposition process was carried out on the optical path conversion mirror face to form a optical path conversion mirror which converts an optical path to 90 degrees, with a reflective face made of the metal vapor deposition layer. Here, the transmission loss in the optical path conversion mirror thus formed was 1.2 dB.

(20) Next, a solder resist composition was prepared in the same manner as the step (19) of Example 1, and the solder resist composition was then applied to each of both faces of the substrate so as to have a thickness of 30 μm, and this was subjected to drying treatment at 70° C.

for 20 minutes and at 70° C. for 30 minutes, such that a layer 84' of the solder resist composition was formed (see FIG. 18D).

(21) Next, on a 5 mm-thick photomask having patterns of an opening for forming a solder bump and an opening for an optical path drawn thereon, held in close contact with the layer 84' of the solder resist composition on the opposite side from the side on which the optical waveguide 50 is formed, an exposure with ultraviolet rays at 1000 mJ/cm² and a development with DMTG solution were carried out to form openings. Here, the diameter of the cross section of the opening for an optical path thus formed was the same as the diameter of the cross section of the through hole for an optical path formed in the step (17).

Then, heat treatment was carried out at 80° C. for 1 hour, at 100° C. for 1 hour, at 120° C. for 1 hour, and at 150° C. for 3 hours to cure the layer of the solder resist composition, to form a solder resist layer 84 with the opening 98 for forming a solder bump and the opening 81*b* for an optical path, the layer having a thickness of 20 μm at a region in which an optical waveguide is formed and a thickness of 170 μm at a region in which an optical waveguide is not formed (see FIG. 19A).

(22) Next, the opening for an optical path formed in the step (21) was filled with the same resin composition as the resin composition including epoxy resin filled in the step (18) through screen printing, and after having been subjected to curing treatment, the substrate was subjected to grinding treatment to flatten its surface, and a resin composition layer 97 was formed thereon to provide an optical signal passing region 92 (see FIG. 19B).

(23) Then, the substrate with the solder resist layer 84 formed thereon was immersed for 20 minutes in an electroless nickel plating bath (pH=4.5) containing nickel chloride ($2.3\times10^{-1}$ mol/l), sodium hypophosphite ($2.8\times10^{-1}$ mol/l) and sodium citrate ($1.6\times10^{-1}$ mol/l) to form a 5 μm-thick nickel plating layer in the opening 98 for forming a solder bump. This substrate was immersed for 7.5 minutes in an electroless gold plating solution at 80° C., containing gold potassium cyanide ($7.6\times10^{-3}$ mol/l), ammonium chloride ($1.9\times10^{-1}$ mol/l), sodium citrate ($1.2\times10^{-1}$ mol/l) and sodium hypophosphite ($1.7\times10^{-1}$ mol/l) such that a 0.031 μm-thick gold plating layer on the nickel plating layer is formed to be solder pads 86.

(24) Next, by using an inkjet device through the following method, microlenses 96*a* to 96*d* were arranged on an end portion of the resin composition layer 97 formed in the optical signal passing region 92 on the opposite side from the side on which the optical waveguide is to be formed.

In other words, after adjusting an UV setting epoxy-based resin (transmittance: 94%/mm, refractive index: 1.53) to a viscosity of 20 cps at room temperature (25° C.), this resin was adjusted to a viscosity of 8 cps at a temperature of 40° C. in the resin container of the inkjet device, and the resin was applied to predetermined positions on the end portion of the resin composition layer 97, and this was irradiated with UV light (500 mW/min), such that the resin was cured to provide the microlenses 96*a* to 96*d*, each having a diameter of 220 μm and a sag height of 10 μm.

(25) Next, solder paste was printed on the opening 98 for forming a solder bump formed in the solder resist layer 84, such that solder bumps 87 were formed; thus, a substrate for a motherboard was obtained (see FIG. 19C).

Here, the substrate for a motherboard of this example may be manufactured through the following processes.

After the thin-film conductor layer had been formed through the step (15), without the forming of the solder resist, a solid electroplating layer was formed on the thin-film conductor layer by the same method as the step (16), and the forming of the through hole for an optical path, the filling of the resin composition and the curing and polishing processes were carried out in the same manner as the steps (17) and (18) such that the through hole penetrates through the thin-film conductor layer and the electroplating layer in this state, and thereafter, the thin-film conductor layer and the electroplating layer were subjected to an etching treatment to form a conductor circuit, and the steps subsequent to the step (19) may be carried out to manufacture a substrate for a motherboard.

Example 18

A substrate for a motherboard was obtained by carrying out the same steps as those in Example 17, except that, at the time of arranging a microlens on an end portion of the resin composition layer 97 in the step (24) of Example 17, a resin composition (transmittance: 84%/mm) prepared by adding 20% by weight of pulverized silica having a grain-size distribution of 0.1 to 0.8 μm to the epoxy resin used in Example 17 was used.

Example 19

A substrate for a motherboard was obtained by carrying out the same steps as those in Example 17, except that, at the time of arranging a microlens on an end portion of the resin composition layer 97 in the step (24) of Example 17, a resin composition (transmittance: 82%/mm) prepared by adding 40% by weight of pulverized silica having a grain-size distribution of 0.1 to 0.8 μm to the epoxy resin used in Example 17 was used.

Example 20

A substrate for a motherboard was obtained by carrying out the same steps as those in Example 17, except that, at the time of arranging a microlens on an end portion of the resin composition layer 97 in the step (24) of Example 17, a resin composition (transmittance: 82%/mm) prepared by adding 50% by weight of pulverized silica having a grain-size distribution of 0.1 to 0.8 μm to the epoxy resin used in Example 17 was used.

Example 21

A substrate for a motherboard was obtained by carrying out the same steps as those in Example 17, except that, at the time of arranging a microlens on an end portion of the resin composition layer 97 in the step (24) of Example 17, a resin composition (transmittance: 82%/mm), prepared by adding 60% by weight of pulverized silica having a grain-size distribution of 0.1 to 0.8 μm to the epoxy resin used in Example 17 was used.

Example 22

A substrate for a motherboard was obtained by carrying out the same steps as those in Example 17, except that, at the time of arranging a microlens to an end portion of the resin composition layer 97 in the step (24) of Example 17, a resin composition (transmittance: 81%/mm) prepared by adding

Example 23

A substrate for a motherboard was obtained by carrying out the same steps as those in Example 17, except that, at the time of arranging a microlens in the step (24) of Example 17, by using the following method, a microlens array with four lenses was arranged with an adhesive layer on an end portion of the optical signal passing region.

First, epoxy resin (transmittance: 91%/mm, CTE: 72 ppm) was poured into a metal mold that had been machined into a microlens array shape, and this was subjected to curing treatment at 120° C. for 1 hour and at 150° C. for 2 hours, and the cured resin was taken out of the metal mold, to fabricate a microlens array.

Next, epoxy resin (viscosity: 500 cps, refractive index: 1.45 to 1.55, transmittance: 91%/mm, CTE: 70 ppm) was applied to the end portion of the optical signal passing region on which the microlens array was to be arranged by using a dispenser, as an adhesive.

Furthermore, the microlens array with a protective tape being affixed thereto was sucked by using a suction nozzle of a flip-chip device, and mounted on the substrate with precision of 10 μm or less by using alignment marks on the substrate. Then, the adhesive was cured at 120° C. for 10 minutes.

Here, the thickness of the adhesive was set to about 5 μm.

Example 24

A substrate for a motherboard was obtained by carrying out the same steps as those in Example 17, except that, at the time of forming a through hole for an optical path in the step (17) of Example 17, four through holes for optical paths were formed with a pitch of 250 μm by using a drill having a diameter of 150 μm. Thus, the substrate for a motherboard manufactured in this example was provided with an optical signal passing region having an individual through-hole structure.

Example 25

A substrate for a motherboard was obtained by carrying out the same steps as those in Example 17, except that, at the time of forming a through hole for an optical path in the step (17) of Example 17, five through holes for optical paths were formed with a pitch of 250 μm by using a drill having a diameter of 300 μm. Thus, the substrate for a motherboard manufactured in this example was provided with an optical signal passing region having a batch through-hole structure that had a shape in which wall faces of adjacent columns are partly connected to one another, with at least one dummy column formed therein. Here, the through holes for optical paths were formed through a sequence of processes shown in FIG. 20A.

With each of the substrates for a motherboard of Examples 17 to 25 thus obtained, optical signal passing regions were formed at both ends of the optical waveguide so as to be optically connected thereto.

In this structure, an optical fiber was attached to an end portion of one of the optical signal passing regions on the opposite side from the side connected to the optical waveguide so as to direct an optical signal thereto, and a detector was attached to an end portion of the other optical signal passing region on the opposite side from the side connected to the optical waveguide. Thereafter, an optical signal of 2.5 Gbps was then transmitted via the optical fiber, and an optical signal was detected by the detector; consequently, a desired optical signal could be detected.

Therefore, it was apparent that the substrates for a motherboard manufactured in these examples make it possible to positively transmit an optical signal via the optical waveguide, the optical signal passing region and the microlens.

Moreover, with respect to each of the substrates for a motherboard according to Examples 17 to 22, the coating property of the resin at the time of arranging the microlens was examined, and the results indicate that the substrates for a motherboard according to Examples 17 to 20 are less susceptible to deviation in the amount of coat of the resin, and thus a microlens having a desired shape can be arranged and in the substrates for a motherboard according to Examples 21 and 22, although there is slight deviation in the amount of coat of the resin, the resulting microlens can sufficiently serve as a microlens.

On each of the substrates for a motherboard according to Examples 17 to 25 were carried out 250 cycles, 500 cycles and 1000 cycles of a liquid-phase temperature cycle test, one cycle consisting of a 3 minutes at −55° C. and 3 minutes at 125° C.

Thereafter, each of the substrates for a motherboard were cross-cut, and the inside of the substrate for a motherboard including the microlens, the optical signal passing region and the optical waveguide was observed for any cracks to consequently find that there were no cracks at any of the portions of the substrate for a motherboard.

Moreover, reflow processes of five times in total were carried out on each of the substrates for a motherboard according to Examples 17 to 25, and after each reflow process, the presence or absence of a crack in the microlens was observed. As a result, no cracks were observed in any of the conditions.

Here, the reflow process was carried out under the same conditions as those used for evaluating the substrates for mounting an IC chip.

Example 26

An IC chip was mounted on the substrate for mounting an IC chip manufactured through the same method as Example 1, followed by a subjecting thereof to a resin sealing process, to obtain a substrate for mounting an IC chip with a light emitting element mounted thereon.

Furthermore, a substrate for mounting an IC chip was manufactured by using the same method as Example 1, except that, a light receiving element was mounted thereon in place of the light emitting element and a microlens having a diameter of 220 μm and a sag height of 11 μm was arranged, followed by the mounting of an IC chip and a resin sealing process, and thus a substrate for mounting an IC chip with the light receiving element mounted thereon was obtained. In this case, with respect to the light receiving element, a flip-chip type PD (made by Microsemi Corp.) was used as a 4-channel array element with a pitch of 250 μm.

Moreover, a substrate for a motherboard was manufactured by using the same method as Example 17.

Next, both the substrate for mounting an IC chip with the light emitting element mounted thereon and the substrate for mounting an IC chip with the light receiving element mounted thereon were respectively aligned to face the substrate for a motherboard at its predetermined positions, and a solder connected portion (Sn/Pb eutectic solder) was formed by connecting the corresponding solder bumps to each other through a reflow process at a peak temperature of 230° C. Here, the mounting process was carried out such that the upper face of the substrate for a motherboard and the lower face of the substrate for mounting an IC chip had a gap of 300 μm.

Thereafter, a resin for under-filling was applied to the periphery of each of the substrates for mounting an IC chip, and this was subjected to curing processes at 120° C. for 1 hour and at 150° C. for 2 hours to resin-seal only the peripheral portion of each of the substrates for mounting an IC chip, and thus a device for optical communication was obtained (see FIG. 8).

Example 27

An IC chip was mounted on the substrate for mounting an IC chip manufactured through the same method as Example 14, followed by a subjecting thereof to a resin sealing process, to obtain a substrate for mounting an IC chip with a light emitting element mounted thereon.

Moreover, a substrate for mounting an IC chip was manufactured by using the same method as Example 14, except that, a light receiving element was mounted thereon in place of the light emitting element, followed by the mounting of an IC chip and a resin sealing process, and thus a substrate for mounting an IC chip with a light receiving element mounted thereon was obtained. Here, at the time of manufacturing the substrate for mounting an IC chip with the light receiving element mounted thereon, the microlens having a diameter of 220 μm was adjusted so as to have a sag height of 11 μm. In this case, with respect to the light receiving element, a flip-chip type PD (made by Microsemi Corp.) was used as a 4-channel array element with a pitch of 250 μm.

Moreover, a substrate for a motherboard was manufactured by using the same method as Example 17.

Next, in the same manner as in Example 26, each of the substrates for mounting an IC chip were connected to the substrate for a motherboard with a solder connecting portion, and then the peripheral portion of each of the substrates for mounting an IC chip was resin-sealed, such that a device for optical communication was obtained.

Example 28

A substrate for mounting an IC chip with a light emitting element mounted thereon was obtained by using the same method as Example 16. Moreover, a substrate for mounting an IC chip was manufactured by using the same method as Example 16, except that, a light receiving element was mounted thereon in place of the light emitting element. Here, at the time of manufacturing the substrate for mounting an IC chip with the light receiving element mounted thereon, the microlens having a diameter of 220 μm was adjusted so as to have a sag height of 11 μm. In this case, with respect to the light receiving element, a flip-chip type PD (made by Microsemi Corp.) was used as a 4-channel array element with a pitch of 250 μm.

Moreover, a substrate for a motherboard was manufactured by using the same method as Example 17.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained.

Example 29

An IC chip was mounted on the substrate for mounting an IC chip manufactured through the same method as Example 1, and followed by a subjecting thereof to a resin sealing process, to obtain a substrate for mounting an IC chip with a light emitting element mounted thereon.

Moreover, a substrate for mounting an IC chip was manufactured by using the same method as Example 1, except that, a light receiving element was mounted thereon in place of the light emitting element, followed by the mounting of an IC chip and a resin sealing process, and thus a substrate for mounting an IC chip with the light receiving element mounted thereon was obtained. Here, at the time of manufacturing the substrate for mounting an IC chip with the light receiving element mounted thereon, the microlens having a diameter of 220 μm was adjusted so as to have a sag height of 11 μm. In this case, with respect to the light receiving element, a flip-chip type PD (made by Microsemi Corp.) was used as a 4-channel array element with a pitch of 250 μm.

Moreover, a substrate for a motherboard was manufactured by using the same method as Example 24.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained.

Example 30

An IC chip was mounted on the substrate for mounting an IC chip manufactured through the same method as Example 14, followed by a subjecting thereof to a resin sealing process, to obtain a substrate for mounting an IC chip with a light emitting element mounted thereon.

Moreover, a substrate for mounting an IC chip was manufactured by using the same method as Example 14, except that, a light receiving element was mounted thereon in place of the light emitting element, followed by the mounting of an IC chip and a resin sealing process, and thus a substrate for mounting an IC chip with the light receiving element mounted thereon was obtained. Here, at the time of manufacturing the substrate for mounting an IC chip with the light receiving element mounted thereon, the microlens having a diameter of 220 μm was adjusted so as to have a sag height of 11 μm. In this case, with respect to the light receiving element, a flip-chip type PD (made by Microsemi Corp.) was used as a 4-channel array element with a pitch of 250 μm.

Moreover, a substrate for a motherboard was manufactured by using the same method as Example 24.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained.

Example 31

A substrate for mounting an IC chip with a light emitting element mounted thereon was obtained by using the same method as Example 16.

Moreover, a substrate for mounting an IC chip was obtained by using the same method as Example 16, except that, a light receiving element was mounted thereon in place of the light emitting element. Here, at the time of manufacturing the substrate for mounting an IC chip with the light receiving element mounted thereon, the microlens having a diameter of 220 μm was adjusted so as to have a sag height of 11 μm. With respect to the light receiving element, a flip-chip type PD (made by Microsemi Corp.) was used as a 4-channel array element with a pitch of 250 μm.

Moreover, a substrate for a motherboard was manufactured by using the same method as Example 24.

Next, in the same manner as Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained.

Example 32

An IC chip was mounted on the substrate for mounting an IC chip manufactured through almost the same method as Example 1, followed by a subjecting thereof to a resin sealing process, to obtain a substrate for mounting an IC chip with a light emitting element mounted thereon. The substrate, the insulating layer and the solder resist layer of the substrate for mounting an IC chip thus formed had a total thickness of 550 μm, and a microlens having a diameter of 220 μm and a sag height of 85 μm was arranged thereon. Moreover, the optical signal passing region was formed so as to have a cross section in which semi-circles having a radius of 150 μm were attached to both sides of a rectangular shape having a size of 300×750 μm. The through hole for an optical path was formed by a router machining process.

Moreover, a substrate for mounting an IC chip was manufactured by using the same method as Example 14, except that, a light receiving element was mounted thereon in place of the light emitting element, followed by a subjecting to an IC chip mounting process and a resin sealing process, to obtain a substrate for mounting an IC chip with the light receiving element mounted thereon. The substrate, the insulating layer and the solder resist layer of the substrate for mounting an IC chip thus formed had a total thickness of 1950 μm, and a microlens having a diameter of 220 μm and a sag height of 75 μm was arranged thereon. With respect to the light receiving element, a flip-chip type PD (made by Microsemi Corp.) was used as a 4-channel array element with a pitch of 250 μm. Moreover, the optical signal passing region was formed so as to have a cross section in which semi-circles having a radius of 150 μm were attached to both sides of a rectangular shape having a size of 300×750 μm. The through hole for an optical path was formed by a router machining process.

A substrate for a motherboard was manufactured by using the same method as Example 17, except that, there was a change in the position of which the optical waveguide was to be formed, and further the optical signal passing region was not formed. More specifically, a substrate for a motherboard was manufactured by using the same method as Example 17, except that, after a conductor circuit and an insulating layer had been formed on both faces of the substrate, an optical waveguide film having an optical path conversion mirror formed thereon was affixed onto the outermost layer of the insulating layer on the side on which a substrate for mounting an IC chip was to be mounted. In this case, the optical signal passing region that penetrates through the substrate and the insulating layer was not formed.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained.

Example 33

An IC chip was mounted on the substrate for mounting an IC chip manufactured through almost the same method as Example 1, followed by a subjecting thereof to a resin sealing process, to obtain a substrate for mounting an IC chip with a light emitting element mounted thereon. The substrate, the insulating layer and the solder resist layer of the substrate for mounting an IC chip thus obtained had a total thickness of 550 μm, and a microlens having a diameter of 220 μm and a sag height of 64 pm was arranged thereon. Moreover, the optical signal passing region was formed so as to have a cross section in which semi-circles having a radius of 150 μm were attached to both sides of a rectangular shape having a size of 300×750 μm. The through hole for an optical path was formed by a router machining process.

Moreover, a substrate for mounting an IC chip was manufactured by using the same method as Example 1, except that, a light receiving element was mounted in place of the light emitting element, and the microlens were not arranged, followed by the mounting of an IC chip and a resin sealing process, such that a substrate for mounting an IC chip with the light receiving element mounted thereon. The substrate, the insulating layer and the solder resist layer of the substrate for mounting an IC chip thus obtained had a total thickness of 1950 μm, and with respect to the light receiving element, a flip-chip type PD (made by Microsemi Corp.) was used as a 4-channel array element with a pitch of 250 μm. Moreover, the optical signal passing region was formed to have a cross section in which semi-circles having a radius of 150 μm were attached to both sides of a rectangular shape having a size of 300×750 μm. The through hole for an optical path was formed by a router machining process.

Moreover, a substrate for a motherboard was manufactured by using the same method as Example 17. The substrate for a motherboard was manufactured, such that the substrate, the insulating layer and the solder resist layer on the opposite side from the side on which the optical waveguide was formed had a total thickness of 450 μm. Here, the microlens was arranged on only the end portion of the optical signal passing region on the side on which a substrate for mounting an IC chip with the light receiving element mounted thereon was mounted, and the size thereof was set to 220 μm in diameter and 50 μm in sag height.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained. The mounting process was carried out such that the upper face of the substrate for a motherboard and the lower face of the substrate for mounting an IC chip had a gap of 300 μm.

Example 34

An IC chip was mounted on the substrate for mounting an IC chip manufactured through almost the same method as Example 1, followed by a subjecting thereof to a resin sealing process, to form a substrate for mounting an IC chip with a light emitting element mounted thereon. The substrate, the insulating layer and the solder resist layer of the substrate for mounting an IC chip thus obtained had a total thickness of 550

μm, and a microlens having a diameter of 220 μm and a sag height of 74 μm was arranged thereon. Moreover, the optical signal passing region was formed to have a cross section in which semi-circles having a radius of 150 μm were attached to both sides of a rectangular shape having a size of 300×750 μm. The through hole for an optical path was formed by a router machining process. Moreover, a substrate for mounting an IC chip was manufactured by using the same method as Example 1, except that, a light receiving element was mounted in place of the light emitting element, followed by the mounting of an IC chip and a resin sealing process, such that a substrate for mounting an IC chip with the light receiving element mounted thereon was obtained. The substrate, the insulating layer and the solder resist layer of the substrate for mounting an IC chip thus obtained had a total thickness of 1950 μm, and a microlens having a diameter of 220 μm and a sag height of 80 μm was arranged thereon. With respect to the light receiving element, a flip-chip type PD (made by Microsemi Corp.) was used as a 4-channel array element with a pitch of 250 μm. Moreover, the optical signal passing region was formed to have a cross section in which semi-circles having a radius of 150 μm were attached to both sides of a rectangular shape having a size of 300×750 μm. The through hole for an optical path was formed by a router machining process.

Moreover, a substrate for a motherboard was manufactured by using the same method as Example 17 except that microlens was not arranged. The substrate for a motherboard was manufactured such that the substrate, the insulating layer and the solder resist layer on the opposite side from the side on which the optical waveguide was formed had a total thickness of 150 μm.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained. The mounting process was carried out such that the upper face of the substrate for a motherboard and the lower face of the substrate for mounting an IC chip had a gap of 100 μm.

When the thickness of the substrate for a motherboard was comparatively thin as in the case of this example, so as to prevent the substrate for a motherboard from warping, a reinforcing member may be arranged on the face on the opposite side from the side on which the substrate for mounting an IC chip and the like was mounted.

Example 35

An IC chip was mounted on the substrate for mounting an IC chip manufactured by using almost the same method as Example 1 except that microlens was not arranged, followed by a subjecting thereof to a resin sealing process, to obtain a substrate for mounting an IC chip with a light emitting element mounted thereon. The substrate, the insulating layer and the solder resist layer of the substrate for mounting an IC chip thus obtained had a total thickness of 550 μm, and the optical signal passing region was formed to have a cross section in which semi-circles having a radius of 150 μm were attached to both sides of a rectangular shape having a size of 300×750 μm. The through hole for an optical path was formed by a router machining process.

Moreover, a substrate for mounting an IC chip was manufactured by using the same method as Example 1, except that, a light receiving element was mounted in place of the light emitting element, and microlens was not arranged, followed by the mounting of an IC chip and a resin sealing process, such that a substrate for mounting an IC chip with the light receiving element mounted thereon was obtained. The substrate, the insulating layer and the solder resist layer of the substrate for mounting an IC chip thus obtained had a total thickness of 1950 μm, and with respect to the light receiving element, a flip-chip type PD (made by Microsemi Corp.) was used as a 4-channel array element with a pitch of 250 μm. Moreover, the optical signal passing region was formed to have a cross section in which semi-circles having a radius of 150 μm were attached to both sides of a rectangular shape having a size of 300×750 μm. The through hole for an optical path was formed by a router machining process.

Moreover, a substrate for a motherboard was manufactured by using the same method as Example 17. The substrate for a motherboard was manufactured such that the substrate, the insulating layer and the solder resist layer on the opposite side from the side on which the optical waveguide was formed had a total thickness of 450 μm. Here, the size of the microlens arranged on the end portion on the side on which the substrate for mounting an IC chip with the light emitting element mounted thereon was mounted was 220 μm in diameter and 71 μm in sag height, and the size of the microlens arranged on the end portion of the optical signal passing region on the side on which the substrate for mounting an IC chip with the light receiving element mounted thereon was mounted was 220 μm in diameter and 50 μm in sag height.

Next, in the same manner as in Example 26, each of the substrates for mounting an IC chip were connected to the substrate for a motherboard with a solder connecting portion, and the peripheral portion of each of the substrates for mounting an IC chip was then resin-sealed, such that a device for optical communication was obtained. The mounting process was carried out such that the upper face of the substrate for a motherboard and the lower face of the substrate for mounting an IC chip had a gap of 100 μm.

Example 36

(1) By using the same steps as the steps of (1) to (17) of Example 17, a conductor circuit and an insulating layer were laminated on the substrate, and a through hole for an optical path was formed therein. The through hole for an optical path was formed by using a router machining process in place of a drilling process, and its cross section was formed into a shape in which semi-circles having a radius of 170 μm were attached to both sides of a rectangular shape having a size of 340×1040 μm.

(2) Next, two lens bases made of the same material as that of the microlens, each having a size of 300×1000×500 μm, were fabricated separately, and on one of the lens bases, four microlenses, each having a diameter of 220 μm and a sag height of 53 μm, with a pitch of 250 μm were fabricated as microlens member A, while on the other lens base, four microlenses, each having a diameter of 220 μm and a sag height of 45 μm, with a pitch of 250 μm were fabricated as a microlens member B.

Thereafter, the microlens members A and B were attached to the through hole for an optical path with an adhesive. Here, the microlens members were arranged such that the bottom face thereof (face on the opposite side from the side on which the microlenses were formed) and the surface of the outermost layer of the insulating layer on the side on which the optical waveguide was to be formed in the subsequent process were made flush with each other.

(3) Next, a film made of a solder resist composition was affixed thereto to form a solder resist composition layer, and by using the same steps as the steps (21) to (25) of Example 17, an optical signal passing region, solder bumps and the like were formed, and thus a substrate for a motherboard was manufactured.

In the substrate for a motherboard obtained in this example, the microlenses is arranged inside the optical signal passing region.

Moreover, the substrate for a motherboard was designed to have a total thickness of 900 μm of the substrate, the insulating layer and the solder resist layer on the opposite side from the side on which the optical waveguide was formed.

(4) Next, a flip-chip type VCSEL (ULM made by Photonics Co. Ltd.: 250 μm pitch, 4 channels) and a flip-chip type PD (made by Microsemi Corp.: 250 μm pitch, 4 channels) were mounted on the substrate for a motherboard manufactured through the above-mentioned steps, to manufacture a device for optical communication. Here, both the VCSEL and PD were mounted such that the gap thereof to the upper face of the substrate for a motherboard was 50 μm.

With respect to the devices for optical communication according to Examples 26 to 36 thus obtained, an optical signal, emitted by letting the light emitting element (VCSEL) mounted on the substrate for mounting an IC chip to emit light, is received by the light receiving element (PINPD) mounted on the substrate for mounting an IC chip via the optical signal passing region of the substrate for mounting an IC chip with the light emitting element mounted thereon, the optical signal passing region and the optical waveguide formed on the substrate for a motherboard, the optical signal passing region of the substrate for mounting an IC chip with the light receiving element mounted thereon and the microlenses arranged on the end portions of each of the optical signal passing regions, and then the eye pattern of the electric signal which passed through the IC chip was confirmed; consequently, a transmitted signal with 2.5 Gbps was confirmed.

Accordingly, it is apparent that the devices for optical communication manufactured in these examples can positively transmit an optical signal via the optical waveguide, the optical signal passing region and the microlens.

On each of the devices for optical communication according to Examples 26 to 36 were carried out 250 cycles, 500 cycles and 1000 cycles of a liquid-phase temperature cycle test, one cycle consisting of a 3 minutes at −55° C. and 3 minutes at 125° C.

Thereafter, each of the devices for optical communication were cross-cut, and the inside of the device for optical communication including the microlens, the optical signal passing region and the optical waveguide was observed for any cracks to consequently find that there were no cracks at any of the portions of the device for optical communication.

Comparative Example 1

First, a substrate for mounting an IC chip with a light emitting element mounted thereon was manufactured by using the same processes as Example 1, except that, the step (24) (microlens arranging process) of Example 1 was not carried out. Thereafter, the mounting of an IC chip and a resin-sealing process were carried out, such that a substrate for mounting an IC chip was prepared.

When the transmitting property of an optical signal of this substrate for mounting an IC chip according to Comparative Example 1 was evaluated in the same manner as the substrate for mounting an IC chip according to Example 1, there was sometimes observed an occurrence of a transmission error of the optical signal.

Comparative Example 2

A substrate for a motherboard was manufactured by using the same processes as Example 17, except that, the step (24) (microlens arranging process) of Example 17 was not carried out.

When the transmitting property of an optical signal of the substrate for a motherboard according to Comparative Example 2 was evaluated in the same manner as the substrate for a motherboard according to Example 17, there was some times observed an occurrence of a transmission error of the optical signal.

Comparative Example 3

A substrate for mounting an IC chip with a light emitting element mounted thereon was obtained by using the same method as Comparative Example 1.

Moreover, a substrate for mounting an IC chip was obtained by using the same method as Comparative Example 1 except that a light receiving element was mounted in place of the light emitting element.

Furthermore, a substrate for a motherboard was manufactured by using the same method as Comparative Example 2.

Next, in the same manner as in Example 26, each of the substrates for mounting an IC chip were connected to the substrate for a motherboard with a solder connecting portion, and the peripheral portion of each of the substrates for mounting an IC chip was resin-sealed, such that a device for optical communication was obtained.

The transmission performance of an optical signal of the device for optical communication manufactured in Comparative Example 3 was evaluated in the same manner as the device for optical communication according to Example 26.

As a result, when an optical signal was transmitted from the light emitting element to the light receiving element of the device for optical communication according to Comparative Example 3, there was sometimes observed an occurrence of a transmission error of the optical signal.

BRIEF DESCRIPTION OF THE DRAWINGS

FIGS. 20-1A to 20-1D are schematic diagrams that illustrate a test method for examining the relationship between a formation order of a through hole and a positional deviation of the through hole.

FIGS. 20-2E and 20-2F are schematic diagrams that illustrate an optical path for transmitting an optical signal having a batch through-hole structure.

Figure 1A:
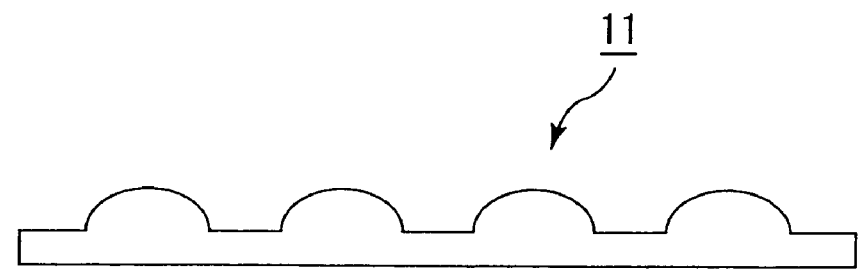
FIGS. 1A to 1C are cross-sectional views that schematically show examples of respective microlens arrays.
Figure 1B:
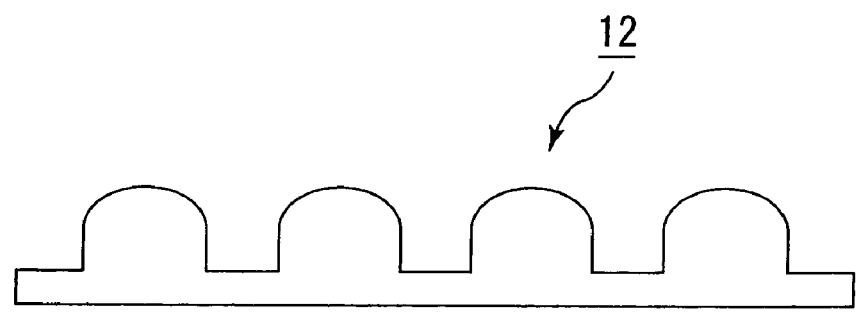
Figure 1C:
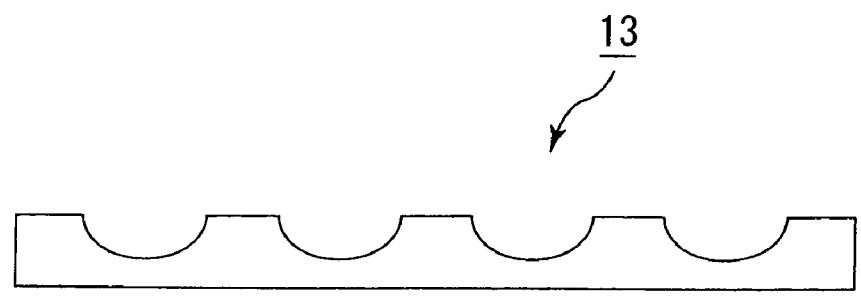
Figure 2:
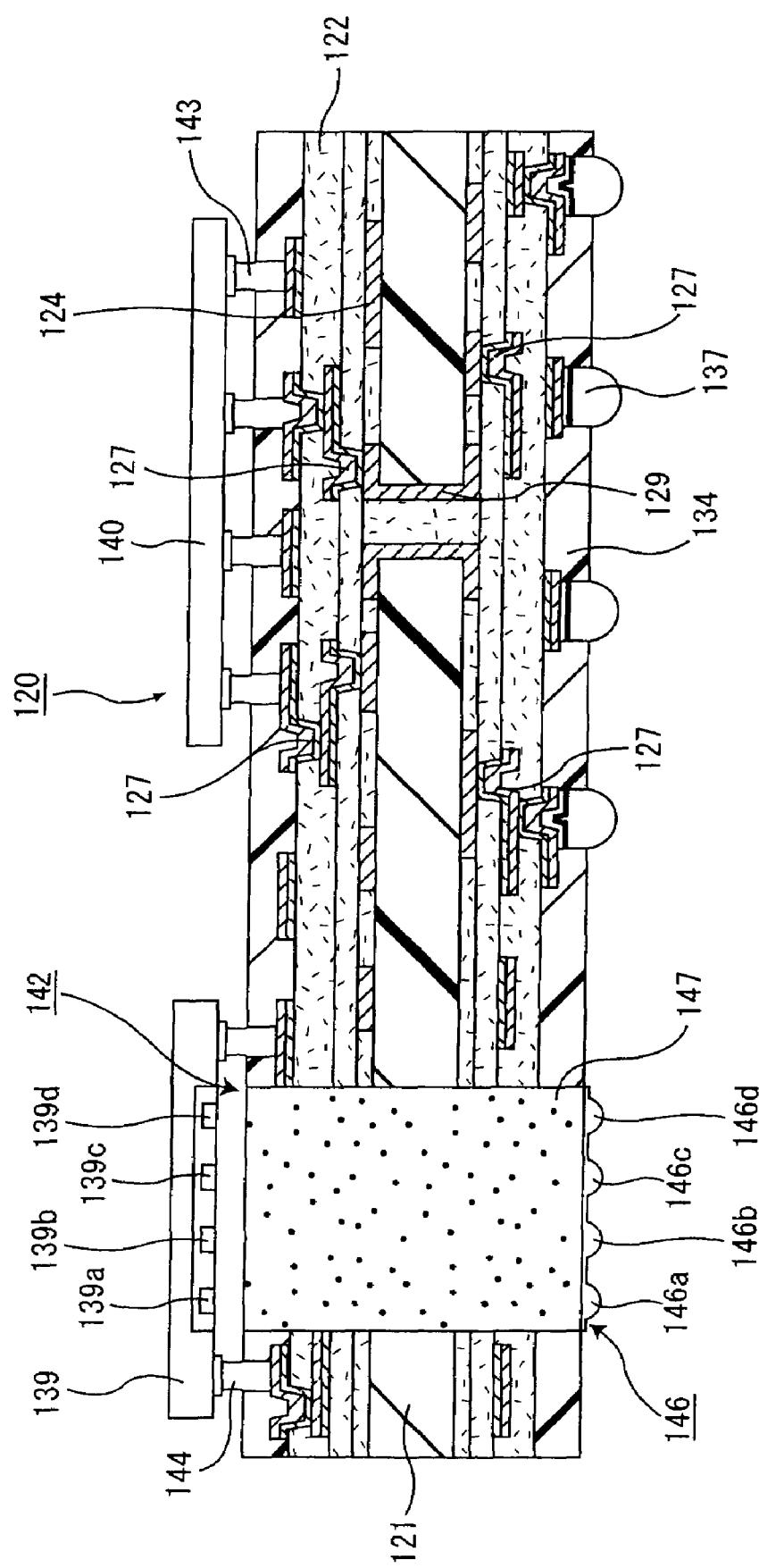
FIG. 2 is a cross-sectional view that schematically shows an example of a substrate for mounting an IC chip according to a first aspect of the present invention.
Figure 3:
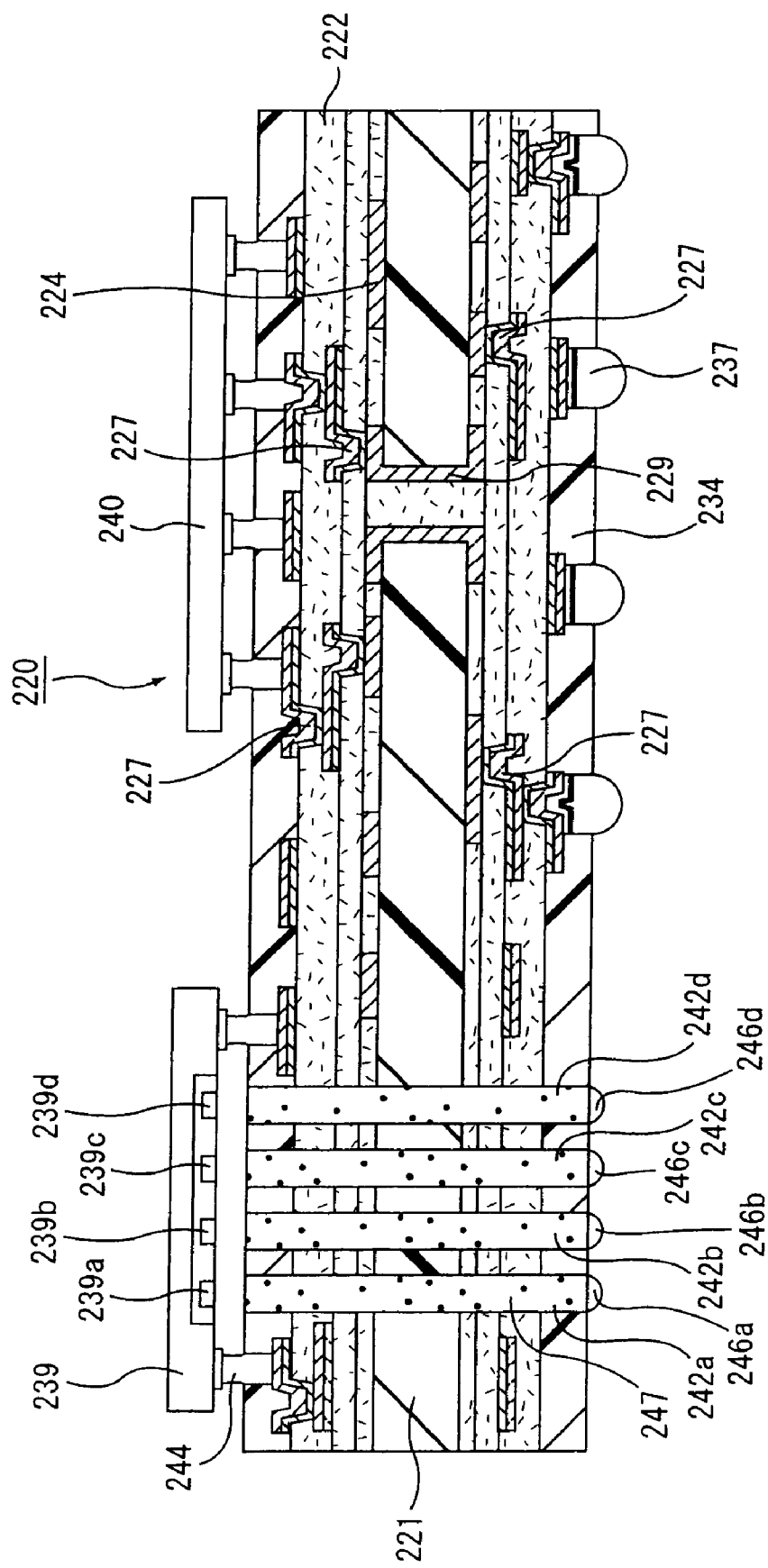
FIG. 3 is a cross-sectional view that schematically shows another example of the substrate for mounting an IC chip according to the first aspect of the present invention.
Figure 4:
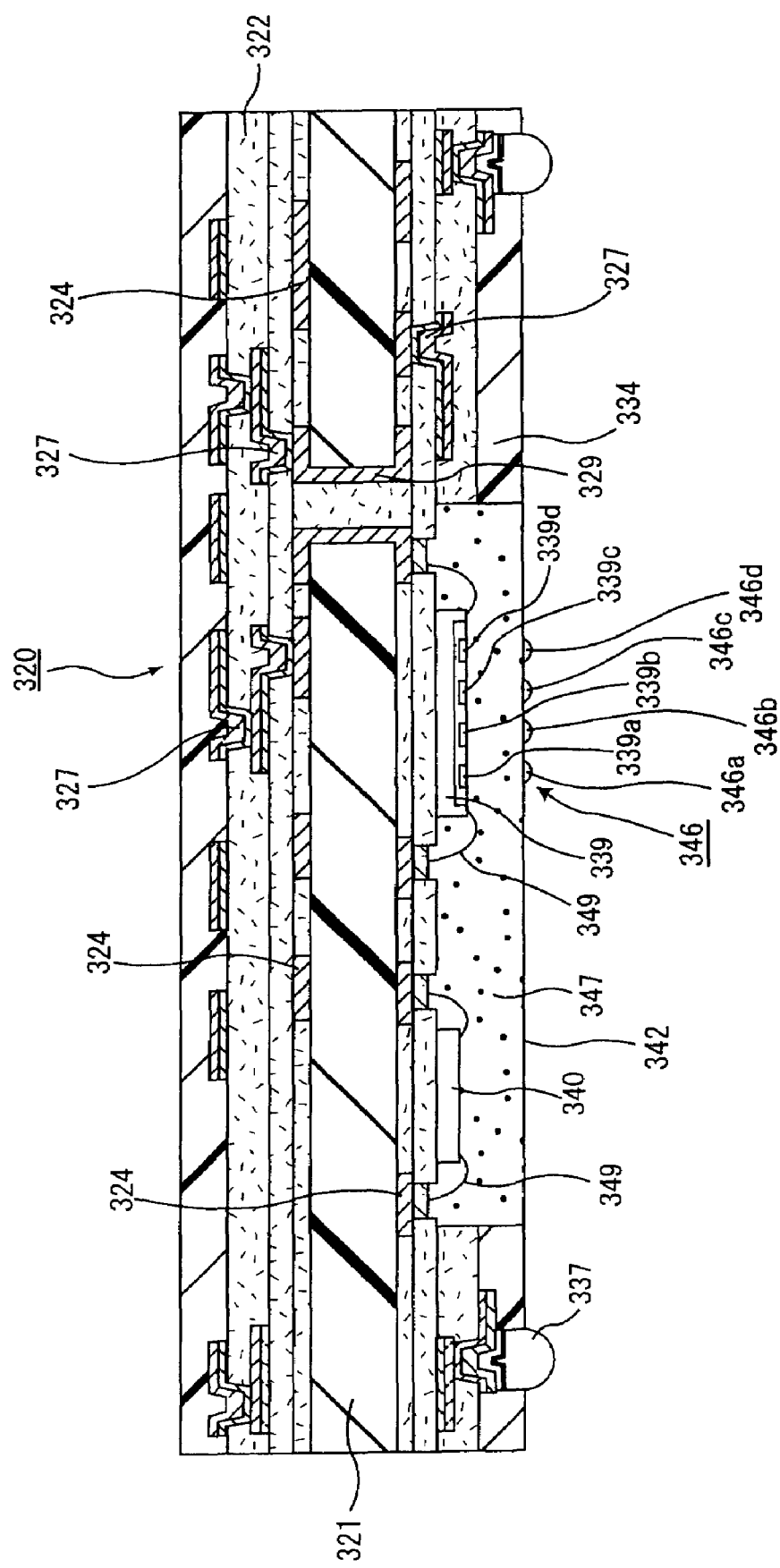
FIG. 4 is a cross-sectional view that schematically shows still another example of the substrate for mounting an IC chip according to the first aspect of the present invention.
Figure 5:
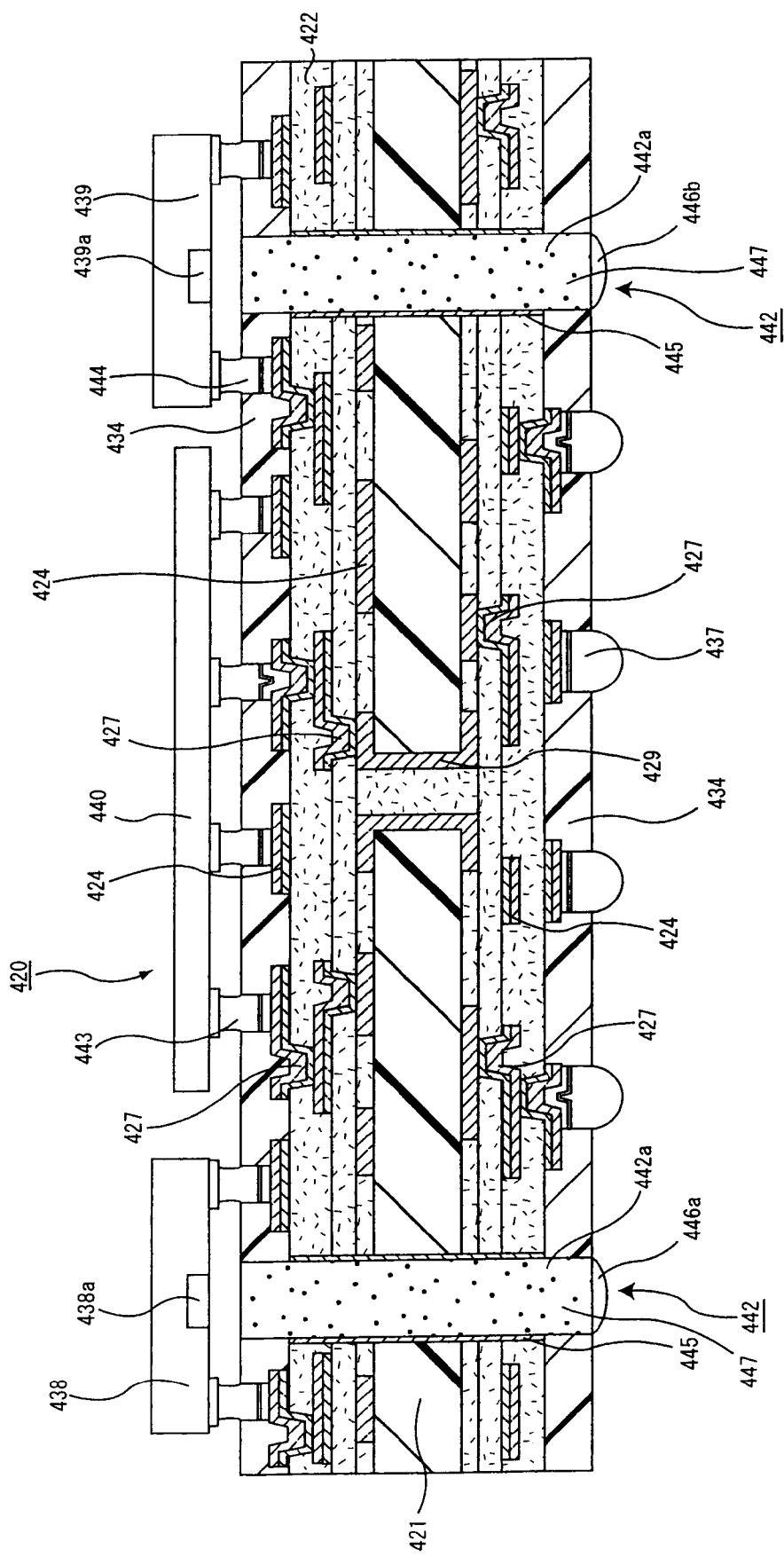
FIG. 5 is a cross-sectional view that schematically shows yet another example of the substrate for mounting an IC chip according to the first aspect of the present invention.
Figure 6:
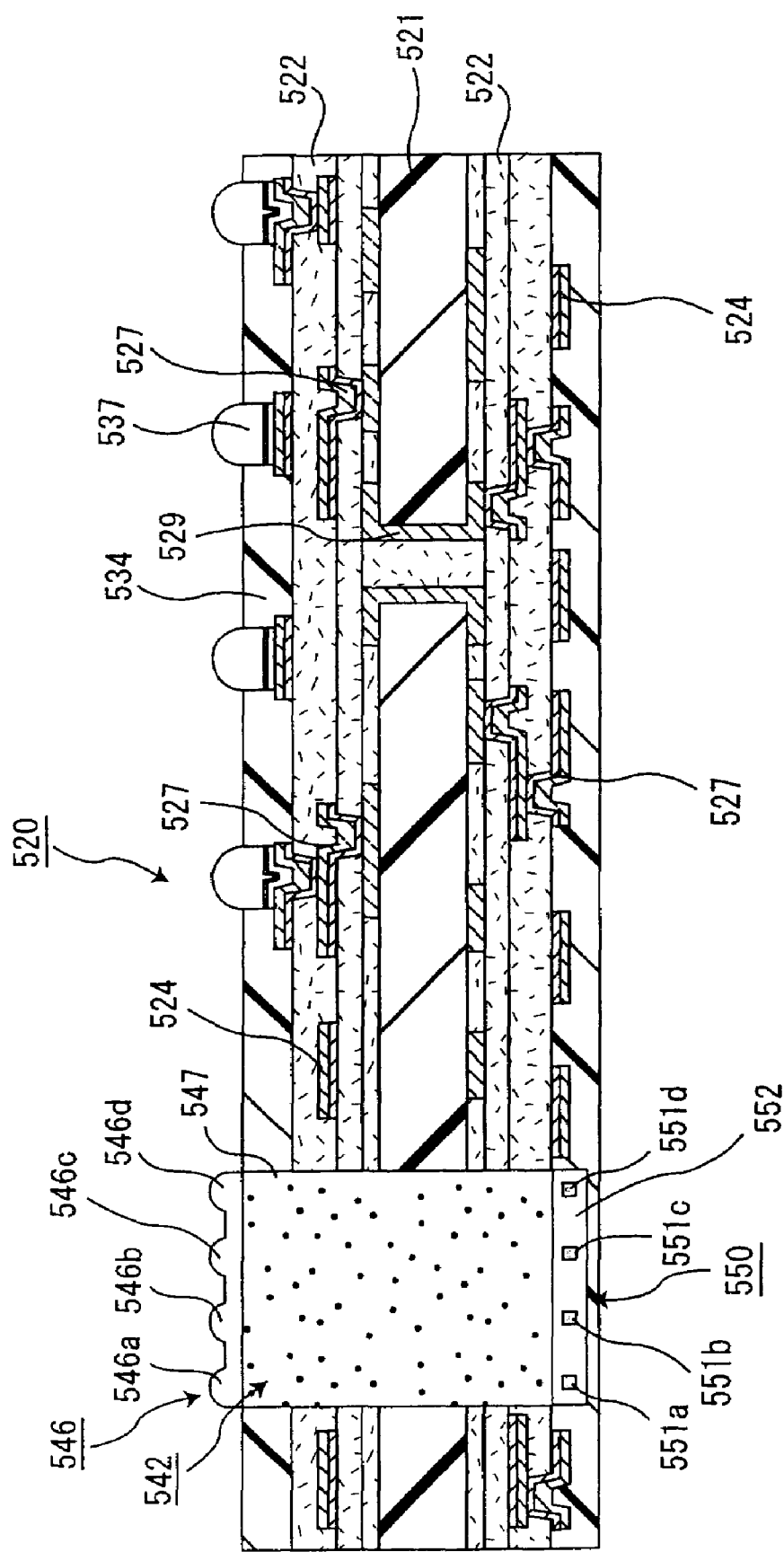
FIG. 6 is a cross-sectional view that schematically shows an example of a substrate for a motherboard according to a second aspect of the present invention.
Figure 7:
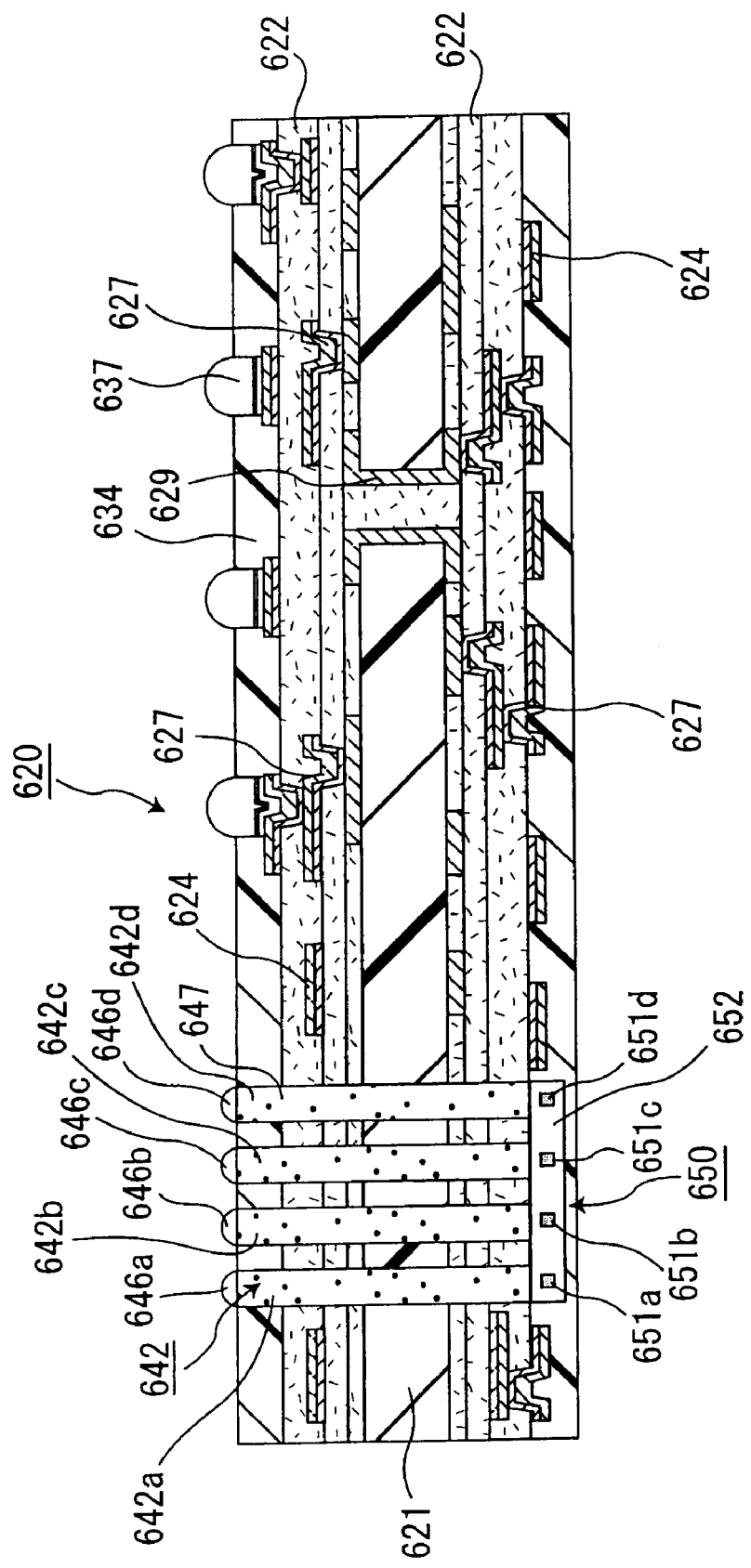
FIG. 7 is a cross-sectional view that schematically shows another example of the substrate for a motherboard according to the second aspect of the present invention.
Figure 8:
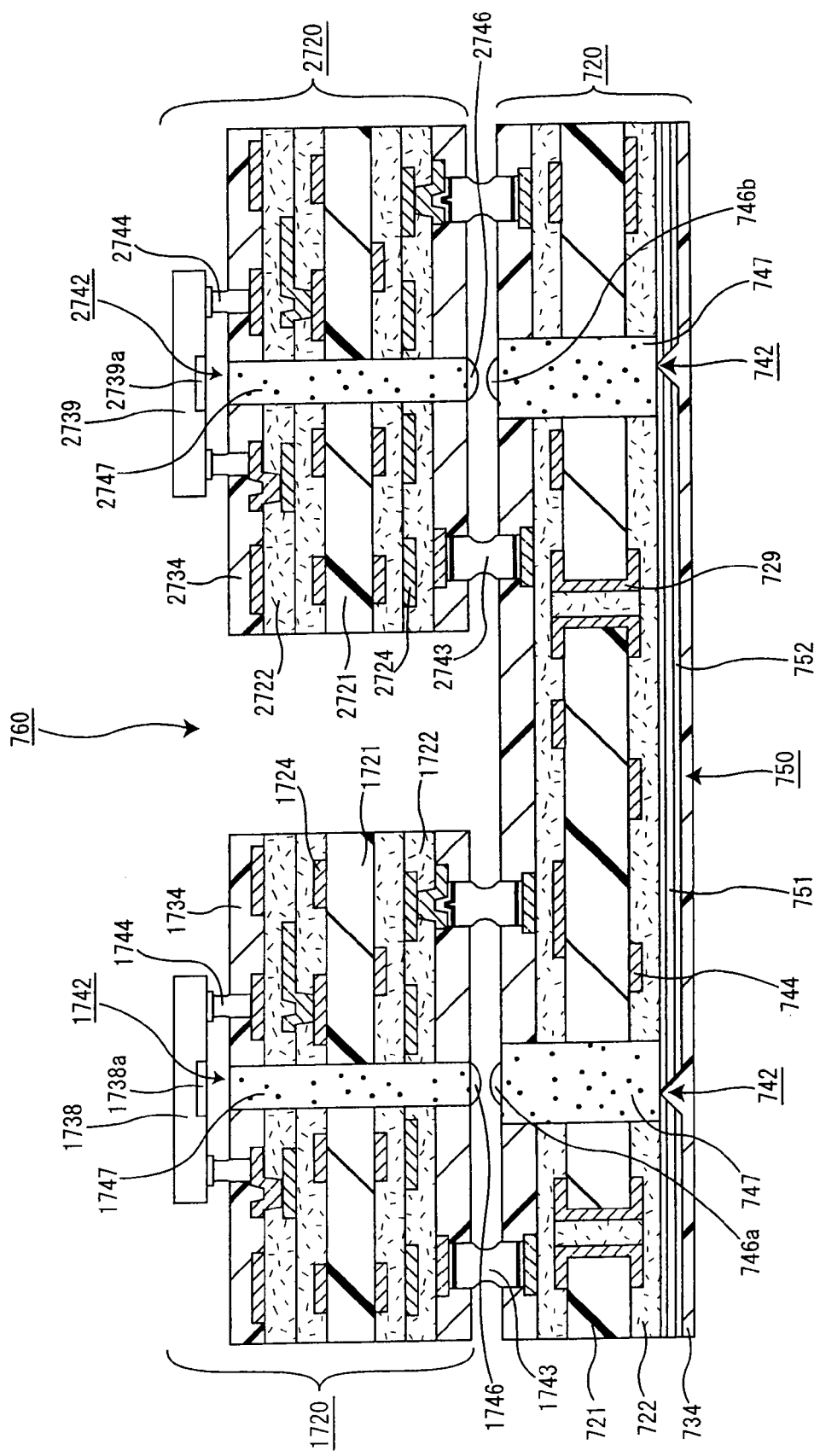
FIG. 8 is a cross-sectional view that schematically shows an example of an embodiment of a device for optical communication according to a third aspect of the present invention.
Figure 9:
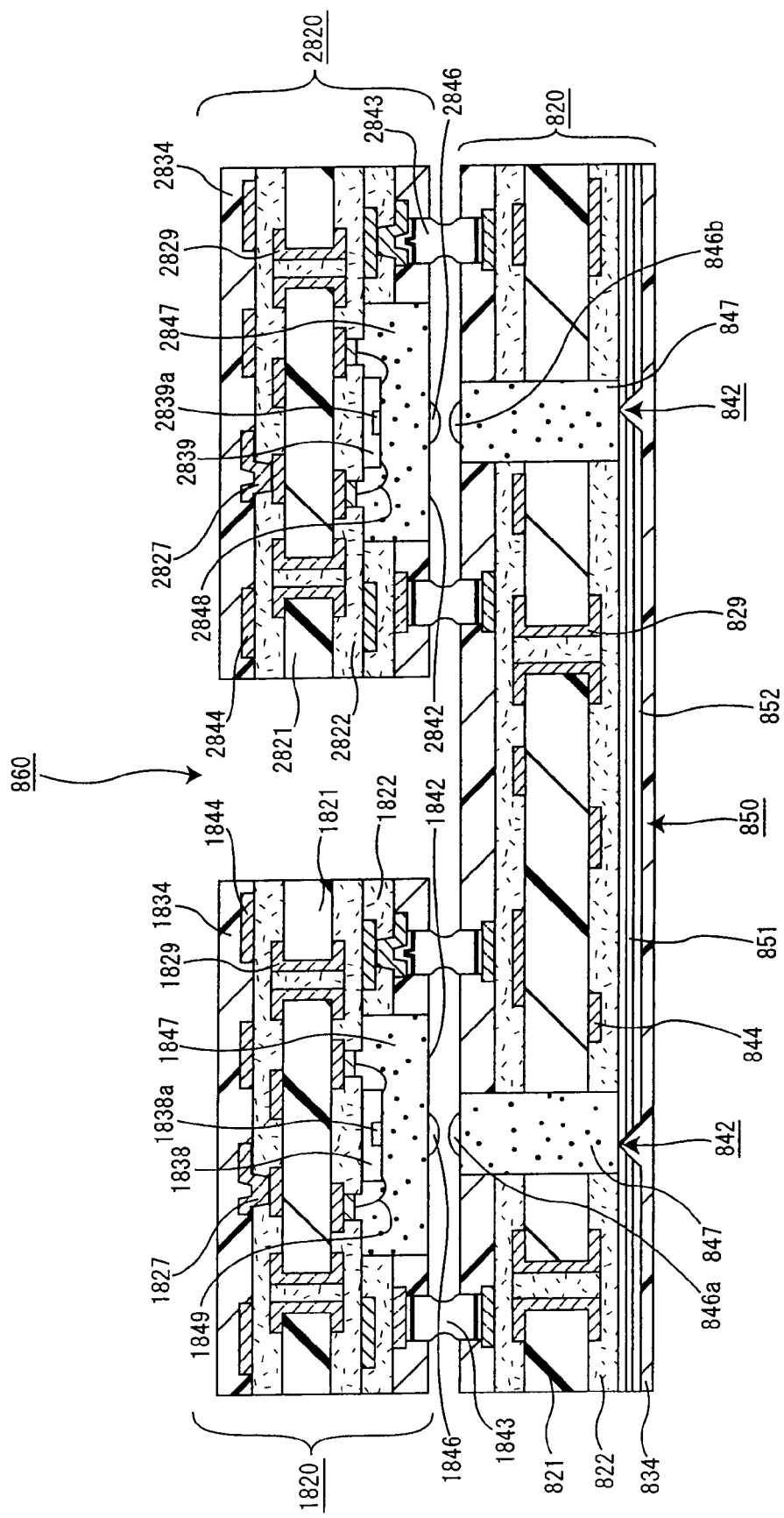
FIG. 9 is a cross-sectional view that schematically shows another example of the embodiment of the device for optical communication according to the third aspect of the present invention.
Figure 10A:
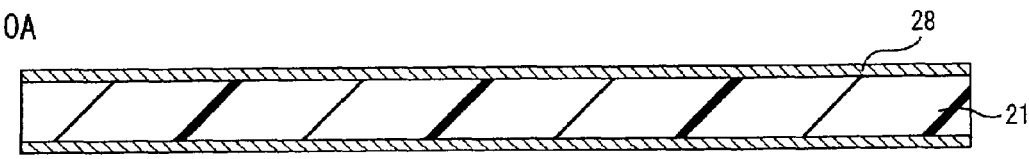
FIG. 10 is across-sectional view that schematically shows a part of a manufacturing method of the substrate for mounting an IC chip according to the first aspect of the present invention.
Figure 10B:
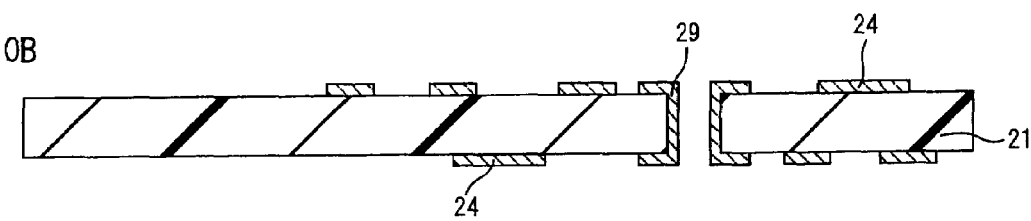
Figure 10C:
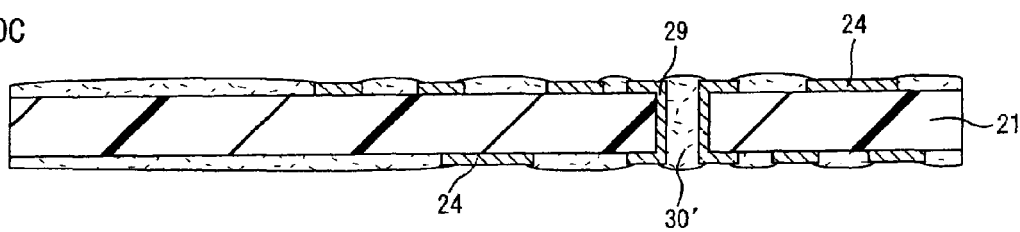
Figure 10D:
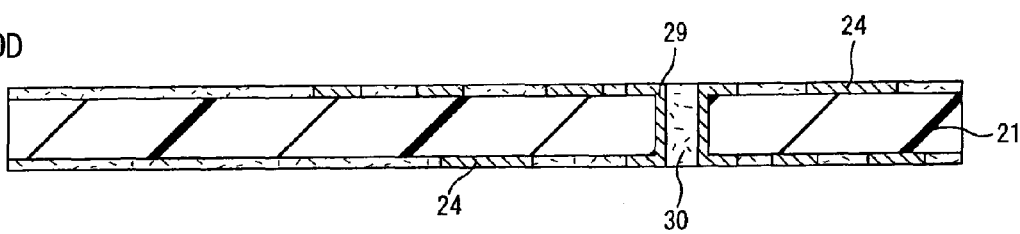
Figure 10E:
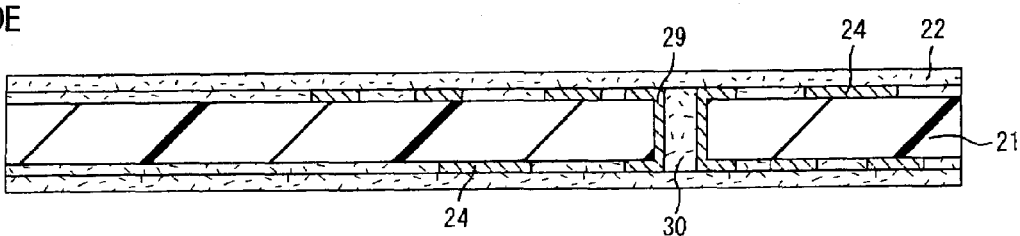
Figure 10F:
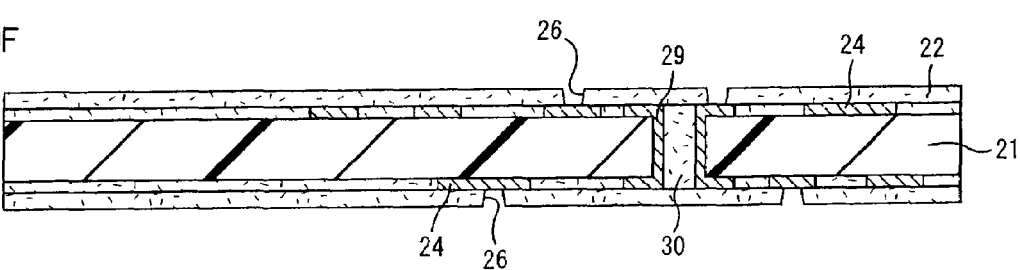
Figure 11A:
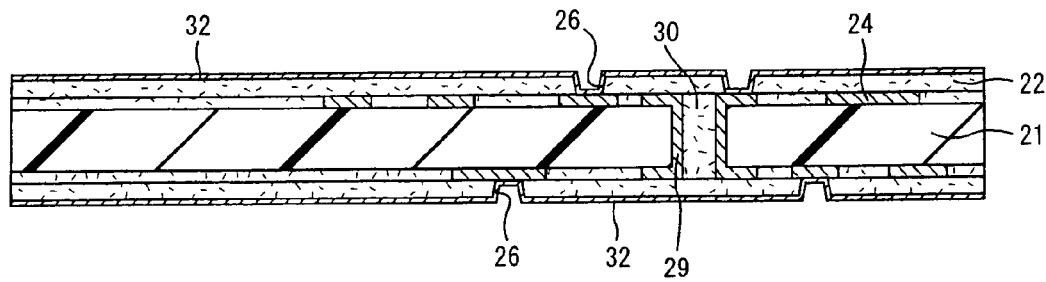
FIG. 11 is across-sectional view that schematically shows a part of a manufacturing method of the substrate for mounting an IC chip according to the first aspect of the present invention.
Figure 11B:
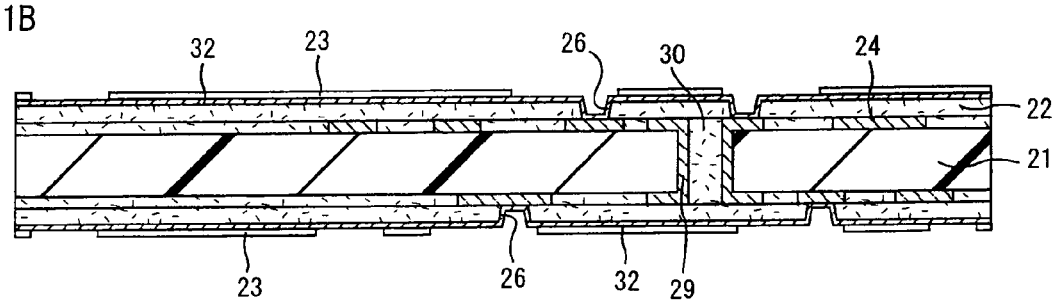
Figure 11C:
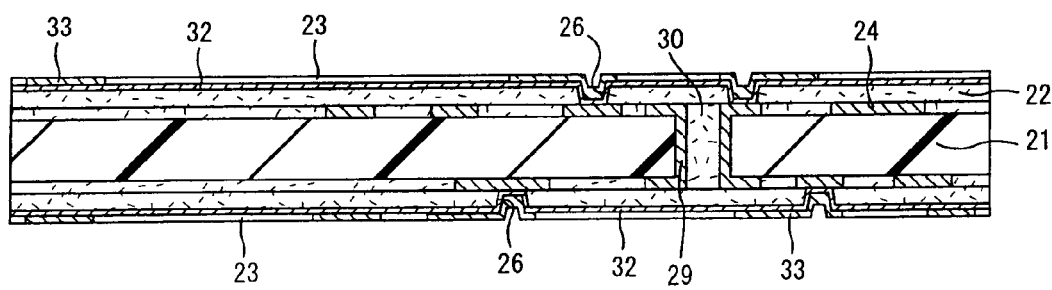
Figure 11D:
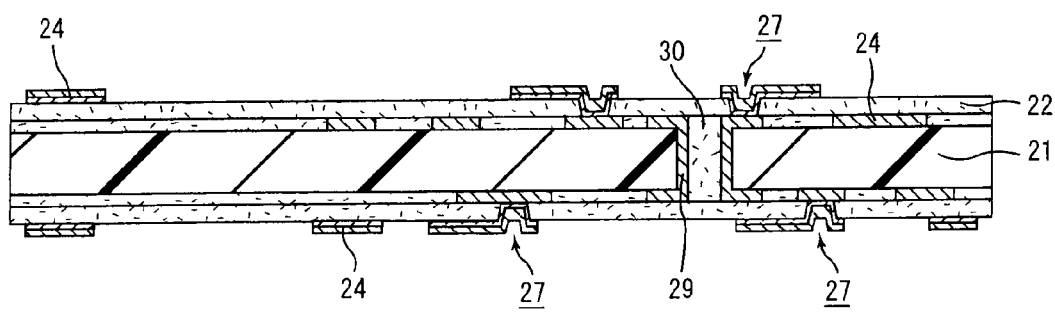
Figure 12A:
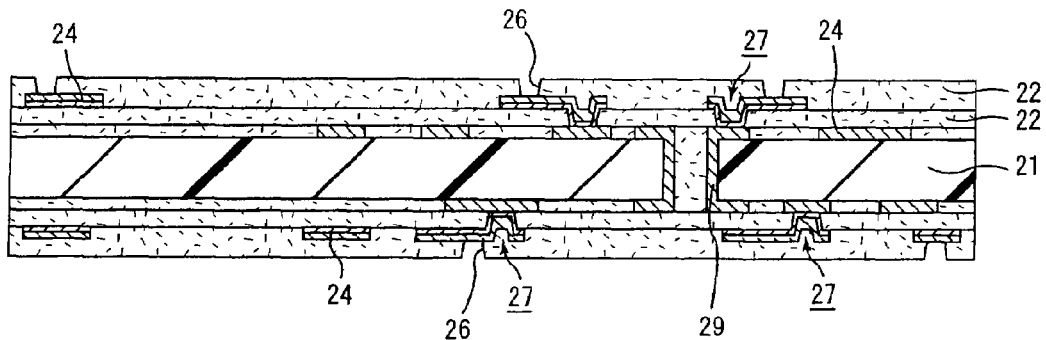
FIG. 12 is a cross-sectional view that schematically shows a part of a manufacturing method of the substrate for mounting an IC chip according to the first aspect of the present invention.
Figure 12B:
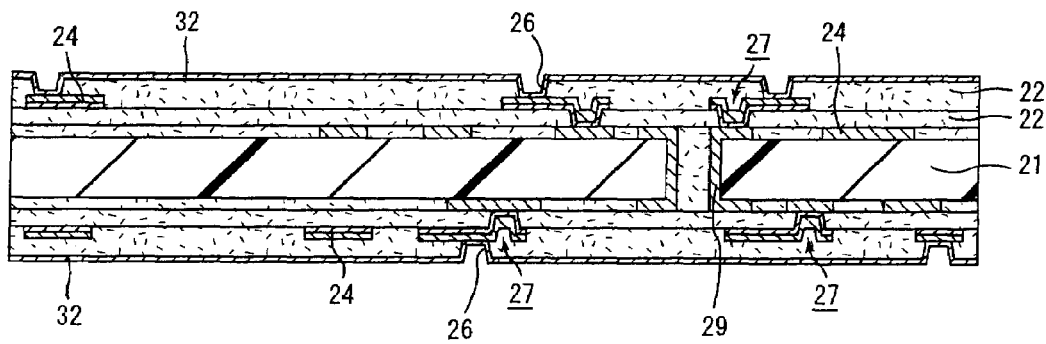
Figure 12C:
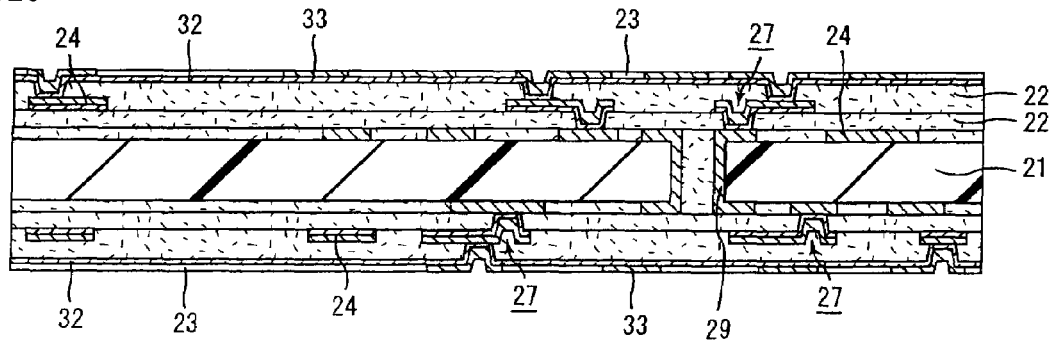
Figure 12D:
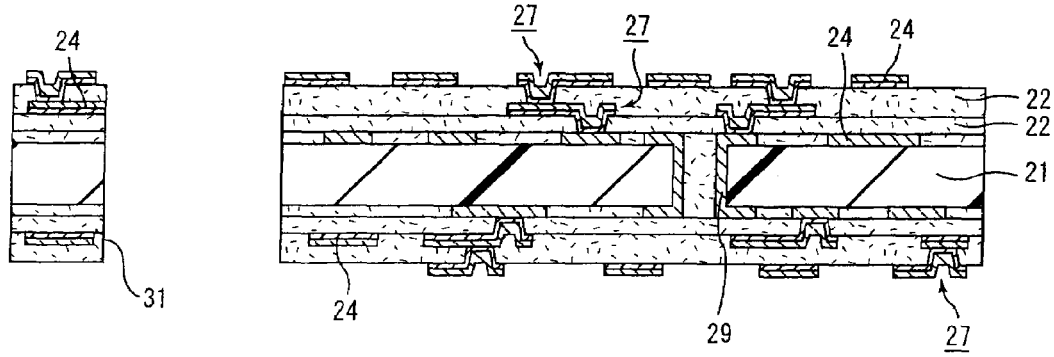
Figure 13A:
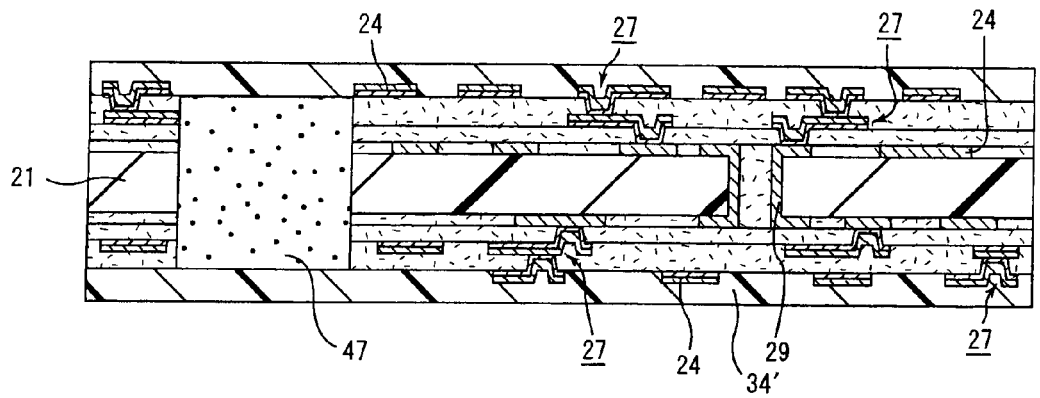
FIG. 13 is across-sectional view that schematically shows a part of a manufacturing method of the substrate for mounting an IC chip according to the first aspect of the present invention.
Figure 13B:
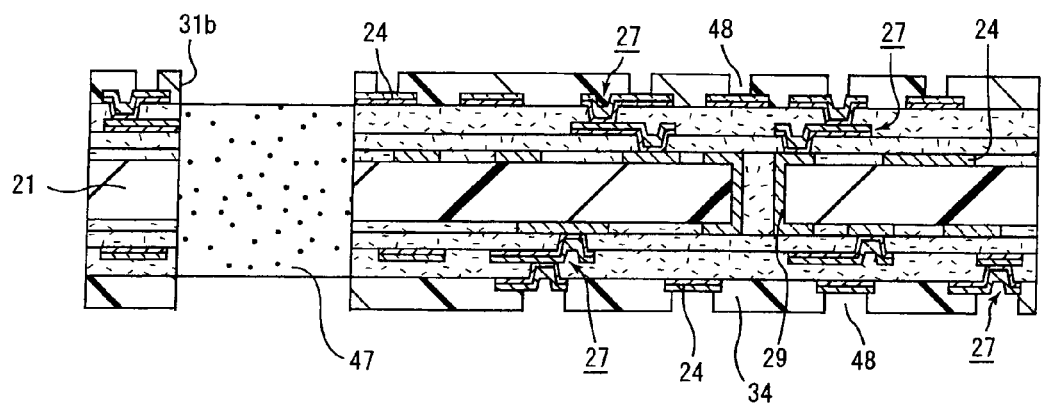
Figure 13C:
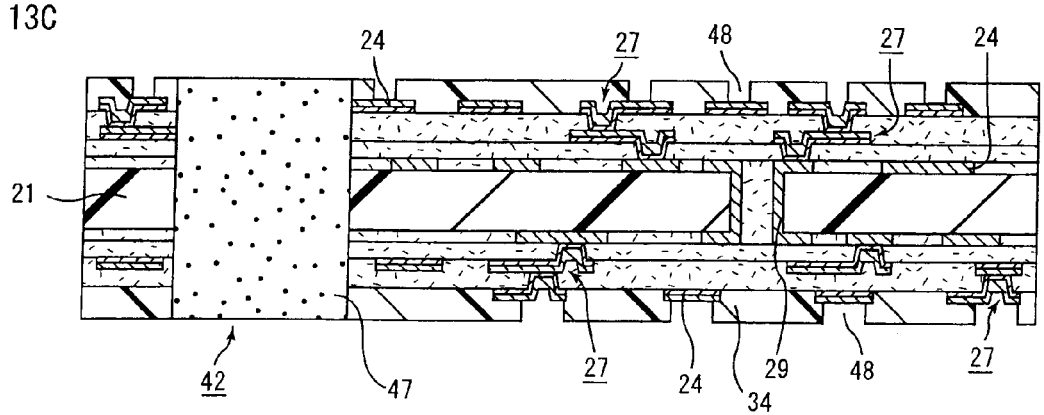
Figure 14A:
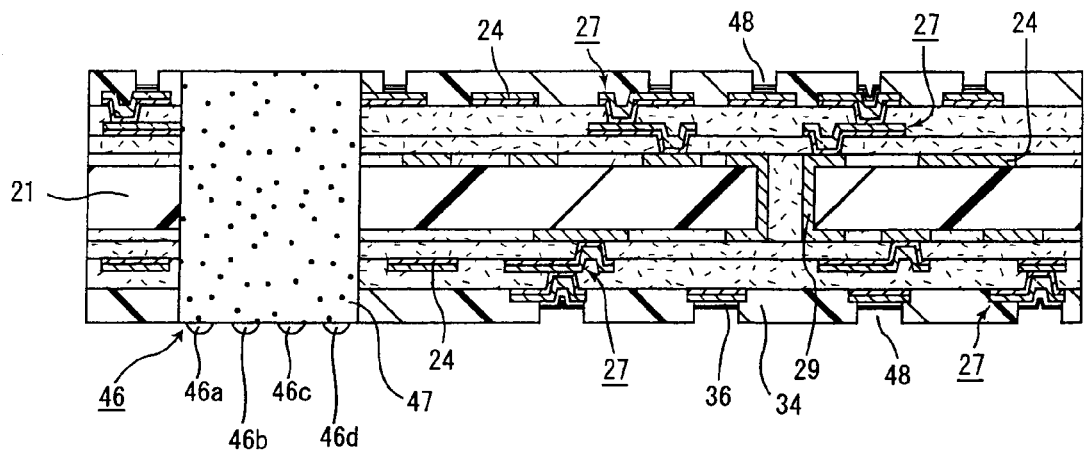
FIG. 14 is across-sectional view that schematically shows a part of a manufacturing method of the substrate for mounting an IC chip according to the first aspect of the present invention.
Figure 14B:
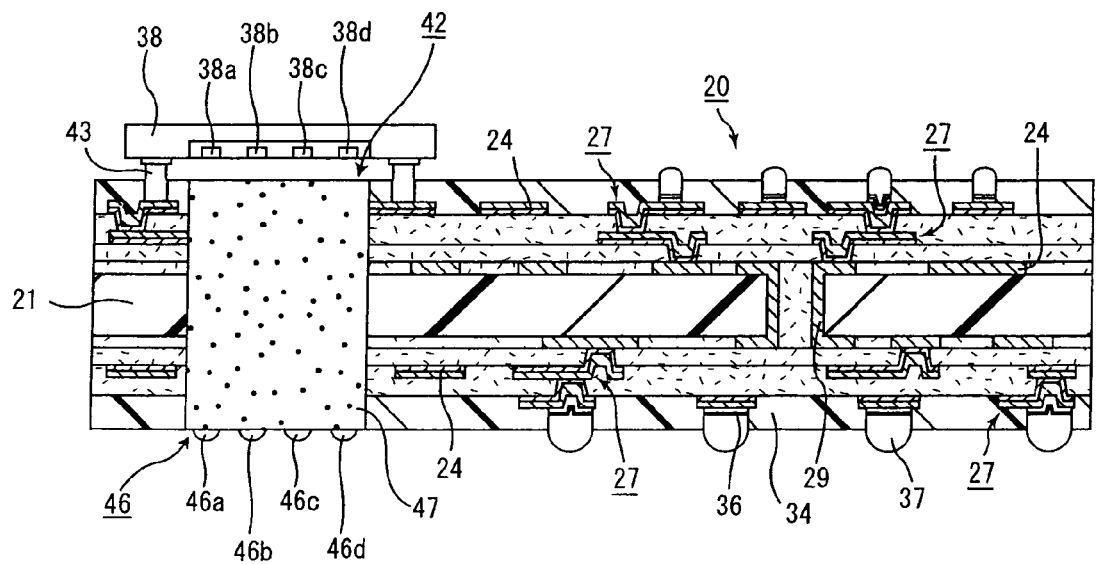
Figure 15A:
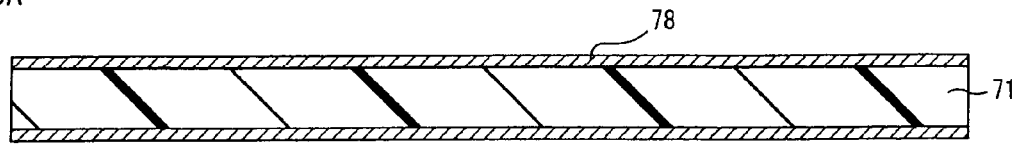
FIG. 15 is a cross-sectional view that schematically shows apart of a manufacturing method of the substrate for a motherboard according to the second aspect of the present invention.
Figure 15B:
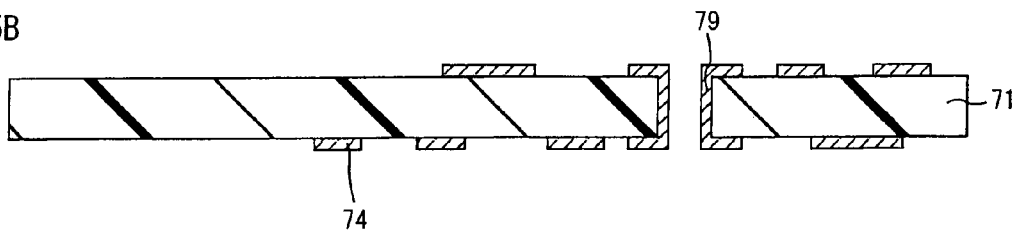
Figure 15C:
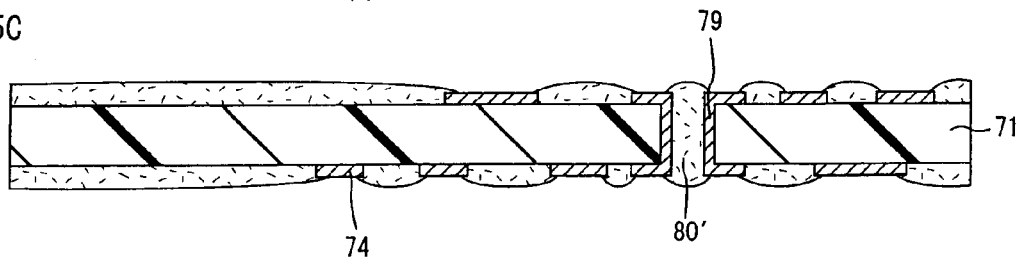
Figure 15D:
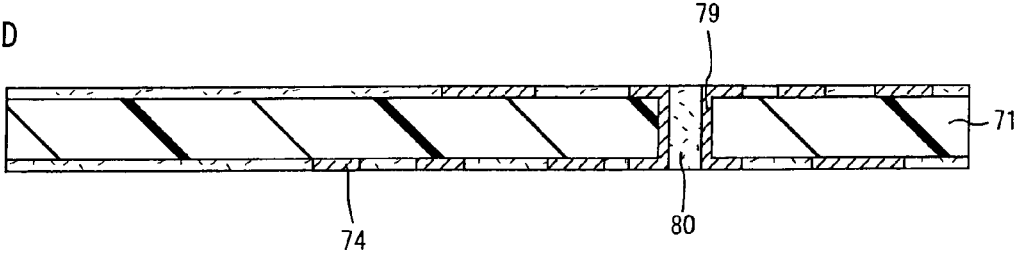
Figure 15E:
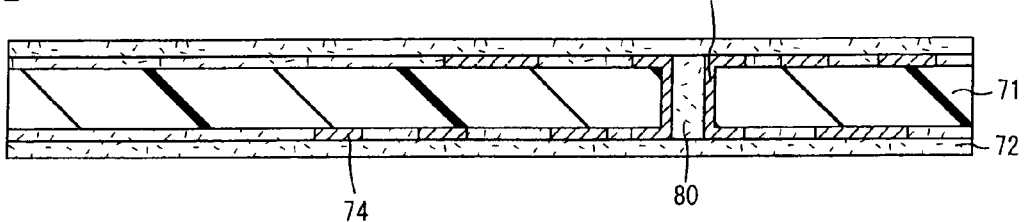
Figure 15F:
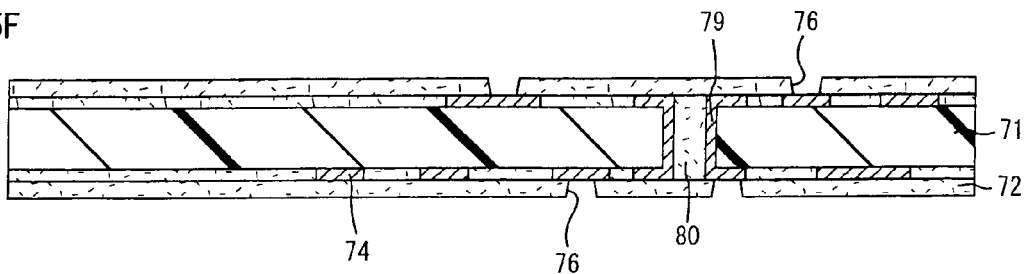
Figure 16A:
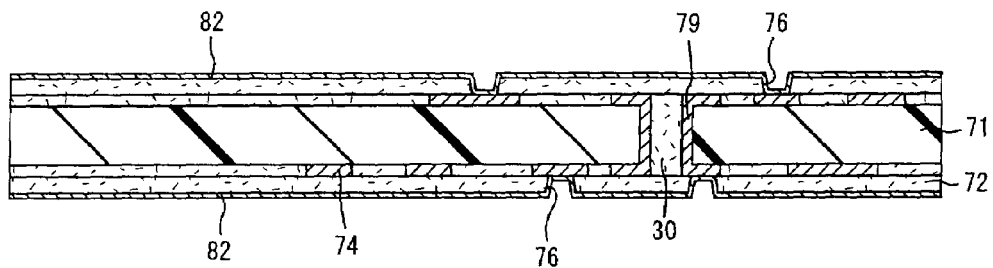
FIG. 16 is across-sectional view that schematically shows a part of a manufacturing method of the substrate for a motherboard according to the second aspect of the present invention.
Figure 16B:
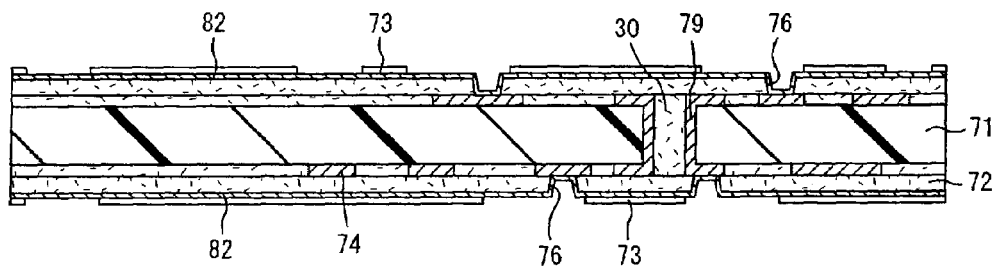
Figure 16C:
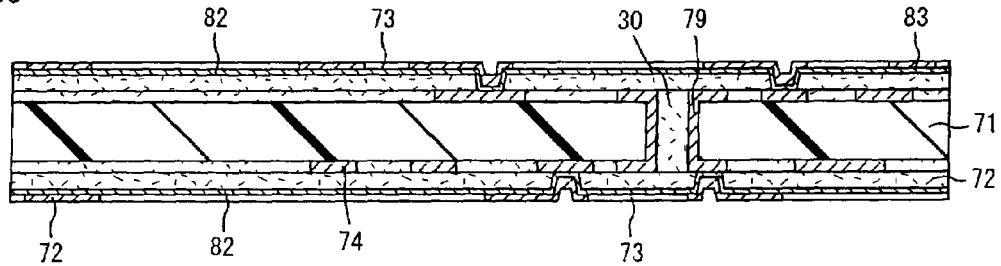
Figure 16D:
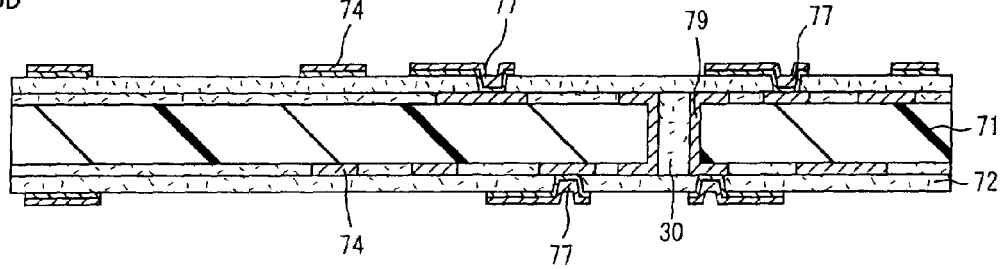
Figure 17A:
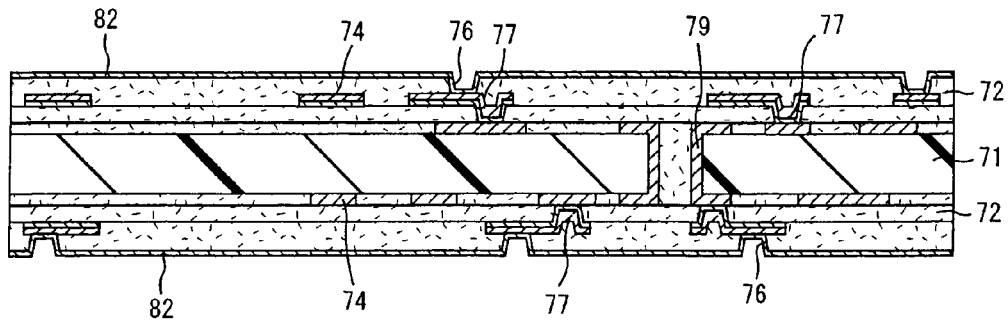
FIG. 17 is across-sectional view that schematically shows a part of a manufacturing method of the substrate for a motherboard according to the second aspect of the present invention.
Figure 17B:
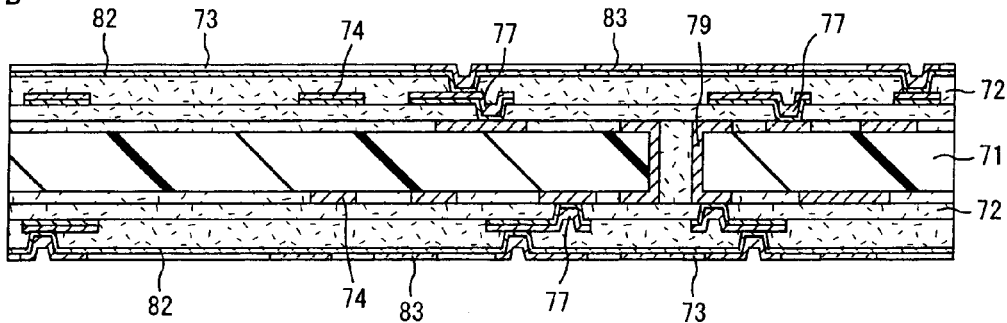
Figure 17C:
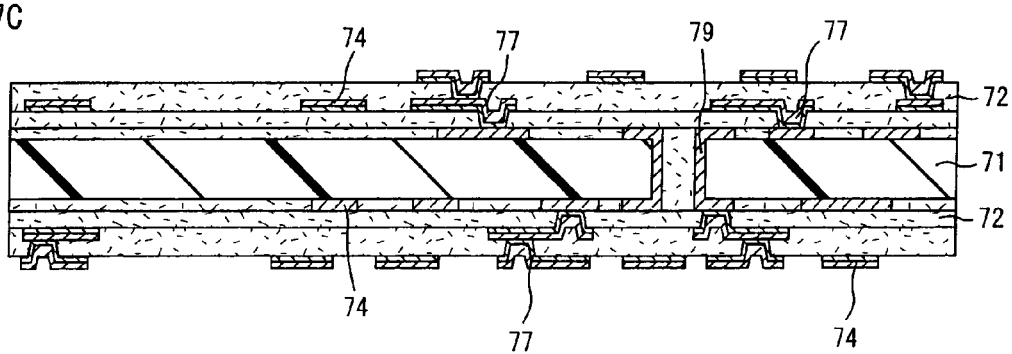
Figure 17D:
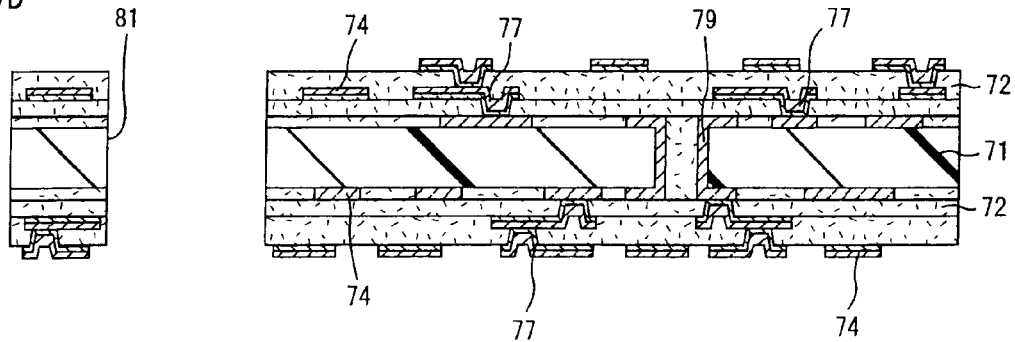
Figure 18A:
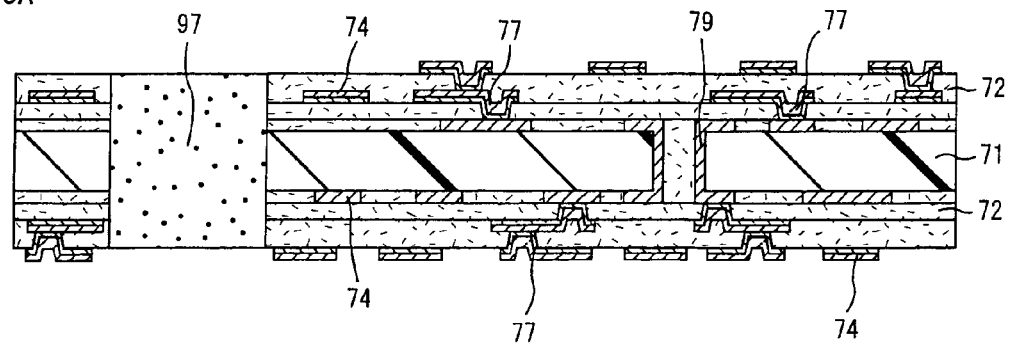
FIG. 18 is across-sectional view that schematically shows a part of a manufacturing method of the substrate for a motherboard according to the second aspect of the present invention.
Figure 18B:
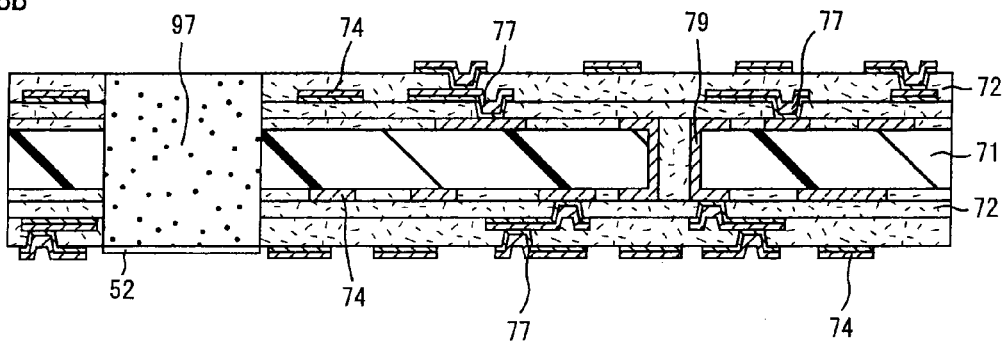
Figure 18C:
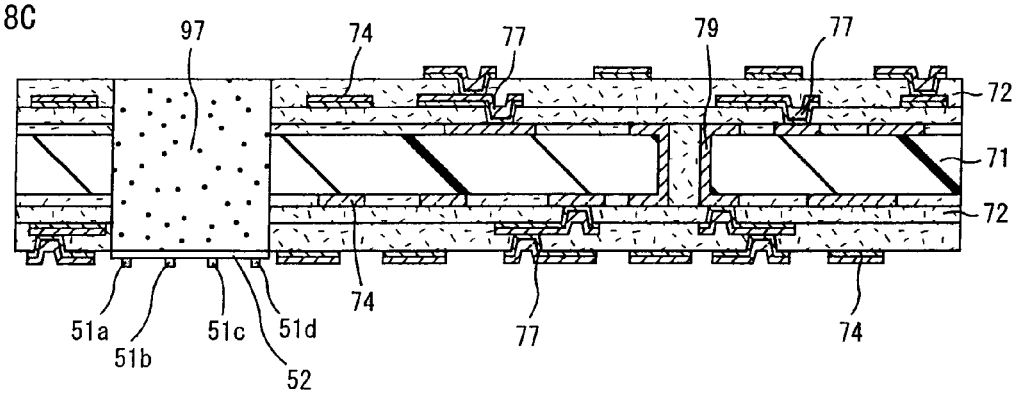
Figure 18D:
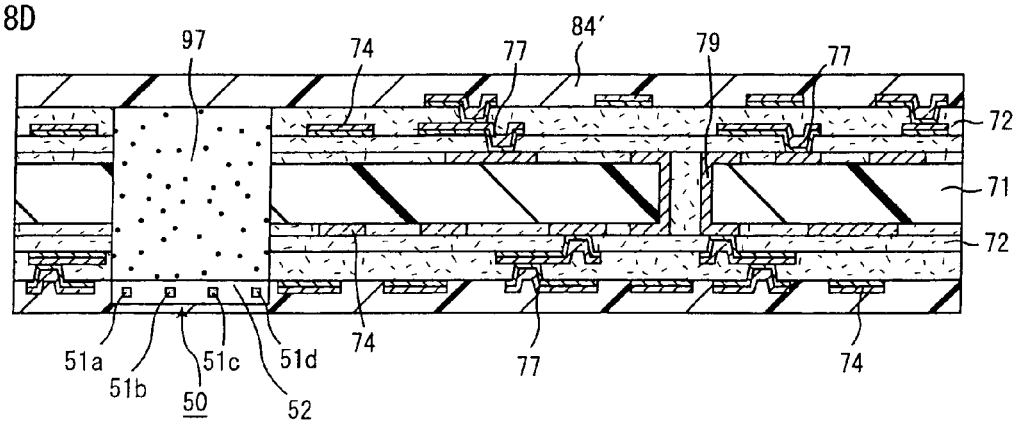
Figure 19A:
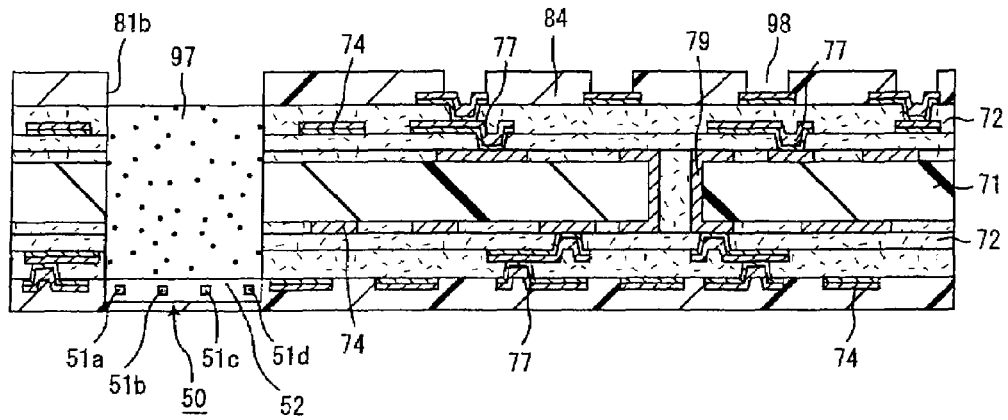
FIG. 19 is across-sectional view that schematically shows apart of a manufacturing method of the substrate for a motherboard according to the second aspect of the present invention.
Figure 19B:
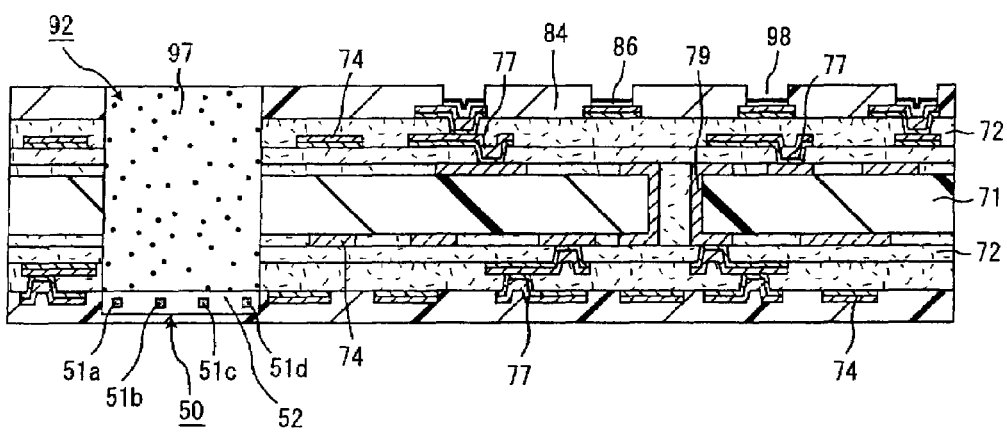
Figure 19C:
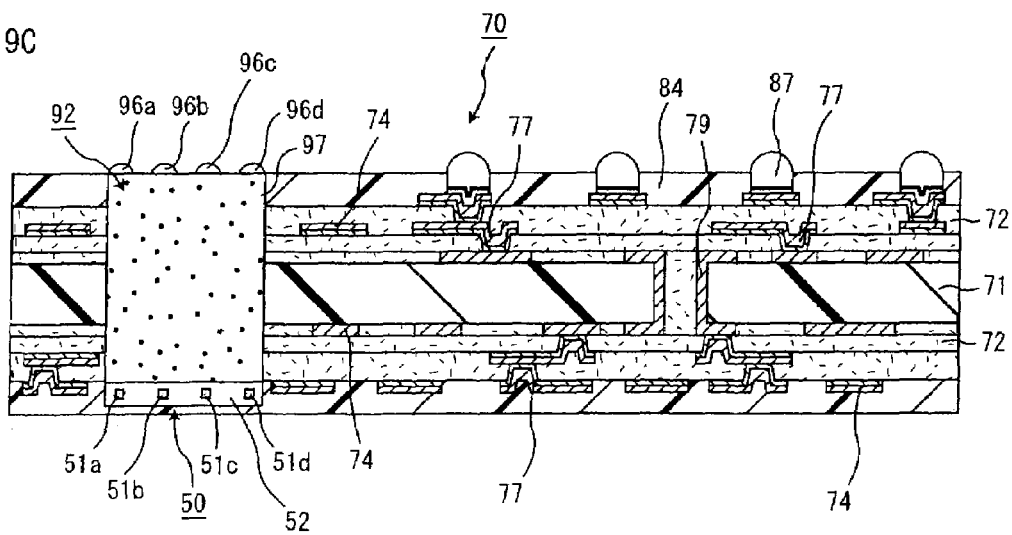
Figures 1A, 20:
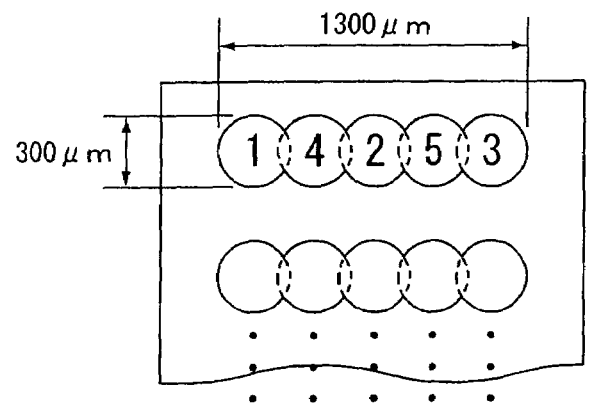
Figures 1B, 20:
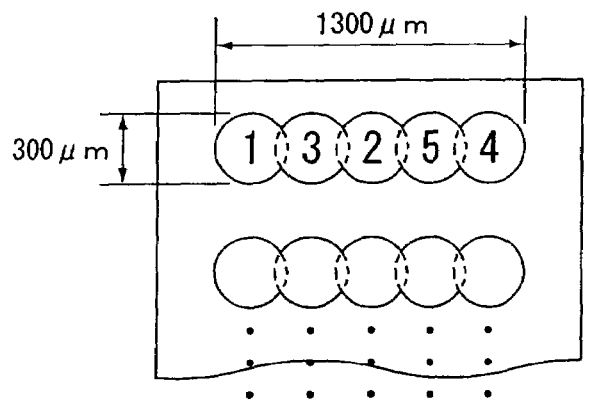
Figures 1C, 20:
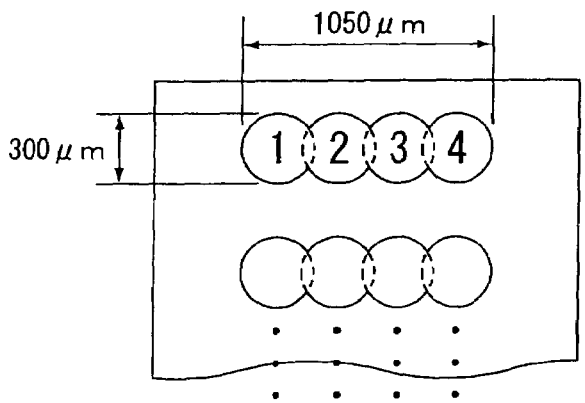
Figures 1D, 20:
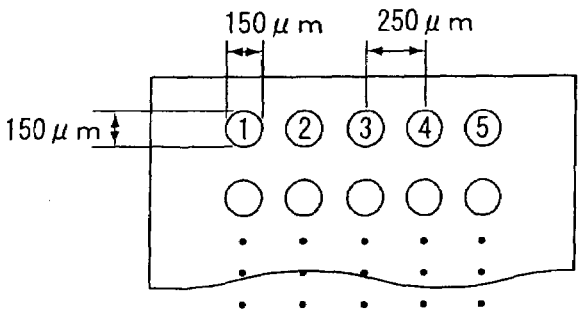
Figures 2E, 20:
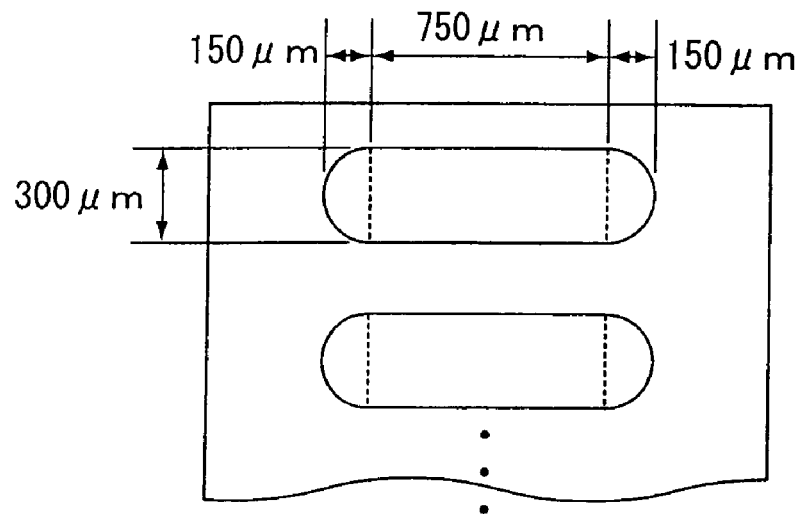
Figures 2F, 20:
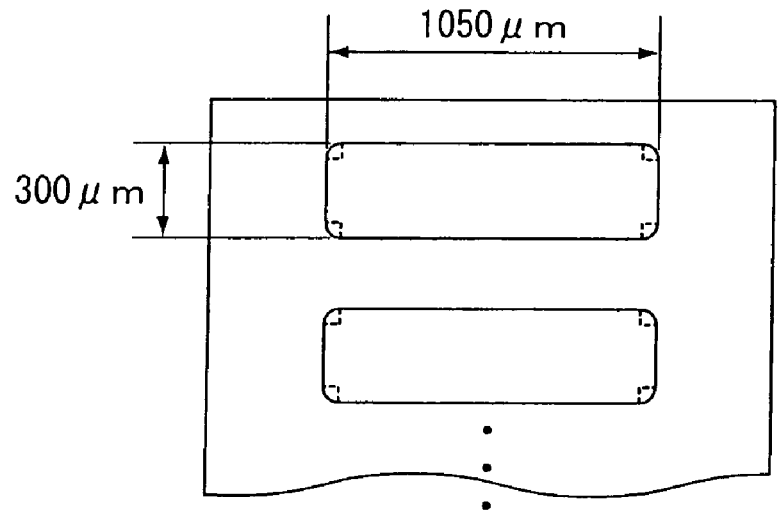
Figure 21:
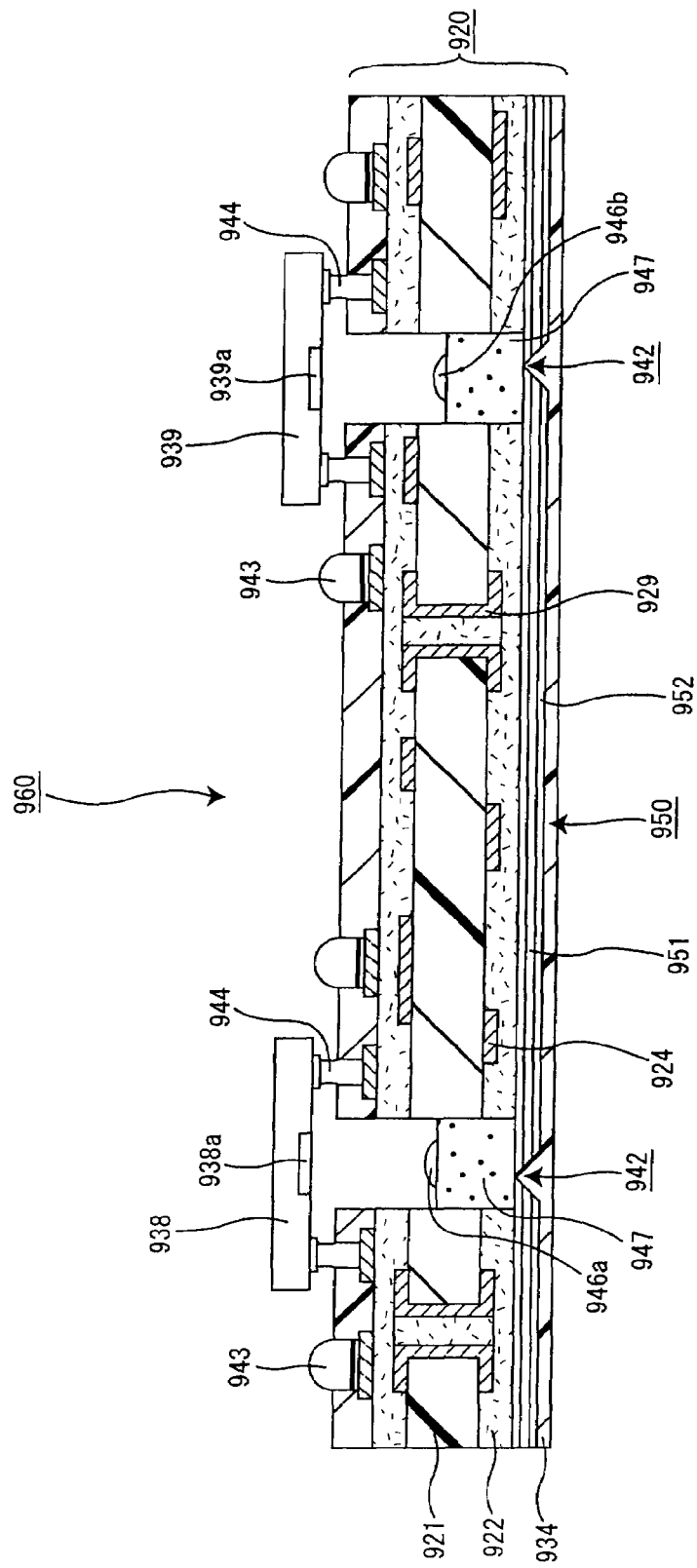
FIG. 21 is across-sectional view that schematically shows an example of an embodiment of a device for optical communication according to a fourth aspect of the present invention.
Figure 22:
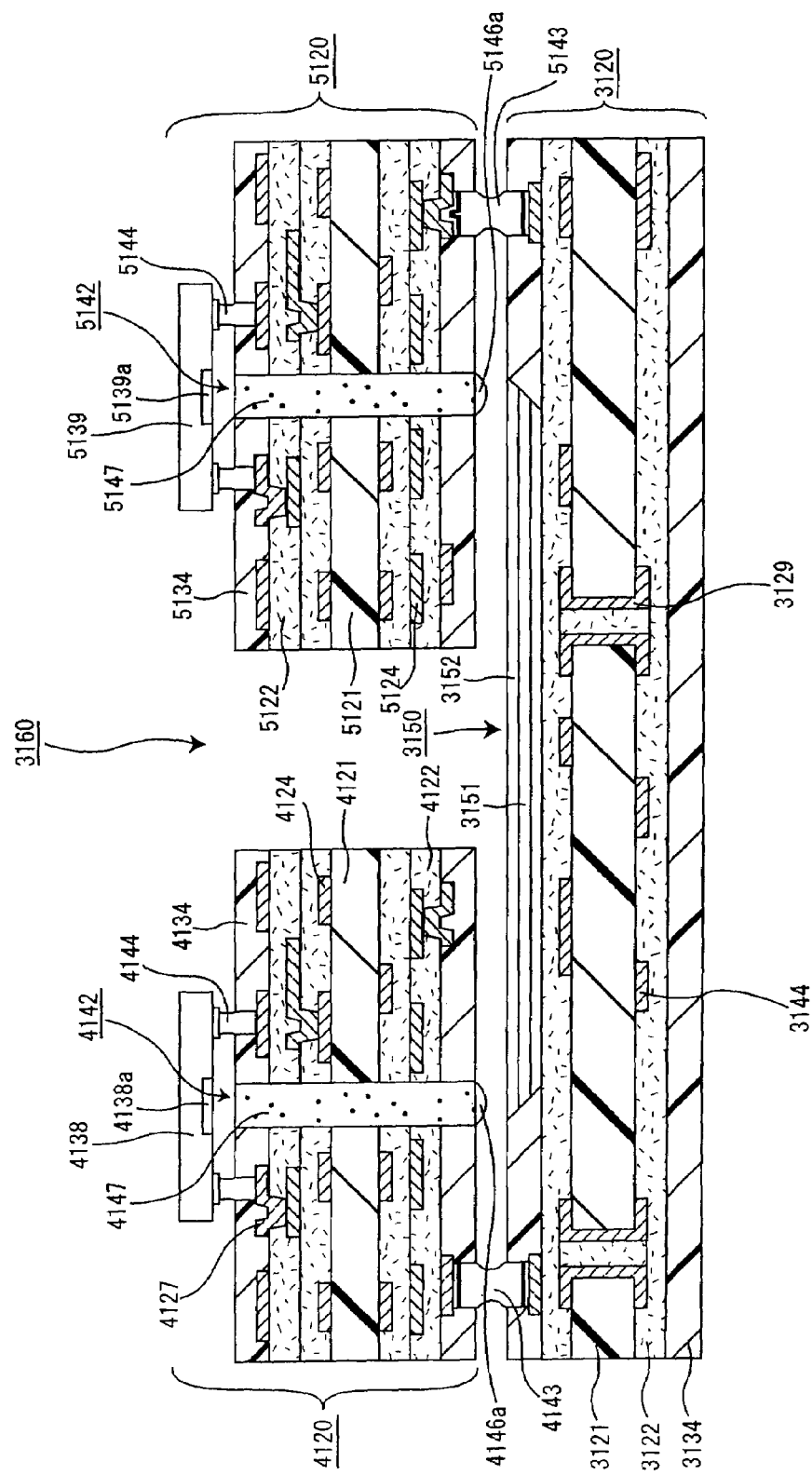
FIG. 22 is across-sectional view that schematically shows another example of the embodiment of the device for optical communication according to the fourth aspect of the present invention.
Figure 23:
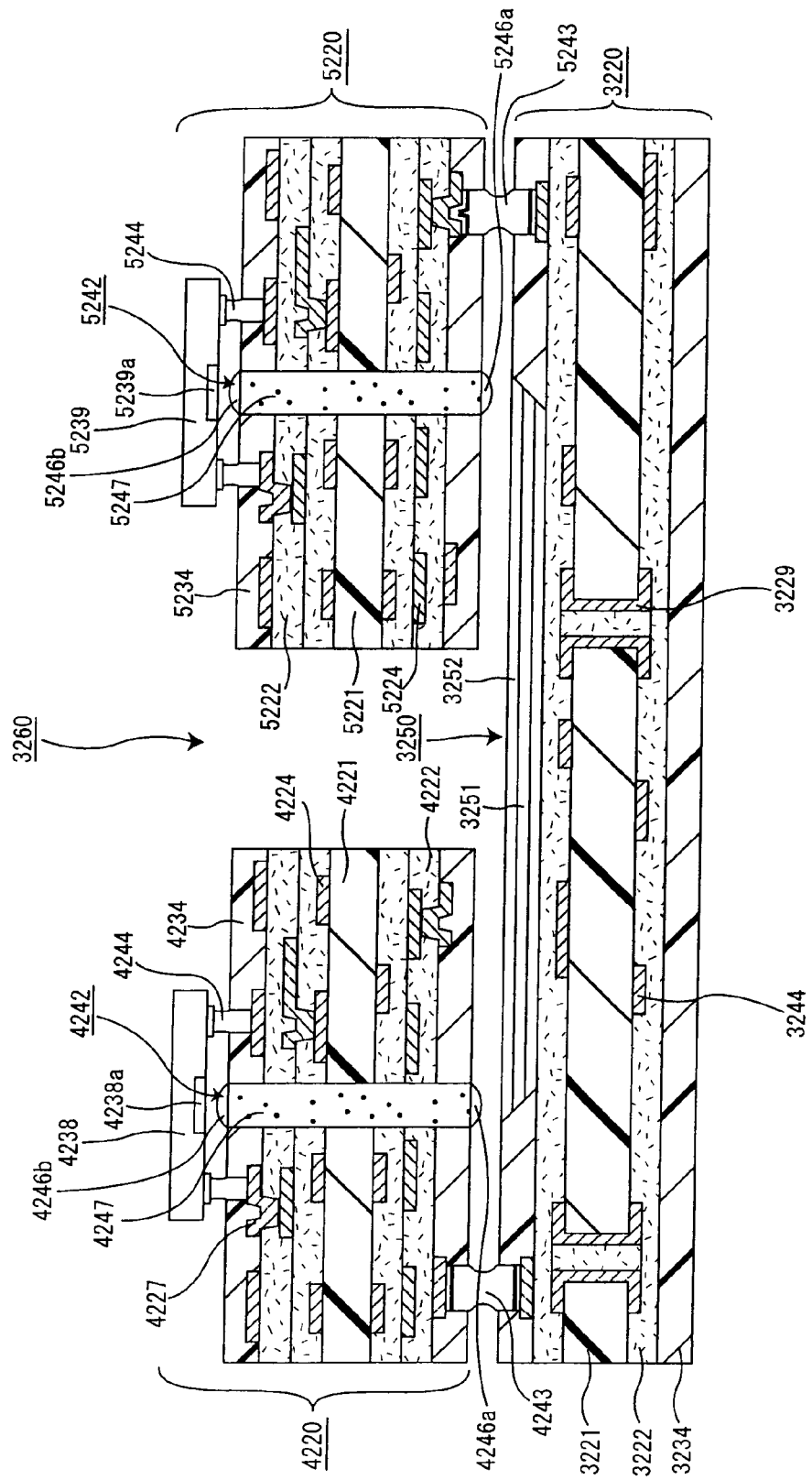
FIG. 23 is across-sectional view that schematically shows still another example of the embodiment of the device for optical communication according to the fourth aspect of the present invention.
Figure 24:
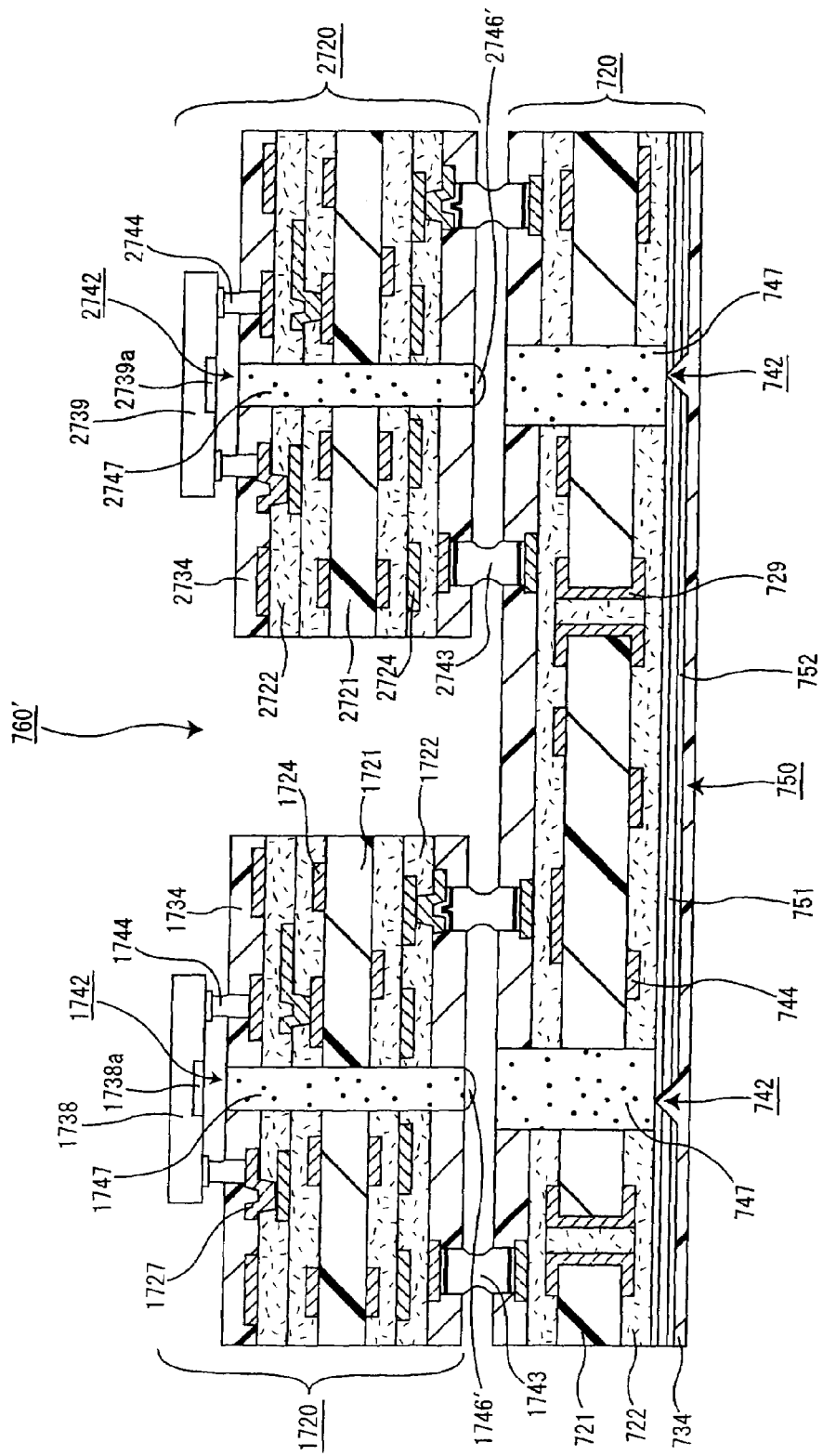
FIG. 24 is across-sectional view that schematically shows yet another example of the embodiment of the device for optical communication according to the fourth aspect of the present invention.

EXPLANATION OF SYMBOLS 11, 12, 13 microlens array
120, 220, 320, 420 substrate for mounting an IC chip
121, 221, 321, 421 substrate
122, 222, 322, 422 insulating layer
124, 224, 324, 424 conductor circuit
127, 227, 327, 427 via hole
129, 229, 329, 429 plated through hole
134, 234, 334, 434 solder resist layer
138, 238, 338, 438 light emitting element
139, 239, 339, 439 light receiving element
142, 242, 342, 442 optical signal passing region
146, 246, 346, 446 microlens
349 wire bonding
520, 620 substrate for a motherboard
521, 621 substrate
522, 622 insulating layer
524, 624 conductor circuit
527, 627 via hole
529, 629 plated through hole
534, 634 solder resist layer
538, 638 light emitting element
539, 639 light receiving element
642, 642 optical signal passing region
546, 646 microlens
720, 820 substrate for a motherboard
760, 860 device for optical communication
1720, 1820, 2720, 2820 substrate for mounting an IC chip

The invention claimed is:

1. A substrate for a motherboard comprising:
a substrate;
a plurality of conductor circuits formed over said substrate;
a plurality of insulating layers formed over said substrate, said insulating layers being laminated alternately over the conductor circuits;
an optical waveguide forming an optical passing region through said substrate, conductor circuits and insulating layers and configured to be optically connected to an optical element; and
a microlens positioned at one end portion of said optical signal passing region on a side on which said optical element is mounted,
wherein said optical waveguide has an end portion subjected to water-repellent treatment or hydrophilic treatment, and said end portion of said optical waveguide is the end portion of said optical signal passing region where said microlens is positioned.

2. The substrate for a motherboard according to claim 1, wherein said optical element is a multichannel optical element, and said optical signal passing region comprises a single optical path which transmits an optical signal from or to said multichannel optical element.

3. The substrate for a motherboard according to claim 1, wherein said microlens is configured to form light emitted from said optical waveguide into collimated light.

4. The substrate for a motherboard according to claim 1, wherein said microlens is directly arranged on said end portion of said optical signal passing region, and said microlens is arranged with a lens marker on the end portion of said optical signal passing region.

5. The substrate for a motherboard according to claim 1, wherein said microlens is mixed with particles.

6. A device for optical communication comprising:
the substrate for a motherboard according to claim 1;
a substrate having an IC chip mounted on the substrate according to claim 1,
wherein said substrate for mounting an IC chip has an optical signal passing region and comprises an optical element and a microlens on an end portion of said optical signal passing region of said substrate for mounting an IC chip on an opposite side from a side from which said optical element is mounted.

7. A device for optical communication comprising:
a substrate for a motherboard having conductor circuits and insulating layers laminated in alternate fashion and in repetition, said substrate for a motherboard comprising an optical waveguide and an optical element; and
at least one microlens positioned on an optical path connecting said optical waveguide and said optical elements such that light that enters said optical waveguide or said optical element is converged via said microlens
wherein said optical waveguide has an end portion subjected to water-repellent treatment or hydrophilic treatment, and said microlens is positioned on said end portion of said optical waveguide.

8. The device for optical communication according to claim 7, wherein at least one microlenses comprises a plurality of microlens such that light emitted from said optical waveguide or said optical element is converged or formed into collimated light.

9. A device for optical communication comprising:
a substrate for a motherboard having conductor circuits and insulating layers laminated in alternate fashion and in repetition, said substrate comprising an optical waveguide;
a substrate having an IC chip mounted with a light emitting element; and
a substrate having an IC chip mounted with a light receiving element mounted on said substrate for a motherboard,
wherein said optical waveguide forms an optical signal passing region in said substrate for a motherboard, said substrate for a motherboard has microlenses arranged on end portions of said optical signal passing region, said substrate with the light emitting element has an optical signal passing region optically connected to said light emitting element, said substrate with the light emitting element substrate has a microlens arranged on an end portion of said optical signal passing region of said substrate with the light emitting element on the opposite side from the side that is optically connected to said light emitting element, said substrate with the light receiving element has an optical signal passing region optically connected to said light receiving element, said substrate with the light receiving element has a microlens arranged on an end portion of said optical signal passing region of said substrate with the light receiving element on the opposite side from the side that is optically connected to said light receiving element, said microlens of said-substrate with the light emitting element is configured to form light emitted from said light emitting element into collimated light, one of said microlenses of said substrate for a motherboard converges the collimated light to enter one end of said optical waveguide of said substrate for a motherboard and is transmitted through said optical waveguide, the other microlens of said substrate for a motherboard light forms light emitted from the other end of said optical waveguide into collimated light, said microlens of said substrate with the light receiving element is configured to converge the collimated light to enter said light receiving element, said optical waveguide has an end portion subjected to water-repellent treatment or hydrophilic treatment, and one of said microlenses is positioned on said end portion of said optical waveguide.

10. A manufacturing method of a substrate for mounting an IC chip, comprising:
laminating conductor circuits and insulating layers in alternate fashion and in repetition on at least one face of a substrate to form a multilayer wiring board;
forming an optical signal passing region that penetrates through said multilayer wiring board or forming an optical signal passing region having a concave shape on a portion of said multilayer wiring board;
subjecting a portion on which a microlens is to be arranged to water-repellent treatment or hydrophilic treatment before arrangement of said microlens; and
arranging said microlens on an end portion of said optical signal passing region.

11. The manufacturing method of a substrate for mounting an IC chip according to claim 10, wherein said optical signal passing region penetrates through the multilayer wiring board, and in said forming of said optical signal passing region, said optical signal passing region comprises a single optical path which transmits an optical signal from or to a multichannel optical element.

12. A manufacturing method of a substrate for a motherboard comprising:
forming an optical wiring board by sequentially laminating conductor circuits and insulating layers in alternate fashion and in repetition on at least one face of a substrate and forming an optical waveguide in said optical wiring board;
forming an optical signal passing region on said optical wiring board;
subjecting a portion on which said microlens is to be arranged to water-repellent treatment or hydrophilic treatment before arrangement of said microlens; and
arranging said microlens on one end of said optical signal passing region.

13. The manufacturing method of a substrate for a motherboard according to claim 12, wherein in said forming of said optical signal passing region, said optical signal passing region comprises a single optical path which transmits an optical signal from or to a multichannel optical element.

14. The device for optical communication according to claim 7, wherein said microlens is directly arranged on the end portion of said optical waveguide, and said microlens is arranged with a lens marker on the end portion of said optical waveguide.

15. The device for optical communication according to claim 9, wherein at least one of said microlenses is directly arranged on one of the end portions of said optical waveguide, and said one of said microlenses is arranged with a lens marker on the one of the end portions of said optical waveguide.

16. The manufacturing method of a substrate for mounting an IC chip according to claim 10, wherein said microlens is directly arranged on the end portion of said optical waveguide, and said microlens is arranged with a lens marker on the end portion of said optical waveguide.

17. The manufacturing method of a substrate for a motherboard according to claim 12, wherein said microlens is directly arranged on the end portion of said optical waveguide, and said microlens is arranged with a lens marker on the end portion of said optical waveguide.

* * * * *